(12) United States Patent
Twitchen et al.

(10) Patent No.: US 8,986,645 B2
(45) Date of Patent: *Mar. 24, 2015

(54) DIAMOND

(75) Inventors: Daniel James Twitchen, Sunningdale (GB); Geoffrey Alan Scarsbrook, Ascot (GB); Philip Maurice Martineau, Littlewick Green (GB); Paul Martyn Spear, Maidenhead (GB); Stephen David Williams, Worcester (GB); Ian Friel, Guildford (GB)

(73) Assignee: Element Six Limited, Ballasalla (IM)

( * ) Notice: Subject to any disclaimer, the term of this patent is extended or adjusted under 35 U.S.C. 154(b) by 2056 days.

This patent is subject to a terminal disclaimer.

(21) Appl. No.: 11/480,823

(22) Filed: Jul. 6, 2006

(65) Prior Publication Data

US 2007/0036921 A1 Feb. 15, 2007

Related U.S. Application Data

(63) Continuation-in-part of application No. 10/582,707, filed as application No. PCT/IB2004/004069 on Dec. 10, 2004, now Pat. No. 8,192,713.

(60) Provisional application No. 60/529,746, filed on Dec. 17, 2003, provisional application No. 60/610,223, filed on Sep. 16, 2004.

(30) Foreign Application Priority Data

Dec. 12, 2003 (GB) .................................. 0328917.0
Sep. 7, 2004 (GB) .................................. 0419839.6

(51) Int. Cl.
*B01J 3/06* (2006.01)
*C30B 7/00* (2006.01)
(Continued)

(52) U.S. Cl.
CPC ............... *A44C 17/00* (2013.01); *Y10T 428/30* (2015.01); *B44C 1/005* (2013.01); *C30B 25/00* (2013.01);
(Continued)

(58) Field of Classification Search
None
See application file for complete search history.

(56) References Cited

U.S. PATENT DOCUMENTS 4,617,181 A * 10/1986 Yazu et al. ..................... 423/446
4,863,529 A * 9/1989 Imai et al. ..................... 148/33.4
(Continued)

FOREIGN PATENT DOCUMENTS

EP 0 316 856 A1 5/1989
EP 0 537 976 A2 4/1993
(Continued)

OTHER PUBLICATIONS

Sakaguchi et al.; Silicon Incorporation into Chemical Vapor Deposition Diamond: A Role of Oxygen; Appl. Phys. Lett. 71 (5), 629-631; 1997.*

(Continued)

*Primary Examiner* — Guinever Gregorio
(74) *Attorney, Agent, or Firm* — Oblon, Spivak, McClelland, Maier & Neustadt, L.L.P.

(57) ABSTRACT

A method of producing a CVD single crystal diamond layer on a substrate includes adding into a DVD synthesis atmosphere a gaseous source comprising silicon. The method can be used to mark the diamond material, for instance to provide means by which its synthetic nature can more easily be determined. It can also be exploited to generate single crystal diamond material of high color.

21 Claims, 18 Drawing Sheets

Figure 1:
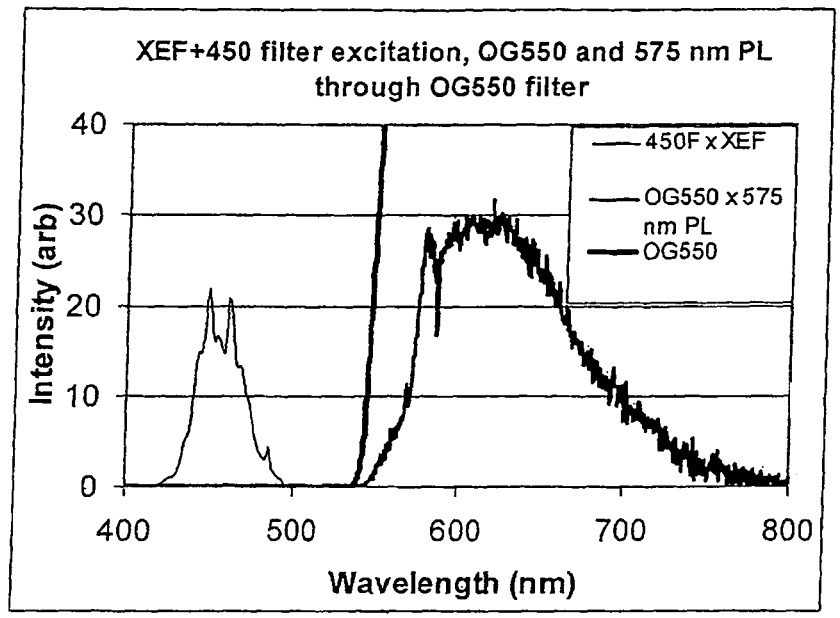

(51) Int. Cl.
| | |
|---|---|
| C30B 23/00 | (2006.01) |
| C30B 25/00 | (2006.01) |
| C30B 28/12 | (2006.01) |
| H05H 1/24 | (2006.01) |
| A44C 17/00 | (2006.01) |
| B44C 1/00 | (2006.01) |
| C30B 25/02 | (2006.01) |
| C30B 29/04 | (2006.01) |
| C30B 33/00 | (2006.01) |

(52) U.S. Cl.
CPC ............... *C30B 25/02* (2013.01); *C30B 29/04* (2013.01); *C30B 33/00* (2013.01); *H01J 2237/2808* (2013.01)
USPC ................ 423/446; 117/68; 117/93; 117/92; 117/929; 117/94; 427/577

(56) References Cited

U.S. PATENT DOCUMENTS

| | | | | |
|---|---|---|---|---|
| 5,776,323 | A | * | 7/1998 | Kobashi ..................... 204/294 |
| 6,582,513 | B1 | * | 6/2003 | Linares et al. .................. 117/93 |
| 7,964,280 | B2 | * | 6/2011 | Williams et al. ............. 428/408 |
| 2003/0131787 | A1 | | 7/2003 | Linares et al. |
| 2004/0180205 | A1 | * | 9/2004 | Scarsbrook et al. .......... 428/408 |

FOREIGN PATENT DOCUMENTS

| | | |
|---|---|---|
| EP | 0 589 464 A1 | 3/1994 |
| EP | 0 615 954 A1 | 9/1994 |
| EP | 0 715 885 A2 | 6/1996 |
| EP | 1 693 895 | 8/2006 |
| GB | 2 228 949 | 9/1990 |
| JP | 1-131014 | 5/1989 |
| JP | 4-231398 | 8/1992 |
| JP | 6-107494 | 4/1994 |
| JP | 6-263418 | 9/1994 |
| JP | 7-277890 | 10/1995 |
| JP | 9-165295 | 6/1997 |
| JP | 11-1392 | 1/1999 |
| JP | 2006-512270 | 4/2006 |
| WO | WO 03/023382 A1 | 3/2003 |
| WO | WO 03/052177 | 6/2003 |

OTHER PUBLICATIONS

Turukhin et al.; Picosecond Photoluminescence Decay of Si-doped Chemical-Vapor-Deposited Diamond Films; Physical Review B vol. 54, No. 23; 1996.*
Musale et al.; Raman, Photoluminescence and Morphological Studies of Si- and N-doped Diamond Films Grown on Si(100) substrate by hot Filament Chemical Vapor Deposition Technique; Diamond and Related Materials; 11, 75-86; 2002.*
U.S. Appl. No. 12/245,002, filed Oct. 3, 2008, Scarsbrook, et al.
P. Kania, et al., Diamond and Related Materials, vol. 4, pp. 425-428 (1995).
English translation of "Characterization of thick homoepitaxial film on diamond (001) substrate II".
English translation of "Homoepitaxial growth of diamond (001) with nitrogen doping".
J. Michler, et al., J. Appl. Phys., vol. 83, No. 1, pp. 187-197 (1998).
R. Locher, et al., Appl. Phys. Lett., vol. 65, No. 1, pp. 34-36 (1994).
I.I. Vlasov, et al., Phys. Stat. Sol, vol. (a)181, No. 83, pp. 83-90 (2000).
P.E. Pehrsson, et al., Mat. Res. Soc. Symp, Proc., vol. 416, pp. 51-56 (1996).
L. Bergman, et al., "The origin of the broadband luminescence and the effect of nitrogen doping on the optical properties of diamond films", J. Appl. Phys., vol. 76, No. 5, Sep. 1, 1994, pp. 3020-3027.
R. Zeisel, et al., "Photocapacitance study of born-doped chemical-vapor-deposited diamond", Physical Review B, vol. 60, No. 4, The American Physical Society, Jul. 15, 1999, pp. 2476-2479.
K. Kawarada, et al., "Excitonic recombination radiation in undoped and boron-doped chemical-vapor-deposited diamonds", Physical Review B, vol. 47, No. 7, The American Physical Society, Feb. 15, 1993, pp. 3633-3637.
A. V. Turukhin, et al., "Picosecond photoluminescence decay of Si-doped chemical-vapor deposited diamond films", Physical Review B, vol. 54, No. 23, The American Physical Society, Dec. 15, 1996, pp. 16448-16451.
"Lamps for Colour Grading", Diamond Grading ABC The Manual, $9^{th}$ Edition 2001, pp. 80-81.
Edited by James E. Shigley, Gems & Gemology, "In Review Treated Diamonds", 2000, pp. 120-127.
A. K. Ramdas, "Modifications to $^{12}C$-Diamond by the $^{13}C$-isotope: Raman, Brillouin and infrared spectroscopy of phonons", ("Properties, Growth and Applications of Diamond"), EMIS Datareviews Series No. 26, published by INSPEC 2001.
Office Action issued Aug. 14, 2009, in Japan Patent Application No. 2006-543654 (English-language Translation only).
G.Z. Cao, et al., "Homoepitaxial Diamond Films Codoped with Phosphorus and Nitrogen by Chemical-Vapor Deposition," *Journal of Applied Physics*, .78 (5), Sep. 1, 1995, pp. 3125-3131.
I-Nan Lin, et al., "Improvement on Electron Field Emission Properties of Nanocrystalline Diamond Films by Co-Doping of Boron and Nitrogen," *Journal of Vacuum Science Technology B*, vol. 21 (3), May/Jun. 2003, pp. 1074-1079.
Ichizo Yagi et al., "The Effects of Nitrogen and Plasma Power on Electrochemical Properties of Boron-Doped Diamond Electrodes Grown by MPCVD," *Journal of the Electrochemical Society*, vol. 149 (1), E1-E5 (2002).
T. Hsu et al., "Electron Field Emission of Nanocrystalline Diamond Films Co-Doped with Boron and Nitrogen," 2001 Proceedings of the $14^{th}$ International Vacuum Microelectronics Conference, pp. 273-274 (2001).
X.J. Hu et al., "Electrical and Structural Properties of Boron and Phosphorus Co-Doped Diamond Films," *Carbon*, vol. 42, No. 8-9, (2004) pp. 1501-1506.
Qi Liang, et al., "Effect of Nitrogen Addition on the Morphology and Structure of Boron-Doped Nanostructured Diamond Films," *Applied Physics Letters*, vol. 83, No. 24 (Dec. 15, 2003), pp. 5047-5049.
Sally C. Eaton et al., "Co-Doping of Diamond with Boron and Sulfur," *Electrochemical and Solid-State Letters*, vol. 5 (8), G65-G68 (2002).
Sally C. Eaton et al., "Diamond Growth in the Presence of Boron and Sulfur," *Diamond and Related Materials*, vol. 12, No. 10-11, (2003), pp. 1627-1632.

\* cited by examiner

DIAMOND

This application is a continuation-in-part application of U.S. application Ser. No. 10/582,707 filed Jun. 12, 2006, which is a National Stage of PCT/IB04/04069 filed Dec. 10, 2004.

BACKGROUND OF THE INVENTION

This invention relates to a method of marking or fingerprinting diamond material, in particular single crystal synthetic diamond material produced by chemical vapour deposition (hereinafter referred to as CVD), thereby providing a mark of origin or fingerprint in the diamond material, or a means by which its synthetic nature can more easily be determined. This method can also be exploited to generate single crystal diamond material of high colour.

Methods of depositing material such as diamond on a substrate by CVD are now well established and have been described extensively in patent and other literature. Where diamond is being deposited on a substrate, the method generally involves providing a gas mixture which, on dissociation, can provide hydrogen or a halogen (e.g. F, Cl) in atomic form and C or carbon-containing radicals and other reactive species, e.g. $CH_x$, $CF_x$ wherein x can be 1 to 4. In addition, oxygen containing sources may be present, as may sources for nitrogen, and for boron. Nitrogen can be introduced in the synthesis plasma in many forms; typically these are $N_2$, $NH_3$, air and $N_2H_4$. In many processes inert gases such as helium, neon or argon are also present. Thus, a typical source gas mixture will contain hydrocarbons $C_xH_y$ wherein x and y can each be 1 to 10 or halocarbons $C_xH_yHal_z$ wherein x and z can each be 1 to 10 and y can be 0 to 10 and optionally one or more of the following: $CO_x$, wherein x can be 0.5 to 2, $O_2$, $H_2$, $N_2$, $NH_3$, $B_2H_6$ and an inert gas. Each gas may be present in its natural isotopic ratio, or the relative isotopic ratios may be artificially controlled; for example hydrogen may be present as deuterium or tritium, and carbon may be present as $^{12}C$ or $^{13}C$. Dissociation of the source gas mixture is brought about by an energy source such as microwaves, RF (radio frequency) energy, a flame, a hot filament or jet based technique and the reactive gas species so produced are allowed to deposit onto a substrate and form diamond.

CVD diamond may be produced on a variety of substrates. Depending on the nature of the substrate and details of the process chemistry, polycrystalline or single crystal CVD diamond may be produced.

The development in the level of sophistication of methods of producing CVD single crystal diamond has meant that this material is becoming increasingly more suitable for use in industrial applications or in ornamental applications such as synthetic gemstones for jewelry. However, in many applications there is a need to provide a method of determining the source of synthetic diamond used in these applications in order to verify its origins or synthetic nature.

SUMMARY OF THE INVENTION

According to one aspect of the invention, there is provided a method of incorporating a mark of origin, such as a brand mark, or fingerprint in a CVD single crystal diamond material, which includes the steps of providing a diamond substrate, providing a source gas, dissociating the source gas thereby allowing homoepitaxial diamond growth, and introducing in a controlled manner a dopant into the source gas in order to produce the mark of origin or fingerprint in the synthetic diamond material, which dopant is selected such that the mark of origin or fingerprint is not readily detectable or does not affect the perceived quality of the diamond material under normal viewing conditions, but which mark of origin or fingerprint is detectable or rendered detectable under specialised conditions, such as when exposed to light or radiation of a specified wavelength, for example.

Detection of the mark of origin or fingerprint may be visual detection or detection using specific optical instrumentation, for example.

The mark of origin or fingerprint is preferably provided in the form of one or more layers or regions grown into the diamond material during synthesis.

Such a mark of origin or fingerprint in a CVD single crystal diamond material is most appropriate in CVD diamond which is of high commercial or gem quality. Synthesis of such high quality CVD diamond material is best performed using a diamond substrate having a surface on which growth takes place which is substantially free of crystal defects, and this forms a preferred version of the method of the invention.

The step of introducing a dopant into the source gas in a controlled manner also leads to the generation of diamond of high colour. For example, the method of the present invention is able to provide a single crystal CVD diamond layer having high colour where the synthesis atmosphere comprises a gas having a first impurity atom type that would prevent high colour diamond from being produced. For example, the presence of nitrogen gas in the synthesis atmosphere typically causes the synthesised diamond to have a yellow/brown colour, whereas the presence of boron gas in the synthesis atmosphere would typically cause the synthesised diamond to have a blue colour.

The second gas is deliberately added to the CVD diamond synthesis atmosphere. Preferably, the second gas is added in a controlled manner. The presence of the second gas may be controlled such that the concentration of the second gas is stable to better than 20%, preferably better than 10%, preferably better than 3%.

Without being bound by any particular theory, it is believed that the second impurity atom type suppresses the roughening effect that the first impurity atom type otherwise has on the growth surface. By keeping the growth surface smooth the uptake of a wide range of defects is suppressed which otherwise degrade the colour. Addition of a gaseous source comprising an impurity atom type (such as nitrogen) to a single crystal CVD diamond synthesis process, can change the reactions occurring on the diamond growth surface in such a way that the roughness of the surface is increased, giving the surface a greater propensity for incorporation of defects. This is particularly the case when an impurity catalyses the nucleation of new layers of diamond in different regions of a {100} surface, leading to the formation of macrosteps consisting of terraces with inclined risers that offer different kinds of sites for defect incorporation, such as is described in Martineau et al., Gems & Gemology, 40(1), 2 (2004).

There are many kinds of defects that may potentially be involved. For example, single substitutional impurity defects may be incorporated. These involve the substitution of a carbon atom by an impurity atom. Hydrogen is always present in the CVD growth environment and may become incorporated either on its own or in combination with one or more impurity atoms. Vacancies (unoccupied sites in the diamond lattice which would normally be occupied by a carbon atom) may become incorporated in combination with one or more neighbouring impurity atoms (e.g. nitrogen-vacancy defects), or one or more hydrogen atoms (e.g. vacancy-hydrogen complexes). Some defect complexes involve impurity atoms, hydrogen atoms and vacancies (e.g. nitrogen-vacancy-hydrogen complexes). Clusters of vacancies may be formed with or without bonded hydrogen and in some cases may be associated with impurity atoms.

The wide ranging set of defects incorporated once the surface is roughened is generally found to have an undesirable effect on the optical and electronic properties of the material. For example, the set of defects may contain some which give the material undesirable optical properties because of the way they absorb light in, for example, the visible region of the spectrum. They will degrade electronic properties because they reduce the mobility and lifetime of carriers.

One general mechanism that is believed to underlie the current invention is that the deleterious effect of one gaseous source comprising a first impurity atom type can be suppressed by the addition of a second gaseous source comprising a second impurity atom type which suppresses the roughening effect that the first impurity atom type would otherwise have on the growth surface. By suppressing the roughening of the surface the addition of the second impurity also suppresses the incorporation of the wide range of defects outlined above that degrade the properties of the material grown.

In the presence of both impurity atom types, with growth taking place on a smooth surface, the two impurity atom types will generally be incorporated but with a lower efficiency than would be observed for growth on a rough surface. It is significant, however, that many of the defects discussed above (e.g. vacancy clusters and hydrogen-related defects) are not observed at all when growth has taken place on a smooth surface as a result of the addition of the second impurity atom type. The outcome is that the two impurity atom types may be incorporated into the diamond material at moderate concentrations that are measurable but without the wide range of defects that have the strongest adverse effects on the properties of the diamond layer produced, such as its optical transmission.

It is also believed that the method of the present invention may additionally be based on a second general principle in which the two impurity atom types are incorporated in such a way that they mutually compensate each other. As such, the two impurity atom types are chosen so that, within particular concentration ranges in the diamond layer, they do not have a substantial adverse effect on the material properties that are desired. According to prior teaching in the art, there would be an assumption that this would exclude any benefit from compensation using nitrogen, which is normally associated with a range of defects that degrades the colour and other properties. However, in light of the first general principle outlined above that defects can be decreased on addition of a second impurity atom type, additional advantage can be taken of the mutual compensation effect between the two impurity atom types. This will generally be partly because one impurity atom type compensates for the effect that the other would have in its absence and vice-versa. Compensation can be illustrated using the example of nitrogen and boron. By themselves substitutional nitrogen and boron give diamond yellow/brown and blue colour, respectively. However, the inventors of the present application have found that when present together in approximately the same concentrations, colourless material can result because the substitutional nitrogen defects donate electrons to the substitutional boron defects and the resultant ionised defects do not give rise to significant optical absorption.

For a given set of growth conditions (such as, substrate temperature, pressure and plasma temperature) the inventors have found that there is a threshold nitrogen concentration that can be tolerated by the CVD diamond synthesis process before the surface roughens and the grown diamond becomes brown. However, the threshold nitrogen concentration tends to be so low that considerable time and expense is involved to achieve a nitrogen concentration below the threshold in order to avoid the incorporation of defects affecting the material's optical and other properties.

The inventors of the present invention have found that the addition of a second impurity atom type (such as boron or silicon) to the growth gases can significantly increase the threshold nitrogen concentration to levels that might be present in growth environments when relatively little attention is given to nitrogen elimination. This allows diamond to be grown in the presence of relatively high concentrations of nitrogen without the degradation of the optical and other properties that would otherwise result because of the incorporation of defects such as vacancy clusters and hydrogen-related defects. In addition it has been surprisingly found that this is possible even though there may be significant incorporation into the grown diamond of both nitrogen and the second impurity atom type.

One aspect of the present invention thus relates to the use of a second impurity atom type to counter the detrimental effect on colour of a first impurity atom type present in the CVD synthesis atmosphere. In this way, the present invention enables a CVD diamond to be produced which has high colour even though the CVD synthesis atmosphere comprises an amount of a first impurity atom type which would otherwise produce a diamond not having high colour. This has the advantage of removing the need to take special steps to eliminate impurity atom types known to adversely affect the colour of diamond from the synthesis atmosphere merely by adding a particular type and amount of a second impurity atom. Consequently, the synthesis of CVD diamond can be simplified and is more efficient in both time and cost.

The CVD diamond layer produced by the method of the present invention is single crystal diamond.

In one embodiment of the method of the invention, the dopant is nitrogen, which produces a mark of origin or fingerprint, preferably in the form of a layer, that shows 575 nm and/or 637 nm luminescence peaks, with their associated vibronic systems, under suitable shorter wavelength excitation. The nitrogen doped layer may also show a photoluminescence line at 533 nm.

In an alternative embodiment of the invention, the dopant is a combination of nitrogen and boron, where the boron is preferably present in a higher concentration than the nitrogen, which produces a mark of origin or fingerprint, preferably in the form of a layer, that generates characteristic phosphorescence, peaking typically in the range of 400 nm to 500 nm, under suitable shorter wavelength excitation. The addition of a gaseous source comprising boron also counters the detrimental effect on colour of diamond that nitrogen would otherwise have.

In a particularly preferred embodiment of the invention, a combination of layers that generate 575/637 nm luminescence and 400 nm to 500 nm phosphorescence under suitable shorter wavelength excitation is grown into the diamond material during synthesis.

A further alternative embodiment of the invention is the marking of a layer or region with the centre which emits 737 nm radiation under optical excitation. The exact identity of this optical centre is uncertain, although it is believed to involve silicon; it will hereafter be referred to as the 737 nm silicon related centre. Whereas the luminescence at 575/637 nm and the phosphorescence in the range 400 nm to 500 nm can easily be detected by eye under suitable viewing conditions, the detection of the luminescence from the 737 nm silicon related line is generally more easily detected using specific optical instrumentation with an integrated detector, and typically giving an output in the form of an analogue display. Additionally, by adding silicon these impurity atoms counter the detrimental effect on colour of diamond of nitrogen impurity atoms.

In accordance with a further aspect of the invention there is provided a CVD single crystal diamond material bearing a mark of origin or fingerprint in the bulk thereof, which mark of origin or fingerprint is grown into the diamond material during the synthesis thereof, preferably in accordance with the method described above.

The single crystal diamond material may be prepared for a range of industrial applications. In particular, applications include those in which the synthetic diamond material is a visible element to the user, or where the synthetic diamond element is re-useable or needs periodic reprocessing, as is for example the case with diamond cutting blades such as scalpels.

Alternatively, the single crystal diamond material may be prepared or suitable for preparation as a synthetic gemstone for jewellery applications.

The invention also extends to an apparatus for detecting the mark of origin or fingerprint in a CVD single crystal diamond material, object or synthetic gemstone, the apparatus comprising:
 a source of light or radiation of a particular wavelength for causing excitation of the mark of origin or fingerprint, resulting in luminescence and/or phosphorescence thereof; and
 a detection means for detecting the mark of origin or fingerprint, for example a viewer for viewing the luminescence and/or phosphorescence, or an instrument providing a measure of the intensity of the specific luminescence and/or phosphorescence, in forms such as an analogue or digital electrical signal, or display readout, for example.

The apparatus preferably comprises a range of optical filters for viewing the wavelengths emitted by the mark of origin or fingerprint, and means for excluding background white light or wavelengths used to excite the fingerprint or mark of origin, or any other background wavelengths present which may be detrimental to observing the wavelengths emitted by the mark. The characteristic luminescence and/or phosphorescence may be viewed in the form of a special image detectable directly in the diamond material, or it may be viewed by using instrumentation such as a charge coupled device (ccd) or imaging device such as a digital camera. Alternatively, the luminescence and/or phosphorescence may be characterised by a spectroscopic device such as one or more specific band pass filters and/or frequency specific sensors, or a compact spectrometer. These techniques can be combined, for example using suitable filters in combination with a ccd camera to form frequency specific images.

The apparatus may also include magnification means for magnifying the image of the synthetic diamond material.

DESCRIPTION OF PREFERRED EMBODIMENTS

The invention provides a method of marking synthetic diamond material, in particular such material prepared for use in industrial applications such as cutting tools or as a CVD synthetic diamond gemstone. However, the method of the invention extends beyond applications involving marking of diamond and can be applied to any type of CVD single crystal diamond.

The method of marking enables the determination of origin, said mark of origin or fingerprint comprising one or preferably more layers grown into the diamond during synthesis, which do not substantially affect the perceived optical or gem qualities of the diamond under normal viewing, or significantly affect any other application specific properties relating to the intended application, but which can be viewed under special viewing conditions. For convenience, the layer or layers comprising this mark of origin or fingerprint may be referred to as tagging layers.

Throughout this specification, the terms 'fingerprint' or 'mark of origin' are deemed to include features which provide one or more of the following benefits:
 a) basic identification of the synthetic nature of the material;
 b) identification of the manufacturer, or the method of manufacture;
 c) a brand mark or other characteristic mark;
 d) a batch mark or date stamp;
 e) a means by which post processing or modification of the diamond or article formed from the diamond can be detected.

The fingerprint or mark of origin must also be relatively simple to apply to or incorporate in the material, and similarly be observed or detected in a relatively unskilled operation using simple, low cost, compact and relatively portable equipment. By low cost, it is meant that the equipment is preferably <$10,000, and more preferably <$5,000, and even more preferably <$2,000, and even more preferably <$1,000. On this basis, means of marking solely based on varying the isotopic ratios of elements in the diamond away from natural abundance are specifically excluded. Isotope variation to mark material is known in a large range of materials, particularly in laboratory methods. In diamond such methods include two possible variants.
 1) Varying the isotopic abundance of the carbon, i.e. using a carbon source which is isotopically enriched in $^{12}$C or $^{13}$C. The problem with this is twofold:
  a. isotopically enriched $^{12}$C or $^{13}$C source gases are very expensive, adding substantially to the cost of manufacture, and
  b. detection of isotopic variation requires complex and expensive equipment and a high level of skill to operate and interpret. Furthermore most techniques predominantly look at surfaces and local features, rather than the bulk and pattern of features throughout the bulk. Specific techniques include secondary ion mass spectroscopy (which also damages the sample), Raman analysis possibly combined with confocal techniques, and high resolution X-ray diffraction, etc.
 2) Varying the isotopic ratio of another element in the diamond such as nitrogen. Such a technique is predominantly relevant to HPHT synthetic diamond where the concentration of nitrogen and other elements can be relatively high, for example nitrogen can be in the range of 100-800 ppm. The problems with this are similar to those with carbon isotope variation, in that:
  a. isotopically enriched gases are expensive, adding to the cost of manufacture
  b. detection is complex, expensive and skilled. Detection is further complicated in typical CVD diamond by the low concentration of impurity elements in the diamond, often below 1 ppm in the solid, so that some techniques which may be applicable to HPHT diamond are not suitable for CVD diamond.

Consequently, whilst in some instances there may be reasons to combine an isotopic variation with the method of this invention, for example to provide additional features which are less easily detected, this invention excludes the required use of isotopic variation. Within this specification, isotopic dopants refers to dopants where the isotopic abundance is deliberately different from the natural isotopic abundance, so as to confer a detectable variation in isotopic abundance in the material. Chemical dopants refers to dopants which provide different chemical elements, so as to confer a detectable variation in the elements within the material, at least in the form of defect centres characteristic of these other elements.

Furthermore, detection of the fingerprint or mark of origin under specialized viewing conditions refers to detection of light of a characteristic wavelength or colour emitted by the mark under the specialized conditions and detected directly by the eye of the observer, or indirectly via optical detection means that then provide some means of human detectable output, generally a visible analogue output although this may be converted to an indication of whether the signal is above or below a threshold by the detection instrument. Generally the preferred method of detection is directly by the eye of the observer, since this provides the opportunity for spatial information, including binocular or depth information, and provides a particularly inexpensive solution. In the case of one specific example given later, the 737 nm silicon related line, the eye is generally not sufficiently sensitive to detect the typical levels of emission achieved, and a simple method of wavelength selection and then optical energy detection may be preferred, and can still be provided in simple, low cost, compact and relatively portable equipment.

By way of example, diamond scalpel blades are often re-useable, periodically returning to the manufacturer for preparation of a new edge. Used in this application, the mark of origin or fingerprint can fill one or more of the following functions, although its purpose may not be limited to these examples:

a) Enable the specific manufacturer of the synthetic diamond scalpel to be identified, either by the manufacturer or by the marketplace. This can be used by the manufacturer to ensure that only his own blades are accepted for reprocessing, and improve the ability to track such blades within the reprocessing or in the marketplace at large.

b) Provide a means by which to generate a distinctive mark, such as a trademark, without degrading the material in its final application. Ordinarily visible identification marks on the synthetic diamond scalpel blade may not be acceptable for some applications because of requirements of hygiene, uniform transparency, or simply market expectation or acceptance.

c) Enhance the identification of the synthetic nature of the diamond material. Synthetic diamond can offer greater reproducibility and control in many industrial applications, thus offering a better product.

d) Provide a means by which modification of the synthetic diamond material may be identified, such modification including changes to physical shape and annealing treatments such as those which modify colour.

By way of further example, in the application of CVD diamond in synthetic gemstones, the mark of origin or fingerprint can fill one or more of the following functions, although its purpose may not be limited to these examples:

a) Enable the specific manufacturer of the CVD synthetic gemstone to be identified, either by the manufacturer or by the marketplace.

b) Provide a means by which to generate a distinctive mark such as a trademark.

c) Enhance the identification of the synthetic nature of the diamond material.

d) Provide a means by which modification of the CVD synthetic diamond material may be identified, such modification including changes to physical shape and annealing treatments such as those which modify colour.

The exact function of the mark of origin or fingerprint typically determines the form of the mark that is preferred.

In its simplest form the mark may merely comprise a substantial portion of the diamond layer, object or synthetic gemstone, or a single broad layer within it, exhibiting an unnatural characteristic which is only observable under specific artificial conditions of observation and does not significantly affect the colour of any object prepared from the layer under normal illumination. The obviously artificial element to the mark may result from its colour, possibly in combination with the specific artificial conditions applied in order to observe the colour, or the geometry of the boundaries or distribution of the marked layer within the whole layer, primarily observed as the geometry with which it intercepts the boundaries of the layer, object or synthetic gemstone, or in the way it influences the appearance of an object of given geometry when viewed from one or more specific viewing angles.

In a more complex form, in order to generate a distinctive mark such as a trademark, the mark of origin or fingerprint generally comprises one or more sets of characteristic layers, either distributed periodically throughout the diamond layer, object or synthetic gemstone or, in the case of a single set of characteristic layers, placed in an appropriate location, generally not too near one of the edges of the object such that minimal removal of material will remove it, nor generally such that the mark is concealed and made difficult to observe by components essentially permanently attached to the object in normal use. In the case of a synthetic gemstone, a single set of characteristic layers may be located near the middle of the thickness of the cut stone, or if biased away from the middle then preferably biased in order to enhance the intended benefit of the layer.

The ideal location of a layer within a gemstone is dictated by a number of considerations:

a) The tagging layer should not be easily removable, and thus not wholly close to an external surface such as the table or culet.

b) The tagging layer should not provide visible colour to the gemstone. The effect of the tagging layer on the colour of the gemstone will depend on the intrinsic optical absorption properties of the tagging layer material and the path length within the layer of light rays reaching the eyes of the viewer. The latter depends on position and thickness of the layer. It is also a function of the cut of the stone, although generalizations are possible.

c) The tagging layer should be positioned so that in any mount not normally easily removed, such as a jewellery setting, the volume of the layer can be efficiently excited by a deliberately applied external light source used during identification, the key point being that this light distribution may differ from that in normal viewing conditions, being for example a high intensity parallel beam rather than more diffuse.

d) The tagging layer should be positioned so that in any mount not normally easily removed, such as a jewelry setting, a significant proportion of the light emitted by the tagging layer is made available to the viewer or other means of detection. Whilst this may seem self-evident, the angle for total internal reflection in diamond is only 22.4° away from normal incidence due to its high refractive index and this gives some unexpected results, discussed further below. Again this is a sensitive function of the cut of the stone, but generalizations can be made.

e) Aspects (b)-(d) interact, such that ideally the tagging layer, or the majority volume of it, is placed at that position in the final synthetic gemstone which is most effectively illuminated and which most efficiently passes back the emitted radiation to the viewer or detection system, but which does not provide excessive enhancement of the effect on the visible colour of the stone.

The effect of total internal reflection on the viewing of luminescence arising from the volume of a CVD diamond plate or stone will now be considered. As an example, consider a rectangular flat plate with precise flat faces all of the type {100}. An external light beam of given direction will pass into the diamond whatever its direction, refraction resulting in it being bent to much closer to the normal to the interface at the interface. It may possibly be internally reflected once by a face parallel to a different axis but will then exit the sample again, essentially exiting after a single pass through the material. However, when luminescence arises in the volume of the stone its direction of emission is generally equally distributed throughout the solid angle (although it is possible to identify defects with a non-uniform pattern of emission). Imagine then the $4\pi$ solid angle of the uniform irradiation field, interacting by total internal reflection with the faces of the plate. Any radiation not within 22.40 of the normal of one of the 3 face types ({100}, {010}, {001}) will be permanently totally internally reflected. Now imagine a small corner facet. This will be able to emit all radiation internally incident on it within 22.4° of its normal from the entire volume of the sample, very little of this radiation escaping through the main faces of the plate. Thus, in this case, strong emission is observed from facets which are not parallel to the main facets. However, at each facet which is emitting the emitted light is refracted to largely fill the hemisphere of solid angle centred on the normal to the plane of the facet. From this simple example it is clear that the behaviour of the excitation source passing into a three dimensional diamond object and the emission of light generated within it can be distinctly different.

As a further example to put this into context, in a typical round brilliant cut synthetic diamond gemstone, a layer near the table is generally likely to affect the visible colour of the stone and be relatively easily excited by a specific source, but may not provide good intensity in the emitted beam out through the table because all light more than 22.40° away from the normal to the table will be totally internally reflected, then possibly exiting the stone below the girdle. In contrast, a layer near the culet will generally impact less on the visible colour of the stone, may require more careful control of the excitation beam angle and distribution in order for it to be effectively excited, but may be more effective in providing emission of luminescence through the table as a result of total internal reflection at the pavilion facets below the girdle towards the culet.

One particular type of layer is one in which the prime active impurity is nitrogen in the form of $NV^0$ and $NV^-$ centres that generate 575 nm and 637 nm luminescence lines respectively, together with their associated vibronic bands, under suitable shorter wavelength excitation. The combination of these emissions appears orange/red and is generally referred to as 'orange luminescence'. Such luminescence extinguishes essentially instantaneously when the excitation source is removed. Whilst clearly visible under suitable artificial illumination conditions, under normal viewing conditions and with appropriately chosen defect concentrations and/or total defect numbers as envisaged in this invention, this type of centre does not significantly alter the perceived colour of the gemstone.

Another particular type of layer is one in which the dominating impurities are boron and a suitable donor such as nitrogen. Donor-acceptor pair recombination may occur in such a layer and the layer then exhibits characteristic blue luminescence over a broad band peaking in the range 400 nm to 500 nm, typically in the region of 500 nm under suitable shorter wavelength excitation. Phosphorescence builds up and then saturates with time during the period under the excitation source, and is visible as its intensity decays for a period of time after the removal of the excitation source, the time period typically being several seconds although it can be as long as a minute or more. In this type of layer the nitrogen has two important roles: providing the donor for donor/acceptor pair recombination and, by compensating the boron, reducing the B-related absorption which might otherwise cause observable blue colour. With suitable artificial illumination conditions donor-acceptor luminescence and phosphorescence may be clearly visible for a layer that, under normal viewing conditions, does not significantly alter the perceived colour of the diamond object. Other donors, such as intrinsic defects, may contribute to this type of luminescence and phosphorescence.

A particularly advantageous arrangement would be where these two types of layer are both present, possibly used alternately or in some other pattern, within unmarked material. Alternatively, one type of layer, preferably the orange luminescent layer, may fill substantially all the volume not occupied by the other. Shorter wavelength excitation can then be selected to excite both the (575 nm/637 nm) orange luminescence and the (500 nm) blue-band phosphorescence, or a suitable combination of wavelengths can be used.

The method of viewing the mark is in part related to the excitation wavelength(s) used. Using sub-bandgap illumination (i.e. light with insufficient energy to excite electrons right across the band gap in diamond, and thus not normally absorbed by diamond itself), the radiation would be transmitted through the volume of the stone, being absorbed only by the defects in the doped marker layers, enabling the volume of the doped marker layers to be excited. Since the wavelengths emitted from the layers are also transmitted by diamond (although some absorption may occur in the defects in the layers) the person viewing the stone would be able to see, for example by viewing through the table of the stone, a substantial area of the layer which is emitting the colour within the diamond volume.

On switching off the excitation source, since the orange luminescence turns off with the excitation source, the perceived colour of the light emitted from the CVD diamond material, or the tagging layers within it, would change from orange, or some orange/blue combination, to blue. This will be termed the orange/blue flash. The visibility of such a change in colour, particularly the visibility of the orange component against the blue phosphorescence, may need to be enhanced by use of suitable filters. Sub-bandgap illumination would be the preferred excitation wavelength for simple demonstration of the existence of the mark in the piece of synthetic gemstone, allowing its detection through the table of a cut stone even when the layers are significantly further down in the material. In some instances where the material is formed in the shape of a synthetic gemstone it may be preferred to place these layers below the girdle of the stone, so that the edges of the layers are generally concealed by the mount. In other instances it may be preferred to place the layers above the girdle, allowing these edges to be viewed on the crown facets. The closer to the centre of the synthetic stone the layers are positioned, the more difficult it is to remove the mark by repolishing the stone without significant weight loss. The orange/blue flash is particularly characteristic of the combination of these particular marking layers. It provides a unique characteristic not seen in natural diamonds or likely to occur accidentally in synthetic stones. Those skilled in the art will understand that other colour combinations may be possible using other types of defects in the diamond material, and that the invention is not limited to any particular colours and or viewing conditions, but extends generally to any viewable distinctive mark not normally observed in natural diamond which does not substantially degrade the visual characteristics of the layer or gemstone under normal viewing conditions.

Using above-bandgap illumination (i.e. light with sufficient energy to excite electrons right across the band gap in diamond), the diamond material would itself directly absorb the incoming radiation and limit the penetration depth to near the surface of the stone. This would potentially limit the visibility of the layers to those areas close to the surfaces of the stone which are directly exposed to the artificial illumination. Two effects may broaden the region in which the illuminating irradiation is absorbed or a response observed, the first is where the excitation radiation is near-bandgap, so that the attenuation of the radiation in the diamond material is rising but is not yet limiting the penetration to a few microns depth at the surface, and the second is where charge carriers excited at the surface by the incoming radiation are able to drift further into the diamond item and then cause excitation of the layers further into the bulk. The ability for this to happen depends on a variety of factors including the general purity and crystal perfection of the synthetic diamond material outside the specifically marked layers.

However, the benefit of using above-bandgap radiation is generally to limit the region excited to the surface of the diamond item and thus provide greater definition of the pattern of the layers, although viewing this detail often requires more sophisticated viewing equipment, particularly in view of the thickness of the layers. In this domain, viewing only the exposed edges of the layers and considering the specific example of using alternate orange luminescing and blue phosphorescing layers, both layers would be visible during excitation but only the layers showing blue-band phosphorescence would be visible after the excitation ceased. Above-bandgap illumination is particularly useful in a) enabling the detailed geometry of a mark intended as a trademark to be observed, and b) where the geometry of the layers is used to emphasise the synthetic nature of the material where the colour or colours, spatially or temporally separated, alone may not be sufficient.

Where a single marking layer is used, this may occupy a substantial volume of the whole layer, object or synthetic gemstone. Where one or more layers are used in a single group or pattern then the lower bound of the thickness of each of the layers would typically exceed 10 µm, more typically exceed 20 µm, even more typically exceed 50 µm, even more typically exceed 100 µm, and most typically exceed 200 µm, and the upper bound of the thickness of each of the layers would typically be less than 1000 µm, more typically be less than 600 µm, even more typically be less than 400 µm and most typically be less than 250 µm, the basic criteria being that for the concentration of impurities used and the associated absorption and luminescence characteristics, the layers are thin enough so as not to significantly colour the cut stone when viewed under normal light, whilst being sufficiently thick to provide sufficient visibility under the selected excitation wavelengths. An additional requirement may be for the layers to be thick enough for their geometry to be precisely measurable, for example using an above band gap viewer as described earlier. A further combination is where one marking layer or characteristic feature extends throughout the majority or the whole of the diamond object except where a second layer is formed within this region.

Where one or more layers are used in multiple or a repeating pattern spread through the volume of the stone then the individual layers may be thinner, a key parameter being the total thickness of all the layers of the same type. In such circumstances the lower bound of the thickness of each of the layers would typically exceed 2 µm, more typically exceed 5 µm, and most typically exceed 10 µm, and the upper bound of the thickness of the layers would typically be less than 100 µm, more typically be less than 50 µm, even more typically be less than 20 µm.

In particular, excluding for the moment the geometrical issues described earlier arising from the effect of total internal reflection, viewing near normal to the plane of the marked layers using sub-bandgap radiation, the critical parameter would be the concentration of emitting centres through the thickness of the layer projected onto the plane of the layer. That is, the observed brightness of the layer would be proportional to the product of the intensity of the exciting radiation, the concentration per unit volume of the irradiating centre, and the thickness of the layer. Other effects can also contribute to the observed intensity, including the effect of self absorption elsewhere in the material. Thus thicker layers would be preferred where concentrations of dopants were very low. Such conditions may be favoured by the requirement to have minimal impact on the overall growth process.

In contrast, viewing the edges of the layers in above-bandgap excitation, the depth of material sampled would be largely fixed by the radiation wavelength and thus the observed brightness would be proportional to the product of the intensity of the exciting radiation and the concentration per unit volume of the relevant defect centres, with the thickness of the layer determining the lateral extent of the area emitting. Thicker layers may again assist in improving visibility where concentrations of dopants are low, by increasing the area to be observed.

A third case is when viewing near normal to the plane of the marked layers using sub-bandgap radiation in a cut gemstone. This is described in more detail later, where total internal reflection on the lower facets dominates the behaviour. Here, although the viewing direction is apparently normal to the plane of the layer, the beam actually being observed is largely parallel to the layer until total internal reflection occurs, so that the critical parameter would be the concentration of emitting centres through the thickness of the layer projected onto the plane of the layer. That is, the observed brightness of the layer would be proportional to the product of the intensity of the exciting radiation, the concentration per unit volume of the irradiating centre, and the lateral extent of the layer. Other effects can also contribute to the observed intensity, including the effect of self absorption elsewhere in the material.

Useful concentrations of the various impurities have been evaluated and found to be as detailed below. However, those skilled in the art will understand that there is considerable interaction between the type of growth process used, the concentration of other impurity centres or structural defects which may for example result in quenching of luminescence or a change in the charge state and thus the optical behaviour of the impurities used for the tagging layers. In addition, it is well known that the uptake of impurities varies with the specific growth sector of diamond involved, for example the {111} growth sector often taking up higher concentrations of impurities than the {100} growth sector. For simplicity the data given below relates to the {100} growth sector and requires suitable modification where other growth sectors are involved.

Thus, using a microwave process such as that detailed in Example 1, it has been found that for generating the 575 nm luminescence at levels suitable for tagging, whilst reducing the effect on colour and visible absorption to acceptable levels, the optimum value of the molecular nitrogen concentration in the gas phase lies in the range having an upper limit of preferably 10 ppm, more preferably of 3 ppm, even more preferably of 1 ppm, even more preferably of 0.5 ppm and most preferably of 0.2 ppm, and a lower limit of preferably 0.01 ppm, more preferably 0.05 ppm, and most preferably of 0.1 ppm. In terms of the nitrogen incorporated into the solid of the material, this is not always easy to characterize in diamond at these low levels but is generally measured in terms of atomic fraction to be about $10^3$-$10^4$ lower than that of the molecular concentration in the gas phase. Molecular nitrogen is not the only useful source of nitrogen, for example $NH_3$ would also be of use, although the relative activation/incorporation of the N may then be different.

Likewise, using a microwave process such as that detailed in Example 1, it has been found that for generating B/N donor acceptor pair phosphorescence at levels suitable for tagging, whilst reducing the effect on colour and visible absorption to acceptable levels, the concentration of both boron and nitrogen needs to be controlled. In particular, the concentrations of B and N in the solid are preferably within a factor of 30, and more preferably within a factor of 10, even more preferably within a factor of 5, even more preferably within a factor of 3, and most preferably within a factor of 2, preferably in each case with the concentration of the boron exceeding the concentration of the nitrogen. One benefit of this is that the nitrogen compensation of the boron reduces the effect that the boron has on the colour of the material. A further limit is provided by evaluating the effect of the boron on the visible colour. Experimentally it has been determined that uncompensated boron provides a visually detectable blue colour when present in a round brilliant as a layer where the product of the thickness of the layer and the uncompensated boron concentration in that layer exceeds 0.1 ppm·mm (e.g. 1 mm thickness of 0.1 ppm uncompensated boron or similar). Phosphorescence however can be generated in layers with much lower levels of boron, with suitable levels of phosphorescence having been observed in 200-400 μm thick layers with concentrations of boron in the solid of 0.01 ppm to 0.001 ppm, with the indication that even lower levels may be sufficient.

It has been determined experimentally that the phosphorescence intensity arising from boron/nitrogen donor acceptor pair recombination can be reasonably approximated as the sum of two second-order decays, each with a characteristic time constant. The form of this is given below:

$$I/I_0 = A(1+t/\tau_1)^2 + (1-A)/(1+t/\tau_2)^2$$

It should not be assumed from the observation that the data can be fitted to an equation of this form that there are two, or only two, distinct types of centre present. In some cases there is only one time constant with a significant amplitude. However, it is generally found that where two time constants can be found, they differ by a factor of about 8 to 10. At higher concentrations of boron, the longer time constant is generally still relatively short, typically under 2 seconds and often under 1 second. At lower concentrations the slower decaying component generally becomes more dominant and its time constant increases to greater than 3 seconds. This has three related advantages:

a) the integrated pumping period effectively increases in proportion to the decay time constant (phosphorescent decay observed just after removing the excitation beam could have been excited a longer time ago);
b) the intensity at any given time after excitation as a consequence increases; and
c) typically for optimum detection by eye the intensity needs to be visible for at least 2-3 seconds.

The relationship between boron concentration and the value of the longer time constant is not fully determined, but under test conditions used, for example as in Example 1, boron concentrations below 0.1 ppm in the solid seem particularly beneficial.

Thus the preferred concentration of boron in the solid lies in the concentration range with an upper bound of 1 ppm, more preferably 0.3 ppm, even more preferably 0.1 ppm, even more preferably 0.05 ppm and most preferably 0.02 ppm, and with a lower bound of 0.0001 ppm, more preferably 0.0003 ppm, even more preferably 0.001 ppm, even more preferably 0.002 ppm, and most preferably 0.005 ppm. The incorporation ratio of the boron is typically such that the preferred values for the molecular concentration of diborane in the gas phase are a factor of 10 higher than these values.

As is generally well known, the incorporation ratio for nitrogen is much lower than that for boron. As a consequence, whilst the optimum concentration in the solid may be close to but below that of the boron for enhanced phosphorescence, the concentration in the gas phase is generally much higher. Typically the concentration range for the nitrogen is chosen to meet the other criteria—that is the boron concentration in the solid is first set and then the relative concentration of the nitrogen in the solid set, thus largely determining the concentration of nitrogen to add to the gas phase dependent on the exact incorporation ratio achieved under the growth conditions in use. However, preferred values for the molecular nitrogen concentration in the gas phase for the production of the blue phosphorescent layer lie in the range bounded by an upper limit of preferably 50 ppm, more preferably 20 ppm, even more preferably 10 ppm, even more preferably 5 ppm and most preferably 2 ppm, and a lower limit of preferably 0.02 ppm, more preferably 0.05 ppm, even more preferably 0.1 ppm, even more preferably 0.2 ppm and most preferably 0.5 ppm. Again, molecular nitrogen is not the only useful source of nitrogen, for example $NH_3$ would also be of use, although the relative activation/incorporation of the N may then be different.

In the case of the Si-related 737 nm centre, the nature and behaviour of this defect is less well understood at this time, however again very low concentrations of silicon, of the order of 10 ppm to 0.0001 ppm, are believed to be suitable to generate the defect in sufficient quantity, provided the other necessary components are present. One particular issue is thought to be the charge state of the defect; in the presence of boron the charge state may change from the state needed for 737 nm luminescence, whilst the presence of nitrogen may help to stabilize the defect in the correct charge state. Models for the defect include a substitutional Si with an adjacent vacancy in the neutral charge state, a silicon vacancy complex, and two substitutional silicon atoms along the <111> axis bound with vacancies. The total integrated intensity of luminescence from the Si-related centre is typically much less than for the $NV^0$ and donor-acceptor luminescence and phosphorescence. In addition, it lies in a region of the spectrum (737 nm) where the eye is less sensitive. Consequently the primary methods for its detection involve spectroscopic instruments rather than direct viewing. Detailed layer structures in the incorporation of the Si-related centre are less advantageous because they are harder to view or identify in other ways. That said, the 737 nm line can be viewed in systems using, for example, electronically enhanced imaging, particularly in combination with the use of suitable filters, and layer structures can also be detected by means such as confocal luminescence depth profiling over a limited wavelength region or combined with spectroscopic analysis. The 737 nm Si related centre has a complex set of excited states and can thus be excited by a range of different laser wavelengths including 488 nm and 514 nm, and is particularly efficiently excited by the 633 nm HeNe laser. However, other light sources with wavelengths in the range 480-700 nm would be suitable.

Suitable sub-bandgap wavelengths for viewing the marks or tagging layers can be determined as follows. Orange luminescence (from the 575 nm and 637 nm optical centres) can be excited by a range of wavelengths such as 514 nm, 488 nm and shorter wavelengths, but excitation efficiency is reduced as wavelengths approach the UV and it is worth noting that the 637 nm centre is not excited by wavelengths below about 400 nm. In contrast, blue-band phosphorescence is more efficiently excited by wavelengths approaching the short UV, such as the mercury line at 254 nm. These trends in the efficiency of excitation are not particularly limiting, however, and a range of wavelengths can be used to excite both emissions sufficiently well.

Suitable above-bandgap radiation for viewing one or more tagging layers in the near-surface region would be at 193 nm and shorter wavelengths. Generally high luminance sources can be used and good spatial resolution still obtained because of the strong attenuation in the diamond. An instrument particularly suited to precise viewing and characterisation of the layers using above bandgap UV radiation is the 'DiamondView™' instrument, developed by the Diamond Trading Company which combines a suitable UV source with digital image capture and allows the study of both luminescence and phosphorescence in diamond samples even down to relatively low luminosity levels.

The optical characteristics when viewed using suitable conditions, or the spatial distribution of those regions providing the optical characteristics, or the combination of these two, provide a distinction from other forms of diamond such as natural diamond or CVD diamond known in the art. In this respect, whilst phosphorescence in natural blue diamonds is known, and orange luminescence, although relatively rare, is also known in natural stones, they are not known to exist in the same natural stone, nor are they known in the form of clearly defined layers in natural stones and there is no known example of natural diamond that shows the 737 nm silicon-related line.

It has been determined that the orange/blue flash effect may best be observed by exciting and identifying the orange 575 nm and blue luminescence/phosphorescence bands separately. The rationale for this is now discussed.

When a phosphorescent centre is present and excited by a suitable excitation wavelength, the phosphorescent centre is not only visible after the illumination is removed, but also whilst the illumination is on. This apparent luminescence from the phosphorescent centre will be stronger than any subsequent phosphorescence after the excitation source is removed, by a degree dependent on the lifetime of the centre and the time of measurement. Consequently, even a relatively weak phosphorescent centre can result in significant luminescence whilst the source is on.

Considering the use of a single wavelength or band of wavelengths to excite both orange luminescence and blue PL/phosphorescence, it has been noted that if the blue luminescence band is present in considerable strength, then this can make simultaneous observation of the 575 nm band extremely difficult. If an attempt is made to block the blue PL and observe the 575 nm region through a suitable filter (e.g. OG550) then a false impression of orange '575 nm PL' would be observed as the long wavelength tail of the blue luminescence would also be transmitted by the filter. There may also be additional confusion, as when the excitation source is switched off the long wavelength tail of the blue phosphorescence band would be observed through the filter.

Thus, the test for orange 575 nm luminescence should ideally be determined first followed by the test for blue phosphorescence. It is inadvisable to excite the blue phosphorescence first as this may take up to a minute to decay to a level where 575 nm luminescence may then be excited and observed. 575 nm luminescence may be excited with wavelengths in the range 225 nm to 575 nm but may only be excited without also stimulating blue luminescence/phosphorescence in the range 300 nm to 575 nm. The strength of the 575 nm emission depends on the CVD synthetic having a suitably high concentration of 575 nm centres in the tagging layer and/or a sufficiently thick layer. Wavelengths of excitation greater than about 380 nm are within the spectral response of the eye. This could severely affect the observation of the 575 nm band. In this case, a suitable filter is required to substantially or completely block the excitation source from reaching the eye of the person who is viewing the 575 nm band.

The test for 575 nm luminescence is then followed by the test for blue phosphorescence. The 575 nm excitation source and the viewing filter should be removed. Shortwave ultraviolet excitation at a wavelength or within a wavelength band in the range 225 nm to about 254 nm should then be switched on to excite any blue luminescence. The 575 nm band will also be stimulated by the shortwave excitation, but will almost certainly be dominated by blue PL. After several seconds the shortwave excitation should be switched off and blue phosphorescence observed. There will be no contribution from the 575 nm centre which does not show phosphorescence. If by using this sequential excitation method the orange/blue flash is observed then the stone under test is a tagged CVD synthetic with the specific structure described earlier.

A particularly advantageous form of inexpensive viewer for general detection of the presence of the mark in this invention would combine a small box to fit over the CVD diamond layer, object or synthetic gemstone to exclude ambient light, with an excitation light source entering the box and a viewing window, possibly in the form of a magnifying lens, with a filter to remove the excitation wavelength. Alternatively ambient white light could also be removed by filters rather than excluded from the viewing box, with the filters then being essentially band-pass filters for the orange luminescence and blue-band phosphorescence.

Sub-bandgap illumination would be the preferred excitation method for the simple demonstration of the existence of tagging layers/marks in the piece of synthetic diamond material for example by the orange/blue flash effect.

Sub-bandgap illumination would penetrate the whole volume of the synthetic stone and therefore permit excitation of tagging layers at any location within it. Tests have shown that in general the whole volume of the stone is equally illuminated, even using an excitation beam introduced from one side only, since the resultant image of the luminescence is not sensitive to the position/direction of the excitation beam. This method of excitation allows detection of the luminescence through the table of a cut stone even when the layers are significantly buried within the material and from a cut stone in a rub-over jewellery setting.

As stated above, the step of introducing a dopant into the source gas in a controlled manner also leads to the generation of diamond of high colour. For example, the method of the present invention is able to provide a CVD diamond layer having high colour where the synthesis atmosphere comprises a gas having a first impurity atom type that would prevent high colour diamond from being produced. All of the embodiments described above are equally applicable to the generation of diamond of high colour.

Typically, the introduction of boron or silicon to the growth gases can significantly increase the threshold nitrogen concentration to levels that might be present in growth environments when relatively little attention is given to nitrogen elimination. This allows diamond to be grown in the presence of relatively high concentrations of nitrogen without the degradation of the optical and other properties that would otherwise result because of the incorporation of defects such as vacancy clusters and hydrogen-related defects. In addition it has been surprisingly found that this is possible even though there may be significant incorporation into the grown diamond of both nitrogen and the second impurity atom type.

We define the term "high colour" in this invention in two different ways depending upon the form of the diamond material and the application to which it is put. The definition of "high colour" used herein is that which is most applicable to the form of the diamond layer produced and its application. When the diamond is in the form of a round brilliant (i.e. when the diamond is in the form of a gem stone), the GIA colour scale is generally used. When the diamond is in the form of a plate, etc, to be used in a technological application, the material is generally defined in terms of its absorption characteristics. Absorption characteristics are also used to define polycrystalline diamond.

Thus, when the diamond layer of the invention is in the form of a gem stone, 'High colour' is generally defined as being colour better than K on the Gemological Institute of America (GIA) gem diamond colour scale as determined for a 0.5 ct round brilliant, and defines material with absorption close to the theoretical limit for impurity free diamond. Herein, high colour equates to colours equivalent to the natural diamond colour grades of D to better than K, where these are colour grades on the Gemological Institute of America (GIA) colour scale, see 'Diamond Grading ABC', V. Pagel-Theisen, 9th Edition, 2001, page 61). This colour scale, which is the most widely used and understood diamond colour scale, is shown in Table 1. Table 1 is derived from 'Diamond Grading ABC, The Manual', Verena Pagel-Theisen, $9^{th}$ Edition 2001, published by Rubin and Son n.v. Antwerp, Belgium, page 61. The colours are determined by comparison with standards. The determination of the colour of diamonds is a subjective process and can only reliably be undertaken by persons skilled in the art.

TABLE 1

| Colour on GIA Scale | Impression of Colour |
| --- | --- |
| D | Colourless |
| E | |
| F* | |
| G | Almost |
| H | colourless |
| I | |
| J | |
| K | |
| L | Pale yellowish |
| M | |
| N | Very light |
| O | yellowish |
| P | Light yellow |
| Q | |
| R | Yellowish |
| S | |
| T | |
| U | |
| V | |
| W | |
| X | |
| Y | |
| Z | |
| Z+ | Fancy Colours |

*colourless for round brilliants less than 0.47 cts.

The clarity scale of the Gemological Institute of America (GIA), which is the most widely used clarity scale, is shown in Table 2. Table 2 is derived from 'Diamond Grading ABC, The Manual', Verena Pagel-Theisen, $9^{th}$ Edition 2001, published by Rubin and Son n.v. Antwerp, Belgium, page 61. It takes into account both internal and external flaws on a cut diamond. Typically, examination is made with the aid of a 10× magnifier or loupe by an experienced grader with appropriate illumination for the type of defect that is being sought.

TABLE 2

| Description | Designation | Notes |
| --- | --- | --- |
| Flawless | FL | Flawless: No internal or external features, with the exception of extra facets that are not visible from the upper facet; naturals at the girdle which neither widen it nor make it irregular; non-reflecting internal growth lines which are neither coloured nor white and do not affect transparency. |
| Internally flawless | IF | Loupe Clean (internally flawless): no inclusions and only minor external features, with the exception of small external growth lines. |
| Very very slightly included | VVS 1 & 2 | Very, very small inclusions 1 & 2: very small inclusions which are difficult to see; in the case of VVS1, these are very difficult to see and then only from the lower facet or they are so small and sufficiently near the surface to be easily cut away (potentially flawless). In the case of VVS2, the inclusions are still very difficult to see. |

TABLE 2-continued

| Description | Designation | Notes |
| --- | --- | --- |
| | | Typical inclusions include occasional spots, diffuse, very fine clouds, slight beading on the girdle, internal growth lines and very small fissures, nicks or blow indentations. |
| Very slightly included | VS 1 & 2 | Very small inclusions 1 & 2: smaller inclusions ranging from those which are difficult to see to those which are somewhat easier to see. Typical inclusions are small included crystals and small fissures, more distinct small clouds and groups of dot-like inclusions. |
| Slightly included | SI 1 & 2 | Small inclusions 1 & 2: inclusions which are easy (SI1) or very easy (SI2) to see; the inclusions are often in a central position, can be recognised immediately and in some cases are also visible to the naked eye. |
| Imperfect | I 1 to 3 | Inclusions 1, Inclusions 2 and Inclusions 3: distinct inclusions which in most cases are easily visible to the naked eye through the crown; in the case of inclusions 3, stone durability can be endangered. Typical inclusions are large included crystals and cracks. |

By "high clarity" is meant herein a clarity of at least SI 1 as defined in Table 2, preferably at least VS 2.

The GIA diamond gem grading system is the most widely used grading scale for diamond gems and generally considered the definitive grading scale. For the purposes of this application all gem colour grades are based on the GIA colour grades, and other gem properties such as clarity are likewise based on the GIA grading system. For a given quality of diamond, i.e. material with given absorption characteristics, the colour of a gem also varies with the size and cut of gem produced, moving to poorer colours (to colours towards Z in the alphabet) as the stone gets larger. To enable the colour system to be applied as a material property it is thus necessary to further fix the size and type of cut of the gemstone. All GIA colour grades given in this specification are for a standardised 0.5 ct round brilliant cut unless other stated.

Such colour grades are perceived by a skilled diamond grader as being nearly colourless or colourless. The diamond of the invention may have colour better than J, preferably better than I, preferably better than H, preferably better than G, preferably better than F, or preferably better than E. The diamond layer of the invention has "very high colour" where the colour is D to F on the GIA gem diamond colour scale as determined for a 0.5 ct round brilliant.

For technological applications and for polycrystalline diamond layers of the present invention, "high colour" is generally defined as the majority volume of the material having a particular absorption coefficient at certain specific wavelengths in the near ultraviolet and visible part of the electromagnetic spectrum (that is wavelengths in the range approximately 270 nm to 800 nm) when measured at room temperature. In particular, the absorption coefficients of the diamond at the wavelengths 270 nm, 350 nm, and 500 nm are of particular relevance, being generated by the defects arising from common impurities under normal process conditions and often playing a significant role on the colour of the material or the absorptions which may limit its use. Thus the CVD diamond material of the invention described above will also preferably have one, more preferably two, more preferably three, and most preferably all of the following characteristics (i), (ii), (iii), (iv), observable in the optical absorption spectrum:

i) an absorption coefficient measured at room temperature at all wavelengths between 300 and 1000 nm which is less than 2 $cm^{-1}$, more preferably less than 1 $cm^{-1}$, even more preferably less than 0.5 $cm^{-1}$, and most preferably less than 0.2 $cm^{-1}$;

ii) an absorption coefficient at 270 nm which is less than 2 $cm^{-1}$, more preferably less than 1 $cm^{-1}$, even more preferably less than 0.5 $cm^{-1}$, and most preferably less than 0.2 $cm^{-1}$;

iii) an absorption coefficient at 350 nm which is less than 1.5 $cm^{-1}$, more preferably less than 0.75 $cm^{-1}$, even more preferably less than 0.3 $cm^{-1}$, and most preferably less than 0.15 $cm^{-1}$;

iv) an absorption coefficient at 520 nm which is less than 1 $cm^{-1}$, more preferably less than 0.5 $cm^{-1}$, even more preferably less than 0.2 $cm^{-1}$, and most preferably less than 0.1 $cm^{-1}$.

Preferably the majority volume of the layer is formed from a single growth sector.

Material of the invention can have sharp absorption features in the range 720-750 nm, but these contribute little to the colour and are thus not restricted by these definitions.

To derive the absorption coefficient the reflection loss must first be subtracted from the measured absorbance spectrum. When subtracting the reflection loss, it is important to take account of the spectral dependence of the reflection coefficient. This can be derived from the wavelength dependence of the refractive index of diamond given by F. Peter in Z. Phys. 15, 358-368 (1923). Using this and standard formulae for the dependence of reflection loss for a parallel-sided plate on the refractive index, the effect of reflection losses on the apparent absorbance can be calculated as a function of wavelength and subtracted from measured spectra to allow absorption coefficient spectra to be calculated more accurately.

Alternatively, "high colour" may be defined using the CIELAB colour system. This colour modelling system allows colour grades to be determined from absorption spectra. This system takes into account the three visual attributes to colour: hue, lightness and saturation. Hue is the attribute of colour that allows it to be classified as red, green, blue, yellow, black or white, or a hue that is intermediate between adjacent pairs or triplets of these basic hues (Stephen C. Hofer, Collecting and Classifying Coloured Diamonds, 1998, Ashland Press, New York). White, grey and black objects are differentiated on a lightness scale of light to dark. Lightness is the attribute of colour that is defined by the degree of similarity with a neutral achromatic scale starting with white and progressing through darker levels of grey and ending with black.

Saturation is the attribute of colour that is defined by the degree of difference from an achromatic colour of the same lightness. It is also a descriptive term corresponding to the strength of a colour. The diamond trade uses adjectives such as intense, strong and vivid to denote different degrees of saturation assessed visually. In the CIELAB colour system, saturation is the degree of departure from the neutral colour axis (defined by saturation=$[(a^*)^2+(b^*)^2]^{1/2}$, see hereinafter). Lightness is a visual quality perceived separately from saturation.

In cases where material with particular absorption properties has been grown to a limited thickness, it is useful to be able to predict, from absorption spectroscopy measurements carried out on a thin parallel-sided plate of the material, what colour a round brilliant would be if it were polished from a thicker slab of uniform material with the same absorption coefficient spectrum. A simple routine for doing this is described here. The first stage of this routine is the derivation of CIELAB chromaticity coordinates for a parallel sided plate of material from its measured transmittance in the visible region of the spectrum.

The perceived colour of an object depends on the transmittance/absorbance spectrum of the object, the spectral power distribution of the illumination source and the response curves of the observer's eyes. The CIELAB chromaticity coordinates quoted in this specification have been derived in the way described below.

Using a standard D65 illumination spectrum and standard (red, green and blue) response curves of the eye (G. Wyszecki and W. S. Stiles, John Wiley, New York-London-Sydney, 1967) CIE L*a*b* chromaticity coordinates of a parallel-sided plate of diamond have been derived from its transmittance spectrum (between 350 nm and 800 nm with a 1 nm data interval) using the relationships below.

$S\lambda$=transmittance at wavelength $\lambda$
$L\lambda$=spectral power distribution of the illumination
$x\lambda$=red response function of the eye
$y\lambda$=green response function of the eye
$z\lambda$=blue response function of the eye $$X=\Sigma_\lambda[S_\lambda x_\lambda L_\lambda]/Y_0$$

$$Y=\Sigma_\lambda[S_\lambda y_\lambda L_\lambda]/Y_0$$

$$Z=\Sigma_\lambda[S_\lambda z_\lambda L_\lambda]/Y_0$$

Where $Y_0=\Sigma_\lambda y_\lambda L_\lambda$ $L^*=116(Y/Y_0)^{1/3}-16$=Lightness (for $Y/Y_0>0.008856$)

$a^*=500[(X/X_0)^{1/3}-(Y/Y_0)^{1/3}]$ (for $X/X_0>0.008856$, $Y/Y_0>0.008856$)

$b^*=200[(Y/Y_0)^{1/3}-(Z/Z_0)^{1/3}]$ (for $Z/Z_0>0.008856$)

$C^*=(a^{*2}+b^{*2})^{1/2}$=saturation $h_{ab}$=arctan($b^*/a^*$)=hue angle

Modified versions of these equations must be used outside the limits of $Y/Y_0$, $X/X_0$ and $Z/Z_0$. The modified versions are given in a technical report prepared by the Commission Internationale de L'Eclairage (Colorimetry (1986)).

It is normal to plot $a^*$ and $b^*$ coordinates on a graph with $a^*$ corresponding to the x axis and $b^*$ corresponding to the y axis. Positive $a^*$ and $b^*$ values correspond respectively to red and yellow components to the hue. Negative $a^*$ and $b^*$ values correspond respectively to green and blue components. The positive quadrant of the graph then covers hues ranging from yellow through orange to red, with saturations ($C^*$) given by the distance from the origin.

It is possible to predict how the $a^*b^*$ coordinates of diamond with a given absorption coefficient spectrum will change as the optical path length is varied. In order to do this, the reflection loss must first be subtracted from the measured absorbance spectrum. The absorbance is then scaled to allow for a different path length and then the reflection loss is added back on. The absorbance spectrum can then be converted to a transmittance spectrum which is used to derive the CIELAB coordinates for the new thickness. In this way the dependence of the hue, saturation and lightness on optical path length can be modelled to give an understanding of how the colour of diamond with given absorption properties per unit thickness will depend on the optical path length.

Much CVD material is brown because of a gradual rise in absorption coefficient towards shorter wavelengths. CVD synthetic round brilliants have generally been produced from homoepitaxial CVD material with an orientation such that the table of the polished stone is parallel to the interface with the diamond substrate on which CVD material was deposited. After substrate removal and polishing of the top and bottom faces of the resulting slab, absorbance/transmittance spectra have been collected and saturation values determined in the way described above. On polishing round brilliants with the depth limited by the thickness of such slabs (a 'depth-limited round brilliant'), an approximately linear relationship has been found between the modelled saturation for the parallel-sided slab and the numerical colour grade of the resulting finished stone, derived from GIA grades judged by a trained diamond grader using the following transformation: D=0, E=1, F=2, G=3, H=4 etc. For moderate to weak saturations, the empirical relationship between numerical colour grade of brown/brownish depth-limited CVD round brilliants and the saturation ($C^*$) modelled from the absorbance/transmittance spectrum of the slab has been found to obey the following approximate relationship:

Round brilliant numerical colour grade=$2\times C^*$.

The observed linearity is supported by the following argument. Colour modelling work has indicated that, for material with given absorption properties, for low to moderate saturations, there is an approximately linear relationship between the path length and $C^*$ values derived from absorbance/transmittance spectra using the routine outlined above. With given viewing and lighting conditions, the average path length for light reaching a viewer's eye from a round brilliant should be proportional to the linear dimensions of the stone. It follows from that there should be an approximately linear relationship between the saturation for a parallel-sided slab and the saturation for a depth-limited round brilliant produced from the slab. Previous work has suggested that there is an approximately linear relationship between the colour grade of a polished stone and its saturation. Taken together, this suggests that there should be an approximately linear relationship between the colour grade of a depth limited round brilliant and the saturation derived from the absorbance/transmittance spectrum of the parallel-sided slab from which it was polished.

From the discussion above it should be clear that where a relatively thin plate is produced, it is possible to predict, from absorbance/transmittance spectra measured for the plate, what colour a round brilliant would be if it were polished from a thicker slab of uniform material with the same absorption coefficient spectrum. In order to do this, the reflection loss must first be subtracted from the measured absorbance spectrum. The absorbance is then scaled to allow for a different path length and then the reflection loss is added back on. The absorbance spectrum can then be converted to a transmittance spectrum which is used to derive the CIELAB coordinates for the new thickness (for example, approximately 3.2 mm for a 0.5 ct round brilliant or 3.8 mm for a 1 ct round brilliant). When subtracting the reflection loss, it is important to take account of the spectral dependence of the reflection coefficient. This can be derived from the wavelength dependence of the refractive index of diamond given by F. Peter in Z. Phys. 15, 358-368 (1923). Using this and standard formulae for the dependence of reflection loss for a parallel-sided plate on the refractive index, the effect of reflection losses on the apparent absorbance can be calculated as a function of wavelength and subtracted from measured spectra to allow absorption coefficient spectra to be calculated more accurately.

The CVD diamond material of the invention described above will also preferably have one, more preferably two, more preferably three, more preferably four, and most preferably all of the following characteristics (1), (2), (3), (4), (5) observable in the majority volume of the layer, where the majority volume comprises at least 50%, preferably at least 55%, preferably at least 60%, preferably at least 70%, preferably at least 80%, preferably at least 90% and most preferably at least 95% of the whole volume of the layer:

1) a charge collection distance of less than 150 μm, preferably less than 100 μm, more preferably less than 50 μm, even more preferably less than 20 μm, even more preferably less than 10 μm, and most preferably less than 5 μm, all charge collection distances being measured at an applied field of 1 V/μm and at 300 K. Alternatively, a charge collection distance of greater than 100 μm, preferably greater than 150 μm, preferably greater than 200 μm, preferably greater than 300 μm, preferably greater than 500 μm, preferably greater than 1000 μm. (Although most applications benefit from a high charge collection distance, some applications requiring very high speed detectors benefit from low charge collection distances, particularly in combination with the high crystal quality obtainable using a preferred method of the invention);

2) a level of at least one impurity (excluding hydrogen) greater than 0.05 ppm, more preferably greater than 0.1 ppm, more preferably greater than 0.2 ppm, more preferably greater than 0.5 ppm, more preferably greater than 1 ppm, more preferably greater than 2 ppm, even more preferably greater than 5 ppm, and most preferably greater than 10 ppm. (Impurity concentrations can for example be measured by secondary ion mass spectroscopy (SIMS), glow discharge mass spectroscopy (GDMS) or combustion mass spectroscopy (CMS), electron paramagnetic resonance (EPR) and IR (infrared) absorption. In addition the uncompensated single substitutional nitrogen concentration can be determined from the peak of the absorption feature at 270 nm after baseline subtraction (calibrated against standard values obtained from samples destructively analysed by combustion analysis));

3) a total impurity concentration (excluding hydrogen) of greater than 0.2 ppm, more preferably greater than 0.5 ppm, even more preferably greater than 1 ppm, even more preferably greater than 2 ppm, even more preferably greater than 5 ppm, even more preferably greater than 10 ppm, and most preferably greater than 20 ppm. (Impurity concentrations may be measured as above);

4.1) weak free exciton luminescence in the cathodoluminescence spectrum measured at 77 K, with the integrated intensity of the free exciton luminescence preferably not exceeding 0.5, more preferably not exceeding 0.2, even more preferably not exceeding 0.1, and most preferably not exceeding 0.05 of the integrated free exciton luminescence intensity for a homoepitaxial CVD diamond sample grown under high purity conditions, for example those revealed in WO 01/96634. Alternatively, a strong free exciton luminescence in the cathodoluminescence spectrum measured at 77 K, with the integrated intensity of the free exciton luminescence preferably exceeding 0.5, preferably exceeding 0.6, preferably exceeding 0.7, preferably exceeding 0.8, preferably exceeding 0.9 of the integrated free exciton luminescence intensity for a homoepitaxial CVD diamond sample grown under high purity conditions; or 4.2) the strength of free exciton emission excited by 193 nm ArF excimer laser at room temperature is such that the quantum yield for free exciton emission is less than $10^{-4}$, more preferably less than $10^{-5}$, and more preferably less than $10^{-6}$; Alternatively, the free exciton emission is greater than $10^{-6}$, preferably greater than $10^{-5}$, preferably greater than $10^{-4}$. Free exciton emission can also be excited by above-bandgap radiation, for example by 193 nm radiation from an ArF excimer laser. The presence of strong free exciton emission in the photoluminescence spectrum excited in this way indicates the substantial absence of dislocations and impurities;

5) in EPR, a spin density which at g=2.0028 exceeds $1\times10^{16}$ atoms cm$^{-3}$, more preferably exceeds $2\times10^{16}$ atoms cm$^{-3}$, more preferably exceeds $5\times10^{16}$ atoms cm$^{-3}$, more preferably exceeds $1\times10^{17}$ atoms cm$^{-3}$, more preferably exceeds $2\times10^{17}$ atoms cm$^{-3}$, and most preferably exceeds $5\times10^{17}$ atoms cm$^{-3}$. Alternatively, the spin density is preferably less than $5\times10^{17}$ atoms cm$^{-3}$, preferably less than $2\times10^{17}$ atoms cm$^{-3}$, preferably less than $1\times10^{17}$ atoms cm$^{-3}$, preferably less than $5\times10^{16}$ atoms cm$^{-3}$, preferably less than $2\times10^{16}$ atoms cm$^{-3}$, preferably less than $1\times10^{16}$ atoms cm$^{-3}$. (In single crystal diamond this line is related to lattice defect concentrations and is typically large in poor quality homoepitaxial diamond but small in high colour CVD diamond formed using a high purity growth process).

Accordingly, this aspect of the invention provides a method of producing a CVD diamond layer having high colour comprising:

(i) providing a substrate;
(ii) providing a CVD synthesis atmosphere in which there exists a first gas comprising a first impurity atom type which has a detrimental effect on the colour of the produced diamond layer; and
(iii) adding into the synthesis atmosphere a second gas comprising a second impurity atom type, wherein the first and second impurity atom types are different; the type and quantity of the second impurity atom type is selected to reduce the detrimental effect on the colour caused by the first impurity atom type so as to produce a diamond layer having high colour; and the first and second impurity atom types are independently nitrogen or atoms which are solid in the elemental state.

In the method of this aspect of the invention, the first impurity atom type is nitrogen and the second impurity atom type is selected from silicon or boron. In this way, the addition of a gaseous source comprising silicon or boron impurity atom types counters the detrimental effect on colour of diamond that nitrogen would otherwise have.

Alternatively, the first impurity atom type is silicon or boron and the second impurity atom type is nitrogen. In this way, the addition of a gaseous source comprising nitrogen impurity atoms counters the detrimental effect on colour of diamond that either silicon or boron would have.

Where the first or second impurity atom type is nitrogen, the first or second gas may be any gaseous species which contains nitrogen including $N_2$, $NH_3$ (ammonia), $N_2H_4$ (hydrazine) and HCN (hydrogen cyanide). Preferably, the first or second gas is $N_2$, $NH_3$, or $N_2H_4$. Preferably, the first or second gas is $N_2$ or $NH_3$, preferably the first or second gas is $N_2$. The nitrogen present in the synthesis atmosphere is calculated as parts per million (ppm) or parts per billion (ppb) of molecular nitrogen (ie $N_2$) as a molecular fraction of the total gas volume. Thus 100 ppb of nitrogen added as molecular nitrogen ($N_2$) is equivalent to 200 ppb of atoms of nitrogen or 200 ppb of ammonia ($NH_3$).

For impurity additions other than nitrogen, the gas phase concentration in ppm or ppb refers to the concentration in synthesis atmosphere of the impurity added as the preferred gaseous species.

Where the first or second impurity atom type is boron, the first or second gas is preferably $B_2H_6$, BCl or $BH_3$. Preferably, the first or second gas is $B_2H_6$.

Where the first or second impurity atom type is silicon, the first or second gas is preferably $SiH_4$, or $Si_2H_6$. Preferably, the first or second gas is $SiH_4$.

For silicon and boron, if gaseous species other than the preferred species (ie $B_2H_6$, $SiH_4$) are used to add the impurity atom type to the synthesis environment, the number of atoms of the impurity atom type in the molecular species added must be accounted for in determining the concentration of that species in the synthesis environment.

The impurity atom types are added to the synthesis atmosphere as gases. Although it is possible, with the exception of nitrogen, to add all the impurity atom types as single element solids, it is extremely difficult, if not impossible, to accurately and reproducibly control the rate at which such additions are made. For example, additions of boron have been made by exposing solid boron to the synthesis atmosphere; the same applies to silicon where solid sources have been used. However, gaseous sources of the impurity atom types are used in the method of the present invention because the gaseous source of an impurity atom type may be prepared in a highly pure form, diluted gravimetrically with a carrier gas and then analysed post-manufacture to accurately determine the exact concentration. Given the gas concentration, precise and reproducible additions can be added using gas metering devices such as mass-flow controllers.

The incorporation of an impurity atom type from the synthesis atmosphere into the solid diamond is highly dependent upon the exact details of the synthesis process. Such matters have been well detailed in the prior art and are well known to those skilled in the art. Parameters that influence the level of incorporation include the nature of the molecular species used to provide the impurity atom, the temperature of the synthesis atmosphere, the pressure of the synthesis atmosphere, the temperature of the surface of the substrate, the crystallographic nature of the surface and the gas flow conditions with the synthesis system.

Where the first or second gas source comprises nitrogen, the concentration of the gas comprising nitrogen in the synthesis atmosphere may be greater than 300 ppb, greater than 500 ppb, greater than 600 ppb, greater than 1 ppm, greater than 2 ppm, greater than 3 ppm, greater than 5 ppm, greater than 10 ppm, greater than 20 ppm, greater than 30 ppm. The concentration of the gas comprising nitrogen may be in the range from 300 ppb to 30 ppm, 500 ppb to 20 ppm, 600 ppb to 10 ppm, 1 ppm to 5 ppm, or 2 ppm to 3 ppm.

When the first or second gas source comprises boron, the concentration of the gas comprising boron in the synthesis atmosphere may be greater than 0.5 ppb, greater than 1.0 ppb, greater than 2 ppb, greater than 5 ppb, greater than 10 ppb, greater than 20 ppb, greater than 50 ppb, greater than 0.1 ppm, greater than 0.2 ppm. The concentration of the gas comprising boron in the synthesis atmosphere may be from 0.5 ppb to 0.2 ppm, from 1.0 ppb to 0.1 ppm, from 2 ppb to 50 ppb, from 10 ppb to 20 ppb. The concentration of the gas comprising boron in the synthesis atmosphere may be less than 1.4 ppm, less than 0.1 ppm, or less than 0.05 ppm.

When the first or second gas source comprises silicon, the concentration of the gas comprising silicon in the synthesis atmosphere may be greater than 0.01 ppm, greater than 0.03 ppm, greater than 0.1 ppm, greater than 0.2 ppm, greater than 0.5 ppm, greater than 1 ppm, greater than 2 ppm, greater than 5 ppm, greater than 10 ppm, greater than 20 ppm. The concentration of the gas source comprising silicon in the synthesis atmosphere may be from 0.01 ppm to 20 ppm, 0.03 ppm to 10 ppm, 0.1 ppm to 5 ppm, 0.2 ppm to 2 ppm, or 0.5 ppm to 1 ppm.

Secondary Ion Mass Spectrometry (SIMS) measurements have shown that, for a given concentration of silicon in the growth gases, in the absence of nitrogen, the concentration of silicon in the grown diamond is higher for {111}, {110} or {113} growth than for {100} growth. For growth on a substrate with {100} orientation, although gaseous silicon impurity tends to increase the threshold nitrogen concentration for surface roughening, addition of high concentrations of nitrogen to the growth gases will eventually cause the surface to roughen and the efficiency of silicon incorporation to increase dramatically. When this happens SIMS measurements indicate that the concentration of silicon in the diamond can significantly exceed that of nitrogen and in such cases the diamond will generally show a grey colour resulting from high concentrations of the defect responsible for a spectroscopic feature at 945 nm in the absorption spectrum (currently believed to be a neutral silicon-vacancy defect). In general, as the concentration of gaseous silicon is increased the grey colour is perceived earlier for material grown on {111}, {110} or {113} than for {100} growth.

When silicon is the first or the second impurity atom type, the concentration of silicon in the majority volume of the diamond layer produced may be less than or equal to $2\times10^{18}$ atoms/cm$^3$. The concentration of silicon in the majority volume of the diamond layer may be in the range from $10^{14}$ atoms/cm$^3$ to $2\times10^{18}$ atoms/cm$^3$, from $3\times10^{14}$ atoms/cm$^3$ to $10^{17}$ atoms/cm$^3$, from $10^{15}$ atoms/cm$^3$ to $3\times10^{16}$ atoms/cm$^3$, or from $3\times10^{15}$ atoms/cm$^3$ to $10^{16}$ atoms/cm$^3$. The concentration of silicon in the majority volume of the diamond layer may be greater than $10^{13}$ atoms/cm$^3$, greater than $10^{14}$ atoms/cm$^3$, greater than $3\times10^{14}$ atoms/cm$^3$, greater than $10^{15}$ atoms/cm$^3$, greater than $3\times10^{15}$ atoms/cm$^3$, greater than $10^{16}$, greater than $3\times10^{16}$ atoms/cm$^3$, greater than $10^{17}$ atoms/cm$^3$.

When nitrogen is the first or the second impurity atom type, the concentration of nitrogen in the majority volume of the diamond layer may be from $1\times10^{14}$ atoms/cm$^3$ to $5\times10^{17}$ atoms/cm$^3$, from $5\times10^{15}$ atoms/cm$^3$ to $2\times10^{17}$ atoms/cm$^3$, or from $1\times10^{16}$ to $5\times10^{16}$ atoms/cm$^3$. The concentration of nitrogen in the majority volume of the diamond layer may be greater than $2\times10^{15}$ atoms/cm$^3$, greater than $5\times10^{15}$ atoms/cm$^3$, greater than $10^{16}$ atoms/cm$^3$, greater than $3\times10^{16}$ atoms/cm$^3$, greater than $10^{17}$ atoms/cm$^3$.

When boron is the first or the second impurity atom type, the concentration of boron in the majority volume of the diamond layer may be from $10^{14}$ atoms/cm$^3$ to $10^{18}$ atoms/cm$^3$, from $3\times10^{14}$ atoms/cm$^3$ to $10^{17}$ atoms/cm$^3$, from $10^{15}$ atoms/cm$^3$ to $10^{16}$ atoms/cm$^3$, or from $3\times10^{15}$ atoms/cm$^3$ to $10^{16}$ atoms/cm$^3$. The concentration of boron in the majority volume of the diamond layer may be greater than $10^{13}$ atoms/cm$^3$, greater than $10^{14}$ atoms/cm$^3$, greater than $3\times10^{14}$ atoms/ cm³, greater than 10¹⁵ atoms/cm³, greater than 3×10¹⁵ atoms/cm³, greater than 10¹⁶, greater than 3×10¹⁶ atoms/cm³, greater than 10¹⁷ atoms/cm³.

Typically, the concentration of the first and second impurity atom types, as well as the concentration of any other impurities in the diamond layer, may be measured using secondary ion mass spectroscopy (SIMS). Detection limits for impurity atoms vary depending on the SIMS conditions used. However, SIMS detection limits for the first and second impurity atom types of the present invention typically lie in the range 10¹⁴ to 10¹⁷ atoms/cm³. In particular, for elements such as boron and silicon the detection limits are typically about 10¹⁵ atoms/cm³, whereas for nitrogen they are typically about 10¹⁶ atoms/cm³. Other techniques, such as combustion analysis, absorption, EPR, can give higher sensitivity in some instances.

When the first and second impurity atom types are nitrogen and silicon, respectively or vice versa, the concentration of nitrogen in the majority volume of the diamond layer is preferably less than or equal to 2×10¹⁷ atoms/cm³ and the concentration of silicon in the majority volume of the diamond layer is preferably less than or equal to 2×10¹⁸ atoms/cm³. In this way, high colour in the synthesised diamond may be more readily achieved.

When the first and second impurity atom types are nitrogen and silicon, respectively or vice versa, the ratio of the concentration of nitrogen to silicon in the majority volume of the diamond layer produced may be 1:20 to 20:1, 1:10 to 10:1, 1:9 to 9:1, 1:8 to 8:1, 1:7 to 7:1, 1:6 to 6:1, 1:5 to 5:1, 1:4 to 4:1, 1:3 to 3:1, 1:2 to 2:1, preferably 1:1.

When the first and second impurity atom types are nitrogen and silicon, respectively or vice versa, the gas comprising nitrogen may be present in the synthesis atmosphere at a concentration of greater than 100 ppb, greater than 200 ppb, greater than 300 ppb and the gas comprising silicon may be present in the synthesis atmosphere at a concentration of greater than 10 ppb.

When the first and second impurity atom types are nitrogen and boron, respectively or vice versa, the ratio of the concentration of nitrogen to the concentration of boron in the majority volume of the diamond layer may be in the range from 1:2 to 2:1, from 2:3 to 3:2, from 3:4 to 4:3, from 4:5 to 6:5, from 9:10 to 11:10, preferably the ratio is 1:1. Preferably, the ratio of nitrogen to boron is greater than 1:5.

When single substitutional boron and nitrogen are present in diamond in approximately the same concentrations, colourless material can result because the nitrogen defects donate electrons to the boron defects and the resultant ionised defects do not give rise to significant optical absorption. Thus, not only does boron have a beneficial effect on growth in the presence of nitrogen because of the fact that it suppresses roughening of the growth surface, boron and nitrogen incorporated into the diamond can compensate each other to give material with low optical absorption. By "low optical absorption" is meant that a material absorbs little in the visible spectrum. In particular, a diamond layer has low optical absorption if at least 50% of the diamond layer (the "majority volume") has an absorption coefficient which at all wavelengths between 300 and 1000 nm is less than 20 cm−1. A diamond layer having low optical absorption may have an absorption coefficient at 270 nm of less than 2 cm−1, and/or an absorption coefficient at 350 nm which is less than 1.5 cm−1, and/or an absorption coefficient at 520 nm of less than 1 cm−1. All absorption coefficients being measured at room temperature.

When the first and second impurity atom types are nitrogen and boron, respectively or vice versa, the gas comprising nitrogen may be present in the synthesis atmosphere at a concentration of greater than 100 ppb, preferably greater than 200 ppb, preferably greater than 300 ppb and the gas comprising boron may be present in the synthesis atmosphere at a concentration of greater than 0.5 ppb.

Preferably, the CVD diamond layer produced by any of the above methods has an increased normalized free exciton intensity compared to a method where the second gas comprising a second impurity type atom is not added. Preferably, there is a strong free exciton luminescence in the cathodoluminescence spectrum measured at 77 K, with the integrated intensity of the free exciton luminescence exceeding 0.3, preferably exceeding 0.4, preferably exceeding 0.5, preferably exceeding 0.6, preferably exceeding 0.7, preferably exceeding 0.8, preferably exceeding 0.9 of the integrated free exciton luminescence intensity for a homoepitaxial CVD diamond sample grown under high purity conditions.

The CVD diamond layer produced by any of the above methods may have an increase in carrier mobility, carrier lifetime, charge collection distance and/or charge collection efficiency compared to a method where the second gas comprising a second impurity type atom is not added. The charge collection distance of the produced diamond layer may be greater than 100 µm, greater than 150 µm, greater than 200 µm, greater than 300 µm, greater than 500 µm, or greater than 1000 µm when measured with an applied electric field of 1.0 V/µm. A method of measuring charge collection distance in diamond is described in WO 01/96633, for example. The carrier mobility of the produced diamond layer may be 1200 $cm^2V^{-1}s^{-1}$, preferably 1500 $cm^2V^{-1}s^{-1}$, preferably 1800 $cm^2V^{-1}s^{-1}$, preferably 2200 $cm^2V^{-1}s^{-1}$, preferably 2500 $cm^2V^{-1}s^{-1}$. Preferably the charge collection efficiency of the produced diamond layer is 30%, preferably 50%, preferably 70%, preferably 80%, preferably 90%, preferably 95%, preferably 97%. The carrier lifetime of the produced diamond layer may be greater than 1 ns, greater than 3 ns, greater than 10 ns, greater than 30 ns, or greater than 100 ns.

Nitrogen as an impurity is known to affect the electronic properties of single crystal CVD diamond, in particular the charge collection distance, carrier mobilities and carrier lifetimes. In the absence of nitrogen the electronic properties of single crystal CVD diamond can be very good (see for example Isberg et al, Science, volume 297, pages 1970-1672, where methods of measurement and results are disclosed). As nitrogen is progressively added to the synthesis atmosphere, the electronic properties of the resultant material are progressively degraded.

Previous experimentation has shown that the intensity of the free exciton emission at 235 nm measured at 77 K is a good proxy for the electronic properties (WO 01/96633). Using this proxy, we are able to propose the following expected behaviour for combined nitrogen and silicon additions to diamond.

If silicon is added with nitrogen, the deleterious effects of the nitrogen on electronic properties are ameliorated, with the amount of amelioration increasing, but the rate of amelioration decreasing, as the concentration of silicon added is increased, until at some fraction of the concentration of nitrogen being incorporated, adding further silicon ceases to have a further ameliorating effect at which point the properties start to degrade once more.

Therefore there will be an optimum amount of silicon that can be added for a given amount of nitrogen in the solid, but the optimum value is dependent on the exact property that is being considered and the amount of nitrogen incorporated. The inventors expect that the optimum value of silicon addition with regard to its effect on the electronic properties is generally somewhat less than the silicon addition at which the colour of the diamond starts degrading (ie the greyness caused by silicon begins to become apparent).

Thus, it is possible for a series of diamonds containing a given concentration of nitrogen and different concentrations of silicon (ranging from just above zero to well beyond the optimum) to have electronic properties that can be slightly better, much better, the same or worse than an otherwise identical diamond containing no silicon.

It is equally possible for a diamond of the invention to have poor electronic properties (i.e. the silicon concentration is well beyond the optimum), but good optical properties as the greyness caused by the silicon has not yet become sufficient to be perceived as a colour change or caused a significant change to the optical absorption spectrum.

A similar situation pertains when boron is added to a synthesis atmosphere containing diamond. Initially the boron ameliorates the deleterious effects of the nitrogen and the electronic properties improve. As the amount of boron added is increased, at some point, probably when the amounts of nitrogen and boron are approximately equal, the improvement in the electronic properties will stop and then, with higher rates of addition, begin to decline. This behaviour can be understood with a classical semiconductor compensation model. The rate of improvement and subsequent decline in the properties is expected to be much sharper than for the case of nitrogen and silicon.

The first gas comprising a first impurity atom type may be deliberately added to the synthesis atmosphere. Alternatively, the first gas may be present in the synthesis atmosphere unintentionally, including being present in the synthesis atmosphere because it has not been removed even though it affects properties of the diamond layer produced. Preferably, the synthesis atmosphere comprises a concentration of the first gas, which has not been added deliberately, of greater than 0.1 ppb, preferably greater than 1 ppb, preferably greater than 10 ppb. An example of such a situation is where nitrogen remains in the synthesis atmosphere in the form of $NH_3$, air or $N_2H_4$, for example, and it is considered too expensive or time consuming to adopt extra measures to remove such gases from the synthesis atmosphere. Preferably, the synthesis atmosphere comprises a concentration of the gas comprising nitrogen, which has not been added deliberately, of greater than 300 ppb.

The first gas may be present in the synthesis atmosphere in a manner which is controlled or in a manner which is not controlled. Where the first gas is present in a manner which is not controlled, the first impurity type atom may be present as an impurity of one of the gases required for diamond synthesis. Alternatively, where the first gas is added in a manner which is controlled, this may be such that there is only an upper limit of the amount of gas that may be introduced into the synthesis atmosphere. Alternatively, the presence of the first gas may be controlled such that the concentration of the first gas is stable to better than 20%, preferably better than 10%, preferably better than 3%.

Preferably, the diamond layer is greater than 0.1 mm thickness, preferably greater than 0.5 mm thickness, preferably greater than 1 mm thickness, preferably greater than 2 mm thickness.

In the method of the first embodiment:
(1) the substrate may be a diamond substrate having a surface which is substantially free of crystal defects such that a revealing plasma etch would reveal a density of surface etch features related to defects below $5 \times 10^3/mm^2$;
(2) the duration of the synthesis of the diamond layer may be at least 50 hours; and/or
(3) the substrate may comprises multiple separated single crystal diamond substrates.

The method may comprise at least one, preferably at least two, preferably all three of features (1) to (3). The method may comprise feature (1), feature (2), feature (3), features (1) and (2), features (1) and (3), features (2) and (3), or features (1), (2) and (3).

By using a diamond substrate having a surface which is substantially free of crystal defects, the quality of the grown diamond can be greatly improved. In particular, fewer defects will be present in the grown diamond layer.

The duration of the synthesis of the diamond layer may be at least 50 hours, at least 75 hours, at least 100 hours, at least 150 hours.

In a further embodiment of the present invention there is provided a method of producing a CVD single crystal diamond layer, comprising:
(i) providing a substrate;
(ii) providing a CVD synthesis atmosphere in which there exists a concentration of nitrogen which is not deliberately added of greater than 300 ppb; and
(iii) adding into the synthesis atmosphere a second gas comprising a second impurity atom type other than nitrogen,
wherein the second impurity atom type is added in a controlled manner in an amount that reduces the detrimental effect on the colour caused by the nitrogen so as to produce a diamond layer having high colour; and the second impurity atom type is solid in the elemental state.

In this way, a CVD diamond layer having high colour may be produced even though the synthesis atmosphere comprises an amount of nitrogen that, in the absence of the second gas, would have an undesirable affect on the colour of the produced diamond such that the produced diamond would not have high colour. The method of the second embodiment enables high colour CVD diamond to be synthesised without having to take any additional steps to remove the undesirable nitrogen from the synthesis atmosphere. The term "high colour" is as defined previously. Preferably, the diamond layer has very high colour, as defined previously.

In a still further embodiment of the present invention there is provided a method of producing a CVD single crystal diamond layer comprising the steps of:
(i) providing a substrate; and
(ii) adding into a CVD synthesis atmosphere a gaseous source comprising silicon.

In this way a silicon doped diamond layer is provided.
In the method of this embodiment of the invention:
(1) the layer may be grown to greater than 0.1 mm thickness;
(2) the substrate may be a diamond substrate having a surface which is substantially free of crystal defects such that a revealing plasma etch would reveal a density of surface etch features related to defects below $5 \times 10^3/mm^2$;
(3) the duration of the synthesis of the single crystal diamond layer may be at least 50 hours; and/or
(4) the substrate may comprise multiple separated single crystal diamond substrates.

The method may comprise at least one, at least two, at least three, preferably all four of features (1) to (4). The method may comprise feature (1), feature (2), feature (3), feature (4), features (1) and (2), features (1) and (3), features (1) and (4), features (2) and (3), features (2) and (4), features (3) and (4), features (1), (2) and (3), features (1), (3) and (4), features (2), (3) and (4), The layer may be grown to a thickness of greater than 0.5 mm, greater than 1 mm, greater than 2 mm.

The duration of the synthesis of the diamond layer may be at least 50 hours, at least 75 hours, at least 100 hours, at least 150 hours.

The preferred features of the first embodiment of the method of the present invention outlined above apply equally to the third embodiment of the method of the present invention as long as the first or second source gases comprise silicon.

The concentration of silicon in the majority volume of the diamond layer produced by the third embodiment of the method of the present invention may be up to $2\times10^{18}$ atoms/cm$^3$, from $10^{14}$ atoms/cm$^3$ to $2\times10^{18}$ atoms/cm$^3$, from $3\times10^{14}$ atoms/cm$^3$ to $10^{17}$ atoms/cm$^3$, from $10^{15}$ atoms/cm$^3$ to $3\times10^{16}$ atoms/cm$^3$, from $3\times10^{15}$ atoms/cm$^3$ to $10^{16}$ atoms/cm$^3$, from $2\times10^{17}$ to $2\times10^{18}$ atoms/cm$^3$.

In the third embodiment of the method of the present invention, the addition of silicon may reduce an adverse effect on a property of the produced diamond layer caused by the presence of an impurity atom type. Preferably, the impurity atom type is nitrogen. The impurity atom type may be introduced into the synthesis atmosphere as a gas in a controlled or uncontrolled manner, as described previously. Preferably, the impurity atom type is nitrogen and the synthesis atmosphere comprises a concentration of nitrogen which is not deliberately added of greater than 300 ppb.

The property may be colour and adding silicon may produce a CVD diamond layer having high colour, wherein "high colour" is as defined above. Preferably, the CVD diamond layer has very high colour, wherein "very high colour" is as defined above.

The property may be free exciton emission of the diamond layer and adding silicon may produce a CVD diamond layer with an increased normalized free exciton intensity compared to a method where silicon is not added. There may be a strong free exciton luminescence in the cathodoluminescence spectrum measured at 77 K, with the integrated intensity of the free exciton luminescence exceeding 0.3, preferably exceeding 0.4, preferably exceeding 0.5, preferably exceeding 0.6, preferably exceeding 0.7, preferably exceeding 0.8, preferably exceeding 0.9 of the integrated free exciton luminescence intensity for a homoepitaxial CVD diamond sample grown under high purity conditions.

The property may be at least one of: carrier mobility; carrier lifetime; and charge collection distance and adding silicon may produce a CVD diamond layer with an increase in carrier mobility, carrier lifetime and/or charge collection distance compared to a method where silicon is not added. The charge collection distance of the produced diamond layer may be greater than 100 µm, greater than 150 µm, greater than 200 µm, greater than 300 µm, greater than 500 µm, greater than 1000 µm when measured with an applied electric field of 1.0 V/µm. The carrier mobility of the produced diamond layer may be 1200 cm$^2$V$^{-1}$s$^{-1}$, preferably 1500 cm$^2$V$^{-1}$s$^{-1}$, preferably 1800 cm$^2$V$^{-1}$s$^{-1}$, preferably 2200 cm$^2$V$^{-1}$s$^{-1}$, preferably 2500 cm$^2$V$^{-1}$s$^{-1}$. The charge collection efficiency of the produced diamond layer may be 30%, preferably 50%, preferably 70%, preferably 80%, preferably 90%, preferably 95%, preferably 97%. The carrier lifetime of the produced diamond layer may be greater than 1 ns, greater than 3 ns, greater than 10 ns, greater than 30 ns, greater than 100 ns.

In any of the methods described above (that is, for the first, second and third embodiments), when the CVD diamond layer is a single crystal, the majority volume of the diamond layer may have at least one of the following features:

a) an absorption spectrum measured at room temperature such that the colour of a standard 0.5 ct round brilliant would be better than K;

b) an absorption coefficient at 270 nm measured at room temperature which is less than 1.9 cm$^{-1}$;

c) an absorption coefficient at 350 nm measured at room temperature which is less than 0.90 cm$^{-1}$;

d) an absorption at 520 nm of less than 0.30 cm$^{-1}$; or e) an absorption at 700 nm of less than 0.12 cm$^{-1}$.

The majority volume of the diamond layer may comprise at least 55%, at least 60%, preferably at least 70%, preferably at least 80%, preferably at least 90%, preferably at least 95% of the diamond layer.

The single crystal diamond layer may have at least two, at least three, at least four, preferably all five of the features (a) to (e). The diamond layer may have features a) and b); features a) and c); a) and d); a) and e); b) and c); b) and d); b) and e); c) and d); c) and e); d) and e); a), b) and c); a), b) and d); a), b) and e); a), c) and d); a), c) and e); a), d) and e); b), c) and d); b), c) and e); b), d) and e); c), d) and e); a), b), c) and d); a), b), c) and e); a), b), d) and e); a), c), d) and e); b), c), d) and e); or a), b), c), d) and e).

Preferably, for feature a), the diamond layer has an absorption spectrum measured at room temperature such that the colour of a standard 0.5 ct round brilliant would be better than J, preferably better than I; preferably better than H, preferably better than G, preferably better than F, preferably better than E, preferably D.

Preferably, for feature b), the diamond layer has an absorption coefficient at 270 nm measured at room temperature which is less than 1.0 cm$^{-1}$; preferably less than 0.4 cm$^{-1}$.

Preferably, for feature c), the diamond layer has an absorption coefficient at 350 nm measured at room temperature which is less than 0.5 cm$^{-1}$; preferably less than 0.2 cm$^{-1}$.

Preferably, for feature d), the diamond layer has an absorption coefficient at 520 nm measured at room temperature which is less than 0.14 cm$^{-1}$; preferably less than 0.06 cm$^{-1}$.

Preferably, for feature e), the diamond layer has an absorption coefficient at 700 nm measured at room temperature which is less than 0.06 cm$^{-1}$; preferably less than 0.03 cm$^{-1}$.

In any of the methods outlined above, the diamond layer may be formed into a gemstone having three orthogonal dimensions greater than 2 mm, where at least one axis lies either along the <100> crystal direction or along the principle symmetry axis of the gemstone. The invention described above further provides a CVD diamond produced from a single crystal CVD layer described above polished in the form of a gemstone characterised by having three orthogonal dimensions greater than 2 mm, and preferably greater than 2.5 mm, and more preferably greater than 3.0 mm, where at least one axis lies either along the <100> crystal direction or along the principle symmetry axis of the stone. The diamond will be of high quality and may have one or more of the characteristics identified above.

According to the present invention there is provided a CVD single crystal diamond layer produced by any one of the methods disclosed above. The majority volume of the diamond layer may be formed from a single growth sector.

In view of the reduction in defects in the diamond layer produced by any of the methods of the invention described above because of a reduction in surface roughening during growth, the diamond layer may also have improved mechanical and chemical properties, including wear resistance and thermal stability. The wear properties of a material are the result of very complex interactions between a wide range of the macroscopic properties of the material including, for example, its hardness, strength, stiffness, toughness, grain size, thermal conductivity, grain orientation etc. It is well known in the art that diamond has exceptional wear properties and these are widely exploited: it is used as a tool material in a wide range of applications including cutting tools, rock drill, wire dies and many others.

The performance of a diamond tool in a particular application is strongly influenced by its microstructure and extended defect densities. A particular example is a wire drawing die as disclosed in WO2004/074557, where reducing the strain by controlling extended defect density is shown to be particularly effect at improving the wear properties. Since the methods of the invention can provide single crystal diamond material with reduced point and extended defect densities compared with diamond prepared using generally the same method without the added second impurity, it can be reasonably expected that the material of the invention will have improved wear properties.

According to the present invention there is also provided a CVD single crystal diamond layer comprising an impurity atom type which is silicon, wherein the diamond layer has high colour. The concentration of the silicon in the majority volume of the diamond layer is preferably from $10^{14}$ to $2 \times 10^{18}$ atoms/cm$^3$. For example, the concentration of silicon in the majority volume of the diamond layer may be greater than $10^{13}$ atoms/cm$^3$, greater than $10^{14}$ atoms/cm$^3$, greater than $3 \times 10^{14}$ atoms/cm$^3$, greater than $10^{15}$ atoms/cm$^3$, greater than $3 \times 10^{15}$ atoms/cm$^3$, greater than $10^{16}$, greater than $3 \times 10^{16}$ atoms/cm$^3$, greater than $10^{17}$ atoms/cm$^3$. Preferably, the majority volume of the CVD single crystal diamond layer comprises from $2 \times 10^{17}$ to $2 \times 10^{18}$ atoms/cm$^3$ of silicon.

Figure 21:
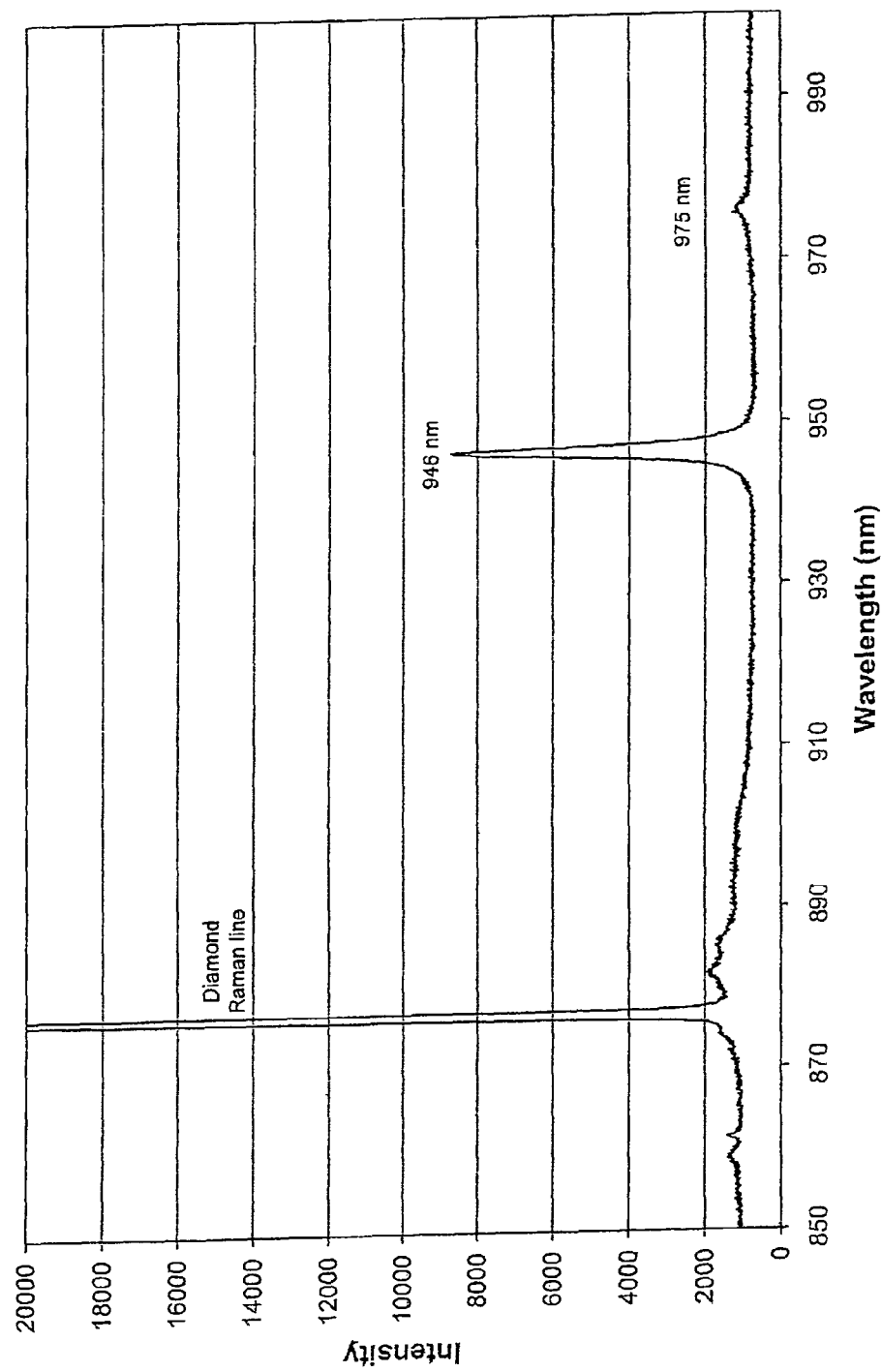

Photoluminescence spectroscopy offers a sensitive method for detecting the presence of silicon-related defects in diamond. A silicon-related photoluminescence line at 737 nm can generally be detected with 633 nm HeNe laser excitation at 77 K. Research by the present inventors has indicated that the photoluminescence spectrum of silicon-doped diamond, excited at 77 K with 785 nm laser radiation, also often shows a line at 946 nm. This is generally accompanied by another line at 975 nm. These two photoluminescence lines have not been reported before. FIG. 21 shows a typical photoluminescence spectrum for silicon-doped diamond excited with 785 nm laser radiation.

The present inventors have also investigated silicon-doped samples using EPR (Electron Paramagnetic Resonance). This offers a sensitive method for detecting and characterising silicon-related defects. The current detection limits allow defect concentrations as low as one part per billion to be measured. A neutral silicon-vacancy defect has recently been detected and characterised using EPR, and work is proceeding to identify other silicon related defects in the same way. Current results suggest that the 946 nm photoluminescence line may be an optical signature of the neutral silicon vacancy defect identified using EPR.

Preferably, the CVD diamond layer has high colour, wherein "high colour" is as defined above.

The CVD diamond layer produced by any of the methods of the present invention may have a birefringence of less than $1 \times 10^{-3}$, preferably less than $1 \times 10^{-4}$, preferably less than $3 \times 10^{-4}$, preferably less than $1 \times 10^{-5}$ over a volume greater than 0.1 mm$^3$, preferably greater than 0.5 mm$^3$, preferably greater than 1 mm$^3$, preferably greater than 3.4 mm$^3$, preferably greater than 8 mm$^3$, preferably greater than 27 mm$^3$, preferably greater than 64 mm$^3$, preferably greater than 125 mm$^3$, preferably greater than 512 mm$^3$, preferably greater than 1000 mm$^3$. Birefringence may be characterized using, for example, Metripol® apparatus.

For an isotropic medium, such as stress-free diamond, the refractive index is independent of the direction of the polarization of light. If a diamond sample is inhomogeneously stressed, either because of grown-in stress or local defects or because of externally applied pressure, the refractive index is anisotropic. The variation of the refractive index with direction of polarization may be represented by a surface called the optical indicatrix that has the general form of an ellipsoid. The difference between any two ellipsoid axes is the linear birefringence for light directed along the third. This may be expressed as a function involving the refractive index of the unstressed material, the stress and opto-elastic coefficients.

Metripol® (Oxford Cryosystems) gives information on how the refractive index at a given wavelength depends on polarization direction in the plane perpendicular to the viewing direction. An explanation of how the Metripol® works is given by A. M. Glazer et al. in Proc. R. Soc. Lond. A (1996) 452, 2751-2765.

The Metripol® instrument determines the direction of the "slow axis", i.e. the polarization direction in the plane perpendicular to the viewing direction for which the refractive index is a maximum. It also measures |sin δ| where δ is the phase shift given by $$\delta = (2\pi/\lambda)\Delta nL$$

where λ is the wavelength of the light, L is the thickness of the specimen and Δn is the difference between the refractive index for light polarized parallel to the slow and fast axes i.e. the birefringence. Δn L is known as the 'optical retardation'.

For retardation in first order, with L=0.6 mm and λ=589.6 nm, then: when sin δ=1 and Δn L=λ/4, it can be deduced that Δn=2.45×10$^{-4}$. when sin δ=0.5 and Δn L=λ/12, it can be deduced that Δn=0.819×10$^{-4}$.

Metripol® produces three colour-coded images showing the spatial variations of a) the "slow axis", b) |sin δ| and c) the absorbance at the wavelength of operation.

Samples are prepared as optical plates of known thickness and analysed over an area of at least 1.3 mm×1.3 mm, and preferably 2.5 mm×2.5 mm, and more preferably 4 mm×4 mm. Metripol® |sin δ| images are then analysed and the maximum value of |sin δ| in each frame over the whole of the analysis area and use these values to characterise the maximum value of Δn can be calculated of the whole of the area analysed.

The behaviour of sine δ is the property of a particular plate of material, constrained here to plates of useful thickness by application of a minimum thickness. A more fundamental property of the material can be obtained by converting the sine δ information back to a value averaged over the thickness of the sample of the difference between the refractive index for light polarised parallel to the slow and fast axes, $\Delta n_{[average]}$.

Instrument resolution and noise sets a lower limit to the value of |sin δ| and hence the retardation Delta-n.d measurable by Metripol®. This in turn sets a lower limit on the measurable birefringence, although the limit on this parameter depends on the specimen thickness. For illustration, if the lower limit on |sin delta| is 0.03, for light of wavelength 550 nm, this corresponds to a lower limit on the measurable birefringence of Δn=1.05×10$^{-5}$ for a sample of thickness 500 microns, or a lower limit on the measurable birefringence of Δn=7.5×10$^{-7}$ for a sample of thickness 3500 microns.

Birefringence values may be determined in 3 orthogonal directions which effectively enable a volume measurement. This may be particularly important in some applications such as spherical optics etc. The limits defined below are calculated based on measurements and assuming a 3 mm path length.

Preferably, the methods of this invention provide for the fabrication of diamond material such that birefringence measurements in at least one, preferably two, preferably all three orthogonal directions show values of $\Delta n$ such that:

preferably $\Delta n$ is less than $2\times10^{-6}$ over areas greater than $1\times1$ mm, preferably over areas greater than $2\times2$ mm, preferably over areas greater than $4\times4$ mm, preferably over areas greater than $7\times7$ mm, preferably over areas greater than $15\times15$ mm;

preferably $\Delta n$ is less than $5\times10^{-6}$ over areas greater than $1\times1$ mm, preferably over areas greater than $2\times2$ mm, preferably over areas greater than $4\times4$ mm, preferably over areas greater than $7\times7$ mm, preferably over areas greater than $15\times15$ mm;

preferably $\Delta n$ is less than $1\times10^{-5}$ over areas greater than $1\times1$ mm, preferably greater than $2\times2$ mm, preferably greater than $4\times4$ mm, preferably greater than $7\times7$ mm, preferably greater than $15\times15$ mm.

Where birefringence values lie below a given threshold for each of three orthogonal directions of a particular volume of diamond, then for the purposes of this specification that volume is deemed to have a birefringence value below that threshold.

The present invention also provides a CVD diamond layer produced according to any of the methods outlined above for use as an optical element.

The present invention also provides a CVD diamond layer produced according to any of the methods outlined above for use as an electrical or electronic element. The present invention also provides a CVD diamond layer produced according to any of the methods above for use as a cutting tool or wire drawing die or other wear-resistant part.

The present invention also provides a CVD single crystal diamond layer produced according to any of the methods outlined above wherein the diamond layer is in the form of a gemstone.

Preferably, the CVD single crystal diamond has three orthogonal dimensions greater than 2 mm, wherein at least one axis lies along the <100> crystal direction or along the principle symmetry axis of the gemstone. Preferably, the three orthogonal dimensions are greater than 2.5 mm, preferably greater than 3.0 mm, preferably greater than 3.5 mm. Preferably, the CVD single crystal diamond layer is of high clarity, with clarity of at least SI1 on the GIA gem grading scale, as defined above. Preferably, the CVD single crystal diamond layer has clarity of at least VS2, preferably at least VVS2, preferably at least VVS1 on the GIA gem grading scale.

The diamond layer produced by any of the methods of the present invention is preferably of high crystalline quality. In relation to single crystal diamond "high crystalline quality" allows the presence of the impurity atoms and associated point defects but places limits on the presence of dislocation bundles or other extended defects which impact on the use of the material for optical applications, for example by causing excessive scattering, or colour, or reduction in strength or processability below that required for the intended optical application. In relation to polycrystalline diamond, "high crystalline quality" means that the material has a negligible content of non-diamond carbon and other defects in the grain boundaries. Such defects have a significant impact on the usability of the material for optical and other applications and are, therefore, undesirable.

The present invention also provides a use of a sufficient quantity of a gaseous source comprising a second impurity atom type to counter the detrimental effect on colour of diamond of a first impurity atom type in a method of producing a CVD diamond layer having high colour, wherein high colour is as defined above. The preferred features relating to the gaseous sources and the first and second impurity atom types defined in relation to the first, second and third embodiments of the method of the present invention apply equally to this use.

The present invention also provides a use of a gaseous source of silicon for addition to a reaction chamber comprising a substrate and a diamond synthesis atmosphere such that the silicon counters the detrimental effect of a first impurity atom type in a method of CVD diamond production. The preferred features relating to the gaseous sources, silicon and the first impurity atom type defined in relation to the second embodiment of the method of the present invention apply equally to this use.

In all of the methods, diamond layers and uses provided by the present invention, there may exist additional impurities in the diamond layer produced. Preferably, the total concentration of any additional impurities (not including hydrogen) is less than 5 ppm, preferably less than 2 ppm, preferably less than 1 ppm, preferably less than 0.5 ppm, preferably less than 0.2 ppm. The concentration of any single additional impurity (not including hydrogen) in the diamond layer is 2 ppm or less, preferably 1 ppm or less, preferably 0.5 ppm or less, preferably 0.2 ppm or less, preferably 0.1 ppm or less.

The single crystal CVD diamond of the invention is suitable for use in optical applications such as diamond windows, diamond lenses and anvils, and for shaping into a gemstone, and in particular a gemstone of high colour grade.

Applications to which the CVD diamond produced by the methods of the present invention may be put include optical applications, such as infra red transmission windows, and etalons where control of stress and minimisation of birefringence are important, knife blades, electronic components, such as Schottky diodes, and radiation detectors.

The methods of the invention described above provide for production of high colour, low optical absorption single crystal CVD diamond that is suitable for optical and gem applications.

A particular example is the addition of silicon to a CVD diamond synthesis atmosphere containing nitrogen, which has been shown to increase the normalised FE intensity, and is thus anticipated to substantially improve other electronic properties toward the values which have been measured in the absence of nitrogen. Additionally, reduction in defects in the diamond due to reduced surface roughening during growth is anticipated to improve a number of other mechanical and chemical properties, including wear resistance and thermal stability. It is expected that thermal stability is particularly improved under conditions without stabilizing pressure, as might occur during annealing.

It is important for the production of the uniformly high colour single crystal CVD diamond material of this invention described above that growth takes place on a diamond surface which is substantially free of crystal defects. In this context, defects primarily mean dislocations and micro cracks, but also include twin boundaries, point defects, low angle boundaries and any other disruption to the crystal structure. Preferably the substrate is a low birefringence type Ia natural, Ib or IIa high pressure/high temperature synthetic diamond or a CVD synthesised single crystal diamond. Defects can degrade the material in two ways, generating stress, cracking and associated preferred sites for colour defect formation, and adversely affecting the local uptake of impurities. Since dislocation multiplication occurs during the growth of thick layers, the control of dislocations within the substrate and early stages of growth is particularly important.

The defect density is most easily characterised by optical evaluation after using a plasma or chemical etch optimised to reveal the defects (referred to as a revealing plasma etch), using for example a brief plasma etch of the type described below. Two types of defects can be revealed:

1) Those intrinsic to the substrate material quality. In selected natural diamond the density of these defects can be as low as 50/mm$^2$ with more typical values being 10$^2$/mm$^2$, whilst in others it can be 10$^6$/mm$^2$ or greater.
2) Those resulting from polishing, including dislocation structures and microcracks forming chatter tracks (sometimes known as clatter tracks) along polishing lines. The density of these can vary considerably over a sample, with typical values ranging from about 10$^2$/mm$^2$, up to more than 10$^4$/mm$^2$ in poorly polished regions or samples.

The preferred low density of defects is such that the density of surface etch features related to defects, as described above, is below 5×10$^3$/mm$^2$, and more preferably below 10$^2$/mm$^2$.

The defect level at and below the substrate surface on which the CVD growth takes place may thus be minimised by careful preparation of the substrate. Included here under preparation is any process applied to the material from mine recovery (in the case of natural diamond) or synthesis (in the case of synthetic material) as each stage can influence the defect density within the material at the plane which will ultimately form the substrate surface when preparation as a substrate is complete. Particular processing steps may include conventional diamond processes such as mechanical sawing, lapping and polishing (in this application specifically optimised to yield low defect levels), and less conventional techniques such as laser processing or ion implantation and lift off techniques, chemical/mechanical polishing, and both liquid and plasma chemical processing techniques. In addition, the surface R$_Q$ (root mean square deviation of surface profile from flat measured by stylus profilometer, preferably measured over 0.08 mm length) should be minimised, typical values prior to any plasma etch being no more than a few nanometers, i.e. less than 10 nanometers.

One specific method of minimising the surface damage of the substrate, is to include an in situ plasma etch on the surface on which the homoepitaxial diamond growth is to occur. In principle this etch need not be in situ, nor immediately prior to the growth process, but the greatest benefit is achieved if it is in situ, because this avoids any risk of further physical damage or chemical contamination. An in situ etch is also generally most convenient when the growth process is also plasma based. The plasma etch can use similar conditions to the deposition or diamond growing process, but with the absence of any carbon containing source gas and generally at a slightly lower temperature to give better control of the etch rate. For example, it can consist of one or more of:

(i) an oxygen etch using predominantly hydrogen with optionally a small amount of Ar and a required small amount of O$_2$. Typical oxygen etch conditions are pressures of 50-450×10$^2$ Pa, an etching gas containing an oxygen content of 1 to 4 percent, an argon content of 0 to 30 percent and the balance hydrogen, all percentages being by volume, with a substrate temperature 600-1100° C. (more typically 800° C.) and a typical duration of 3-60 minutes.

(ii) a hydrogen etch which is similar to (i) but where the oxygen is absent.

(iii) alternative methods for the etch not solely based on argon, hydrogen and oxygen may be used, for example, those utilising halogens, other inert gases or nitrogen.

Typically the etch consists of an oxygen etch followed by a hydrogen etch and then moves directly into synthesis by the introduction of the carbon source gas. The etch time/temperature is selected to enable remaining surface damage from processing to be removed, and for any surface contaminants to be removed, but without forming a highly roughened surface and without etching extensively along extended defects such as dislocations which intersect the surface and thus cause deep pits. As the etch is aggressive, it is particularly important for this stage that the chamber design and material selection for its components be such that no material is transferred by the plasma into the gas phase or to the substrate surface. The hydrogen etch following the oxygen etch is less specific to crystal defects, rounding off the angularities caused by the oxygen etch which aggressively attacks such defects and providing a smoother, better surface for subsequent growth.

The surface or surfaces of the diamond substrate on which the CVD diamond growth occurs are preferably the {100}, {110}, {113} or {111} surfaces. Due to processing constraints, the actual sample surface orientation can differ from these ideal orientations up to 5°, and in some cases up to 10°, although this is less desirable as it adversely affects reproducibility.

The methods of this invention described above can be further combined with post growth treatment, such as annealing. In this context annealing can occur over a range of temperatures and pressures, from near atmospheric annealing at temperatures as low as 1000° C.-1800° C., and high pressure annealing in the graphite or diamond stable regions at temperatures in the range 1200° C.-3000° C.

The invention will now be described with reference to the following non-limiting examples. In each of these examples, except where explicitly stated otherwise, in order to control nitrogen and thus characterise the utility of the invention, nitrogen was removed from the incoming gas stream by use of purifiers and high purity gas sources, such that without deliberate addition of a nitrogen dopant source the gas stream contained less than 100 ppb N$_2$. Nitrogen was then added back into the process using typically a mixture of 100 ppm N$_2$ in hydrogen, this gas mixture giving good control of nitrogen levels in the process gases, particularly in the range of 0.5-20 ppm. Those skilled in the art will appreciate that use of lower purity gases or poorer vacuum practice can easily result in nitrogen impurity levels in the process, particularly in the range 1-20 ppm or greater, and in such cases the nitrogen would not be a deliberately added impurity, but one present due to poorer control or cost savings.

The invention will now be discussed with reference to the following Figures:

FIG. 1

A graph covering the visible wavelengths in the range 400 to 800 nm and containing three spectra: a) a curve centred about 450 nm (labeled 450F×XEF) is the excitation beam generated by the xenon flash lamp after filtering by an Andover 450 nm filter, b) the rising edge of the band pass region of the OG 550 viewing filter at about 550 nm (labeled OG550), used to remove any of the excitation frequencies from the viewed image, and c) the emission spectrum of the 575 nm PL centre as viewed through the OG550 filter (labeled OG550×575) peaking in the region of 620 nm

FIG. 2

A graph covering the range 200 to 800 nm showing two spectra, a) the curve centred about 228 nm which is the excitation beam generated by the xenon flash lamp after filtering by an Andover 228 nm filter, and b) the emission spectrum of the blue PL/phosphorescence centre which peaks near 500 nm and extends from 400 nm to 700 nm.

FIG. 3

A graph over the range of 200 nm to 700 nm showing the excitation spectra for a) the 575 nm band and b) the 637 nm band, up to the intrinsic diamond band edge (defining the diamond band gap). This data and is taken from Zaitsev A., Optical Properties of Diamond: a data handbook, Springer, 2001 (ISBN 354066582X)

FIG. 4

A graph over the range of 200 nm to 500 nm showing three spectra: a) the curve extending across the whole wavelength range is the emission spectrum of a Hamamatsu xenon flash lamp. The radiation from the xenon flash lamp is dominated by intense visible emission bands in the long wave range 400 nm to 550 nm and very intense short wave ultraviolet emission bands in the range 220 nm to 270 nm, b) the transmission curve for a narrow bandpass filter supplied by LOT Oriel, UK and manufactured by Andover Corporation, USA, type 228 FS 25-25, with a peak wavelength centred at 228 nm, full bandwidth at half maximum of about 25 nm and diameter of 25 mm, and c) the transmission curve for a narrow band transmission filter supplied by LOT Oriel, UK and manufactured by Andover Corporation, USA, type 450 FS 40-25, with a peak wavelength centred at 450 nm, full bandwidth at half maximum of about 40 nm and diameter of 25 mm.

FIG. 5

A schematic representation of a suitable viewer for observing the 575 nm orange fluorescence (upper image) and blue (blue-green) phosphorescence (lower image) of a tagged synthetic cut as a gemstone. The upper image (labeled '575 nm orange fluor.') shows the viewer set to excite and view 575 nm PL, and relates to the spectra shown in FIG. 1. The source is the xenon flash lamp. Filter F1 is the 450 nm excitation filter and filter F3 is the orange viewing filter OG550 and relates to the spectrum shown in FIG. 1. Filter F4 could be an additional filter to reduce effects from scattered light or the xenon excitation. The lower image (labeled 'blue-green phos.') shows the viewer set to excite and view blue PL/phosphorescence, and relates to the spectrum shown in FIG. 2. The source is the xenon flash lamp. Filter F2 is the 228 nm excitation filter. To prevent harmful ultraviolet light reaching the operator a glass or Perspex filter could be placed in the position marked 'open', in addition to the glass viewing window typically placed at the top of the instrument.

FIG. 6

Figure 5:
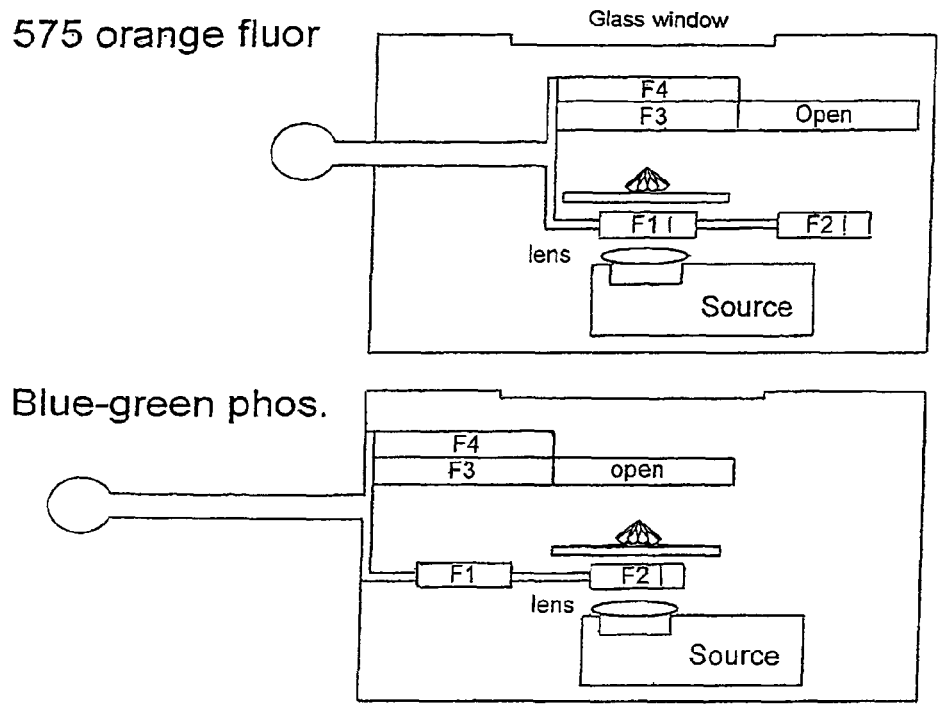

A schematic side elevation of the viewer shown in FIG. 5. The viewing filters are placed at approximately 45 degrees from the vertical and set away from direct excitation to prevent the operator viewing the source directly and to eliminate the production of luminescence in the filters from the excitation source.

FIG. 7

A graph over the range of 200 nm to 600 nm showing three spectra: a) the 254 nm spectrum of a mercury discharge after transmission through a UG5 filter, b) the 365 nm spectrum of a mercury lamp after transmission through a UG5 filter, with a full width at half maximum of around 25 nm, and c) the output spectrum of a typical commercial 400 nm LED.

FIG. 8

A graph over the range of 300 nm to 800 nm showing three spectra: a) the 575 nm PL band transmitted through an OG550 filter, extending from approximately 550-800 nm, b) the 400 nm LED excitation band with the transmission curve of the BG25 filter, effectively extending from 310-520 nm, and c) the transmission of the OG550, extending from 550 to beyond 800 nm.

FIG. 9a

A schematic representation of the image provided by a layer near the culet of a round brilliant. The box in the lower left is an apparatus consisting of a ring illuminator (labeled source) positioned around a viewing window with an OG550 filter, and at the bottom of the box is positioned a CVD synthetic cut as a round brilliant with a layer tagged with the 575 nm PL centre occupying the volume from the culet to approximately ⅓ the way up the pavilion facets. The illumination is being used to solely excite 575 nm PL. The diagram above and to the right shows the image observed in such a CVD synthetic, modeled here to be 6 mm high with a 575 nm containing region/layer extending 0.8 mm (13% the height of the stone) from the culet, when viewed normal to the table, as obtained by ray tracing. The eye (3 mm diameter pupil) of the observer is about 100 mm from the culet. The ray tracing diagram was produced by generating 4 million rays from within the 575 nm containing layer and calculating their trajectory within the CVD synthetic and their exit points. Only those rays (around 800) that entered the 3 mm aperture have been plotted on the plan view of the stone. An intense (orange, 575 nm) spot is seen in high contrast clearly evident in the centre of the table, as well as a series of high intensity spots in the crown facets.

FIG. 9b

A schematic representation of the image provided by a layer near the girdle of a round brilliant. The box in the lower left is an apparatus consisting of a ring illuminator (labeled source) positioned around a viewing window with an OG550 filter, and at the bottom of the box is positioned a CVD synthetic cut as a round brilliant with a layer tagged with the 575 nm PL centre occupying a thin layer near the girdle. The illumination is being used to solely excite 575 nm PL. The diagram above and to the right shows the image observed in such a CVD synthetic, modeled here to be 6 mm high with a 575 nm containing region/layer extending 0.8 mm (13% the height of the stone) from the girdle downwards, when viewed normal to the table, as obtained by ray tracing. The details for the ray tracing are as for FIG. 9a. No intense spot is seen in the table, with some general intensity visible predominantly in the table facets.

FIG. 10

A schematic showing a preferred apparatus to enable an observer to see the orange/blue flash and the optical effect from an orange or blue luminescent layer in a tagged CVD synthetic.

The apparatus provides two functions. The first function comprises a long wave source that only excites the orange 575 nm PL (102, 104) and which may be an LED (102) combined with lenses and a suitable filter such as BG25 (104). The 575 nm orange PL band excited in the CVD stone is observed with high selectivity through an OG550 filter (120).

The second function comprises a short wavelength source (112, 114) that excites the phosphorescence efficiently, and which is preferably a xenon flash lamp (112) combined with suitable lenses and filters (114) to provide a source of wavelengths preferably in the range 227 nm to 254 nm. The glass window (110) is provided to protect the viewer from UV radiation. In this mode of operation, the OG550 (120) is removed from the viewing path.

The complete apparatus is contained within a darkened box to allow the luminescence to be observed without interference from stray light. A viewing lens within the apparatus (118) allows the observer to see a magnified image of the stone.

FIG. 11

A PL (photoluminescence) image of a 0.2 carat round brilliant CVD synthetic 10 (crown angle approximately 35 degrees to the plane of the girdle and pavilion angle 41.5 degrees to the plane of the girdle) recorded by the Diamond-View™ instrument. In the original image before conversion to BNV (black and white) the areas in white are showing blue PL, and the areas in black are dark. The CVD synthetic 10 has a blue PL layer extending from the culet point to approximately 30% of the height of the stone. The image was recorded with the table facet 12 facing the viewer. The image is dominated by a distinct blue (seen here as white) 'fish-eye' spot 14 in the centre of the table facet 12. The remainder of the table facet 12 is devoid of blue PL. The crown facets 16 show a distribution of intensity from the internally scattered blue PL.

FIG. 12

Figure 11:
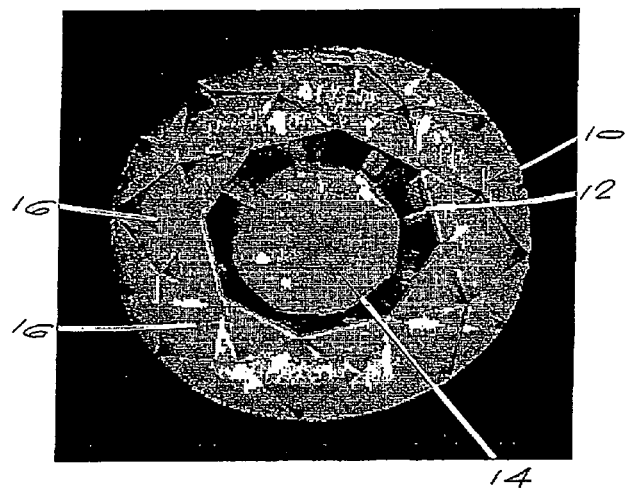

On the left, a computer generated image based on ray tracing techniques of the expected PL image for the round brilliant imaged in FIG. 11. The side view of the modeled round brilliant (20) is shown on the right, with a PL layer 22 extending approximately 30% the height of the stone 20 from the culet point 24. As in FIG. 11, the image of the PL viewed through the table facet is characterised by a 'fish-eye' spot 26 in the centre of the table facet 28, the remainder of the table facet 28 being largely devoid of PL. The crown facets 30 show a distribution of intensity from the internally scattered PL.

FIG. 13

On the left, a computer generated image based on ray tracing techniques of the expected PL image for the round brilliant (40) whose side view is shown on the right. As in FIG. 12, this stone is modelled with a PL layer 42 extending approximately 30% the height of the stone 40 from the culet point 44. The image of the PL viewed through the table facet is characterised by a 'fish-eye' spot 46 in the centre of the table facet 28, the remainder of the table facet 28 being largely devoid of PL. The crown facets 30 show a weak distribution of intensity from the internally scattered PL.

FIG. 14

A schematic diagram of a simple layer structure which could be produced in a CVD diamond layer to provide a characteristic mark using a single type of layer with PL characteristics distinct from the bulk. The diamond material 50 includes a pair of marker layers 52,54 which show characteristic PL separated by a spacer layer 56 free of this PL characteristic and with the characteristics of the rest of the layer. The layers 52, 54 and 56 have respective thicknesses tm1, tm2 and ts1.

FIG. 15

A schematic diagram of a simple layer structure which could be produced in a CVD diamond layer to provide a characteristic mark using two types of layer with PL characteristics distinct from the bulk. The diamond material 60 includes a pair of marker layers 62,64 which show similar characteristic PL separated by a layer 66 which shows PL characteristics distinct from layers 62 and 64, where all three layers 62, 64, 66 show PL characteristics distinct from those of the bulk of the material 60. The layers 62, 64, 66 have respective thicknesses tm1, tm2 and tn1.

FIG. 16

A schematic diagram of a more complex layer structure which could be produced in a CVD diamond layer to provide a characteristic mark using two types of layer with PL characteristics distinct from the bulk. In particular, layers 72, 76 and 80 and layers 74, 78 and 82 form two distinct groups, each group of layers having PL characteristics which are similar to each other within the group but distinct from the other group and from the bulk material 70. In addition the thicknesses of the individual layers are varied.

FIG. 17

Images taken of a round brilliant cut CVD synthetic diamond using a preferred variant of the Tagging Viewer. The stone is 1.02 ct, E/F colour and VVS2 or better, the bulk of which shows uniform 575 nm PL except for a layer showing blue phosphorescence about ⅓ the way up the pavilion facets from the culet. Each image is taken looking normal to the table facet. On the left is shown the image of 575 nm PL, where the intensity in the original image before conversion to BAN (black and white) was orange and now shows as lightness or white on black. One the right is shown the image of blue phosphorescence, where the intensity in the original image before conversion to BNV was blue and now shows as lightness or white on black. The intensity in the left hand 575 nm PL image is generally relatively uniform except for a dark ring seen in the centre of the table facet. This corresponds to the bright ring seen in the table in the right hand image of blue phosphorescence. Segments of this bright ring can also be seen in the table facets

FIG. 18

Images taken of a round brilliant cut CVD synthetic diamond using a preferred variant of the Tagging Viewer. The stone is 0.80 ct, F/G colour and VS1, the bulk of which shows uniform 575 nm PL except for a layer showing blue phosphorescence about ⅓ the way up the pavilion facets from the culet. Each image is taken looking normal to the table facet. On the left is shown the image of 575 nm PL, where the intensity in the original image before conversion to B/W (black and white) was orange and now shows as lightness or white on black. One the right is shown the image of blue phosphorescence, where the intensity in the original image before conversion to B/W was blue and now shows as lightness or white on black. The intensity in the left hand 575 nm PL image is generally relatively uniform except for a dark ring seen in the centre of the table facet. This corresponds to the bright ring seen in the table in the right hand image of blue phosphorescence. Segments of this bright ring can also be seen in the table facets

FIG. 19

Images taken of a square cut CVD synthetic diamond using a preferred variant of the Tagging Viewer. The stone is 0.69 ct, E/F colour and VVS2 or better, the bulk of which shows uniform 575 nm PL except for a layer showing blue phosphorescence about ⅓ the way up the pavilion facets from the culet. Each image is taken looking normal to the table facet. On the left is shown the image of 575 nm PL, where the intensity in the original image before conversion to B/W (black and white) was orange and now shows as lightness or white on black. One the right is shown the image of blue phosphorescence, where the intensity in the original image before conversion to B/W was blue and now shows as lightness or white on black.

Figure 2:
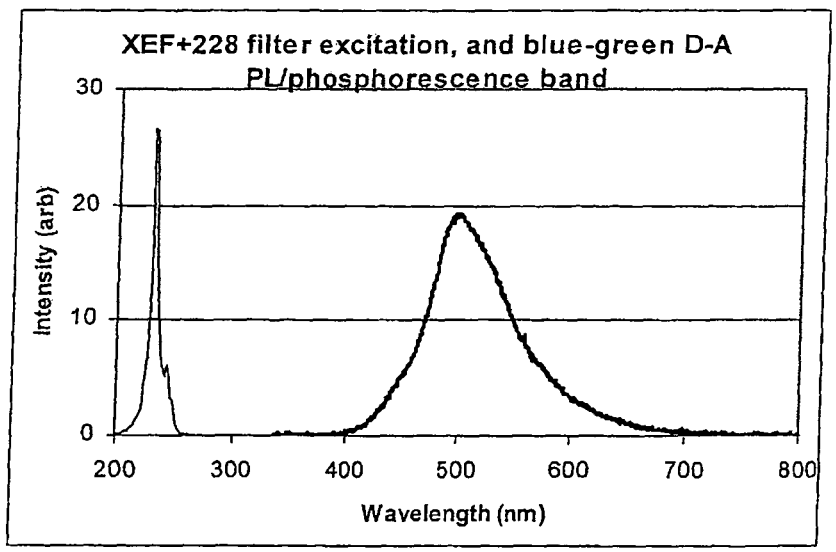
Figure 3:
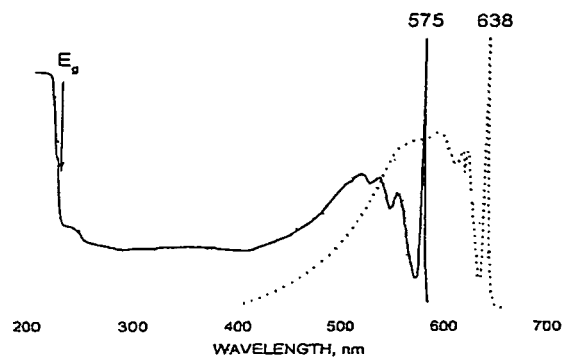

The orange luminescence (PL), originating substantially from the 575 nm centre, extends from around 500 nm to 750 nm at room temperature. (A 575 nm PL spectrum as viewed through a band pass filter cutting off below 550 nm is shown in FIG. 1). The blue PL/phosphorescence extends from 400 nm to 700 nm as shown in FIG. 2. Experiments have shown that wavelengths less than about 300 nm can excite both the orange 575 nm band (FIG. 3 shows the excitation spectra for the 575 nm and 637 nm bands up to the intrinsic diamond band edge (defining the diamond band gap) and is taken from Zaitsev A., Optical Properties of Diamond: a data handbook, Springer, 2001 (ISBN 354066582X)) and a weak blue PL/phosphorescence band. (N.B. 300 nm is outside the spectral response of the eye).

Wavelengths between 227 nm and about 254 nm are most efficient at exciting blue PL/phosphorescence from within the volume of the diamond. It is important to note that excitation at wavelengths less than 227 nm will be substantially absorbed at the surface of the diamond and will only generate luminescence at the surface. (This is the method employed in the DiamondView™ instrument. While this would be useful for looking at tagging layers at the surface, if they are covered by a jewellery setting where they come to the surface, then a surface excitation method using wavelengths less than 227 nm is inappropriate). Since the orange 575 nm PL turns off with the excitation source, the perceived colour of the PL from the CVD diamond material, or the coloured layers within it, would change from orange, or some orange/blue combination, to blue (the orange/blue flash). The visibility of such a change in colour, particularly the visibility of the orange component against the blue phosphorescence, may need to be enhanced by use of suitable filters.

Figure 20:
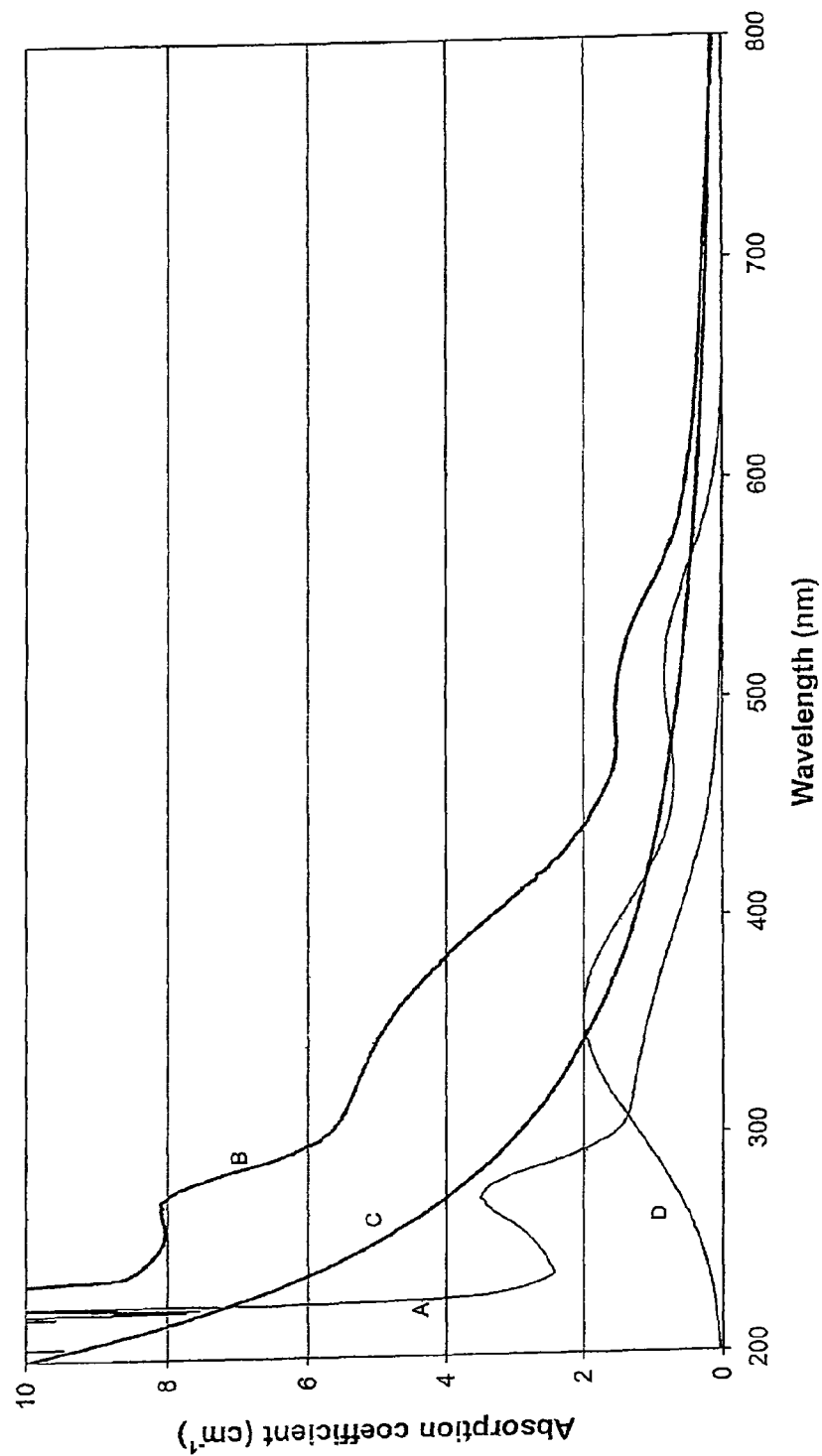
Figure 22:
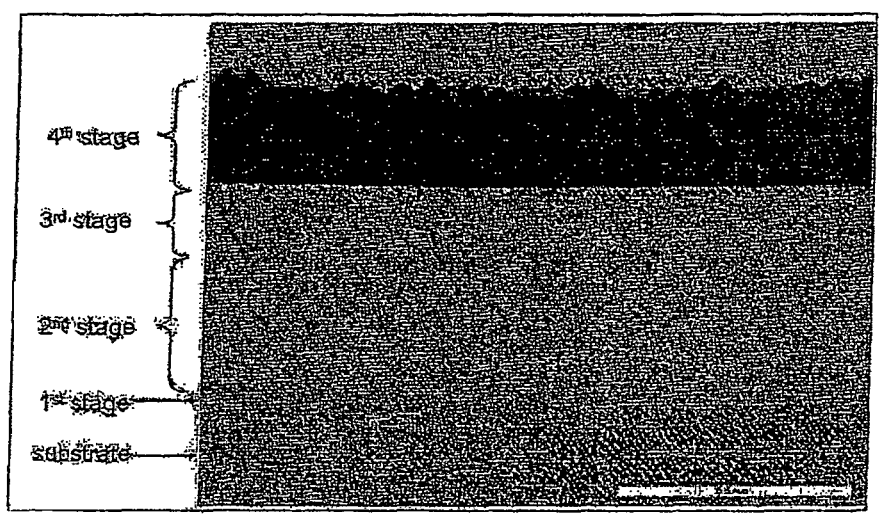

FIG. 20 shows the spectral decomposition of UV/visible absorption spectrum of an orangish brown CVD diamond layer, representing a typical CVD diamond layer grown in the presence of nitrogen without applying the method of this invention. Spectrum A shows a type Ib HPHT synthetic diamond, spectrum B shows an original spectrum of orangish brown CVD diamond, spectrum C shows a spectral component with (wavelength)$^{-3}$ dependence, and spectrum D shows a spectral component composed of two broad absorption bands;

FIG. 21 shows a photoluminescence spectrum of a silicon doped CVD diamond sample recorded at 77 K with 785 nm laser excitation; and FIG. 22 shows a low magnification optical microscopy image of a sample described in Example 11.

Examples of apparatus that can be used to excite and detect the orange/blue flash effect from 575 nm and or the optical effect from a single layer are set out below.

Apparatus Example 1

Filtered Xenon Flash Lamp Excitation

The apparatus required to observe the orange/blue flash effect could consist of a single excitation source such as a xenon flash lamp. To reduce the cost of the tagging viewer a low power xenon flash lamp is suggested, although this does not exclude the use of a more powerful xenon flash lamp. The frequency of the PL would follow the flash lamp excitation frequency. As the PL, and possibly a component of the direct excitation, would be viewed by an observer, the choice of repetition frequency is important. Some low power xenon flash lamps will only deliver full power at a repetition rate of about 10 Hertz. These are best avoided on grounds of safety as it is known that flashing light can trigger epileptic seizure in susceptible individuals. The frequency of flashing light that is most likely to trigger a seizure varies from person to person but is generally between 5 and 30 Hertz. A suitable source could be a 5 Watt xenon flash lamp from Hamamatsu Photonics, type L9456, operating at a peak power flash repetition rate of about 126 Hertz.

Figure 4:
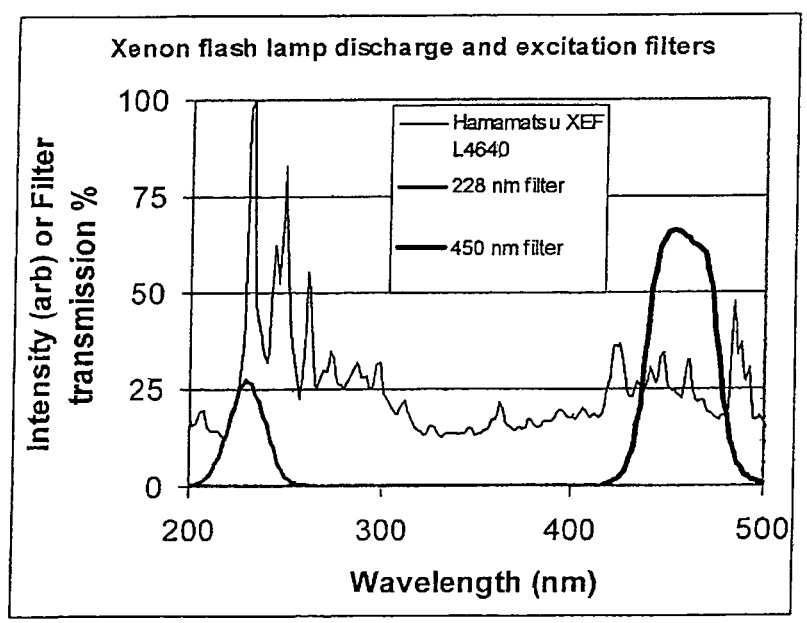

The main curve extending across the plot in FIG. 4 shows the emission spectrum of a Hamamatsu Xenon flash lamp. The radiation from the xenon flash lamp is dominated by intense visible emission bands in the long wave range 400 nm to 550 nm and very intense short wave ultraviolet emission bands in the range 220 nm to 270 nm. These long wave and short wave bands conveniently cover the wavelengths of excitation for the 575 nm and blue bands respectively. A suitable off-the-shelf filter in combination with a xenon flash lamp for exciting only 575 nm PL (and no blue phosphorescence) could be a narrow bandpass filter supplied by LOT Oriel, UK and manufactured by Andover Corporation, USA, type 450 FS 40-25, with a peak wavelength centred at 450 nm, full bandwidth at half maximum of about 40 nm and diameter of 25 mm (see FIG. 4). This wavelength band is within the vibronic absorption band of the 575 nm centre. This excitation is also within the vibronic absorption band of the 637 nm centre (see FIG. 3). If present the 637 nm luminescence would also usefully be excited with the 575 nm luminescence. In order to view the 575 nm luminescence the 450 nm visible excitation must be blocked. This may be carried out effectively with an OG550 glass filter from Comar Instruments, UK. FIG. 1 shows three curves, the curve centred about 450 nm which is the excitation beam generated by the Xenon flash lamp after filtering by the Andover 450 nm filter described above, the rising edge of the band pass region of the OG 550 viewing filter at about 550 nm, used to remove any of the excitation frequencies from the viewed image, and the emission spectrum of the 575 nm PL centre as viewed through the OG550 filter.

A suitable off-the-shelf filter in combination with a xenon flash lamp for exciting blue luminescence/phosphorescence could be a narrow bandpass filter supplied by LOT Oriel, UK and manufactured by Andover Corporation, USA, type 228 FS 25-25, with a peak wavelength centred at 228 nm, full bandwidth at half maximum of about 25 nm and diameter of 25 mm or a similar filter type 232 FS 25-25 with a peak wavelength centred at 232 nm and full bandwidth at half maximum of about 25 nm. FIG. 2 shows two curves, the curve centred about 228 nm which is the excitation beam generated by the Xenon flash lamp after filtering by the Andover 228 nm filter and the emission spectrum of the blue PL/phosphorescence centre. As the excitation does not lie in the visible spectrum no visible blocking filter is required to observe the resulting luminescence and especially not the phosphorescence when the source is switched off. However, direct viewing of short wave ultraviolet light is extremely harmful to the eyes and must be avoided. Use should be made of a glass or Perspex-type window to block all harmful ultraviolet light from the observer but allow unimpeded observation of the PL/phosphorescence.

Figure 6:
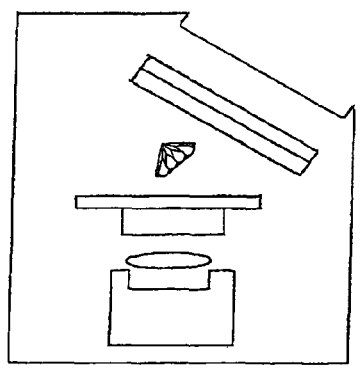

The apparatus described in this example is shown schematically in FIGS. 5 and 6. The apparatus labeled '575 nm orange fluor.' shows the viewer set to excite and view 575 nm PL, and relates to the spectra shown in FIG. 1 and described above. The source is the xenon flash lamp. Filter F1 is the 450 nm excitation filter and filter F3 is the orange viewing filter OG550 and relates to the spectrum shown in FIG. 1 and described above. Filter F4 could be an additional filter to reduce effects from scattered light or the xenon excitation. The apparatus labeled 'blue-green phos.' shows the viewer set to excite and view blue PL/phosphorescence, and relates to the spectrum shown in FIG. 2 and described above. The source is the xenon flash lamp. Filter F2 is the 228 nm excitation filter. To prevent harmful ultraviolet light reaching the operator a glass or Perspex filter could be placed in the position marked 'open'. FIG. 6 shows the apparatus in side elevation. The viewing filters are placed at approximately 45 degrees from the vertical and set away from direct excitation to prevent the operator viewing the source directly and to eliminate the production of luminescence in the filters from the excitation source. Note that the loose stone under test in FIGS. 5 and 6 has been oriented roughly with its table facing the excitation source with the observer viewing the stone from the pavilion. In this example provided the stone is fully illuminated the orientation of the stone is unimportant.

Apparatus Example 2

Gas Discharge Lamp Excitation

As previously mentioned, 575 nm luminescence may be excited in the absence of blue luminescence by wavelengths in the range about 300 nm to 575 nm (see FIG. 3). Bulk blue phosphorescence may be excited by wavelengths in the range 227 nm to 300 nm, but wavelengths in the range 227 nm to 254 nm are more efficient.

Figure 7:
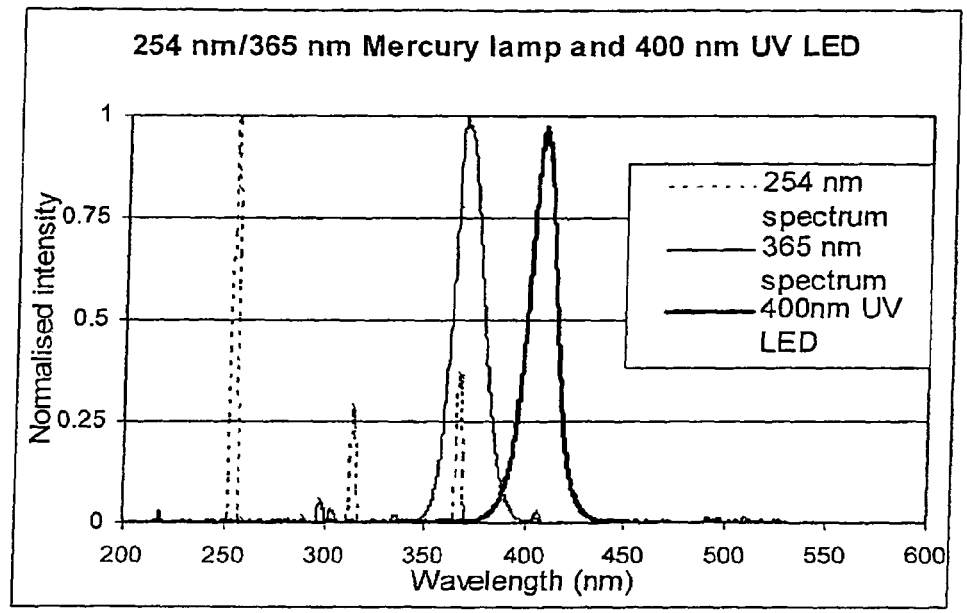

An alternative to using a filtered broadband source to stimulate the respective excitation bands is to employ a dual wavelength laser excitation. However, in order to remove the necessity for laser safety requirements and to reduce the component costs of the tagging viewer the emission from low pressure gas discharge lamps can be used. In particular the 254 nm (short wave) and 365 nm (long wave) emissions from the mercury discharge lamp can be employed. Mercury long wave and short wave excitations are used commonly for the observation of luminescence from minerals, including diamond. The unique aspect of the present method, as discussed above, is to use the 365 nm excitation first to excite exclusively 575 nm luminescence and then the 254 nm excitation to excite the blue phosphorescence. The intense 254 nm line is the dominant emission from low pressure mercury discharge lamps although there are other minor discharge lines (e.g. 365 nm) and broad background discharge in the visible. To minimize the effect of the visible discharge on the observation of PL in minerals etc the manufacturers of mercury discharge lamps fit a UG5 type filter in front of the lamp. The UG5 filter transmits below 420 nm and above 650 nm. The 254 nm spectrum in FIG. 7 is the mercury discharge through a UG5 filter. The 365 nm emission lamp is not purely the result of a mercury discharge. It is produced by the 254 nm discharge exciting luminescence from a phosphor coating on the interior wall of the tube. The 365 nm spectrum is a band with a full width at half maximum of around 25 nm (see FIG. 7). This is very efficient at exciting 575 nm luminescence but does not excite 637 nm emission from diamond.

Thus, in accordance with the proposed method, the 365 nm source is first switched on to excite 575 nm PL in the CVD synthetic. Viewing the 575 nm PL through an OG550 filter is an advantage as the filter removes substantially all of the background discharge from the 365 nm mercury lamp. The 365 nm lamp should then be switched off and the 254 nm lamp switched on. (The action of switching on the 254 nm lamp could usefully automatically switch off the 365 nm lamp). After several seconds the 254 nm lamp should be switched off and the presence of blue phosphorescence noted.

This method could be embodied in the apparatus shown in FIGS. 5 and 6, the xenon flash lamp being replaced by the 254 nm and 365 nm mercury lamps. It has been found that mercury discharge lamps can be arranged above the sample under test. In this way a bank of 2, 3, 4, 5 or more 254 nm and 365 nm lamps may be mounted together to increase the radiation intensity on the sample. Discharge lamps may be formed into any shape and could be formed in such a way as to allow circular illumination of the sample allowing almost direct close proximity excitation from above. The sample could be viewed through the ring illumination. Suitably intense miniature Pen-Ray® lamps supplied by Ultra-Violet Products (UVP) USA could be used which would also make the apparatus extremely compact. However any gas discharge lamp capable of producing sufficiently intense excitation in the ranges 300 nm to about 500 nm (for 575 nm PL) and 227 nm to about 254 nm (for blue PL/phosphorescence) would be suitable. Note that, just as in Apparatus Example 1 the loose stone under test in FIGS. 5 and 6 has been oriented roughly with its table facing the excitation source with the observer viewing the stone from the pavilion. In the present example provided the stone is fully illuminated the orientation of the stone is unimportant.

Apparatus Example 3

Combination of Light Emitting Diode (LED) and Mercury Discharge Lamp Excitations As previously mentioned, 575 nm luminescence may be excited in the absence of blue luminescence by wavelengths in the range about 300 nm to 575 nm (see FIG. 3). Bulk blue phosphorescence may be excited by wavelengths in the range 227 nm to 300 nm, but wavelengths in the range 227 nm to 254 nm are more efficient.

In accordance with the proposed method, the long wave source that only excites the orange 575 nm PL could be a light emitting diode (LED). A suitable LED emitting an emission band centred at 400 nm is shown in FIG. 7. The total optical power output from this type of LED is approximately 1-2 mW. Higher power LEDs are available from, for example, Nichia Corporation, Japan. Further examples are the 365 nm, 375 nm and 380 nm UV LEDs from Nichia or the Luxeon Lumiled Star/C royal blue (455 nm) LED. Extreme caution must be observed to protect the observer from the intense UV radiation from these sources. The optical emission from some of these LEDs can exceed 100 mW.

Figure 8:
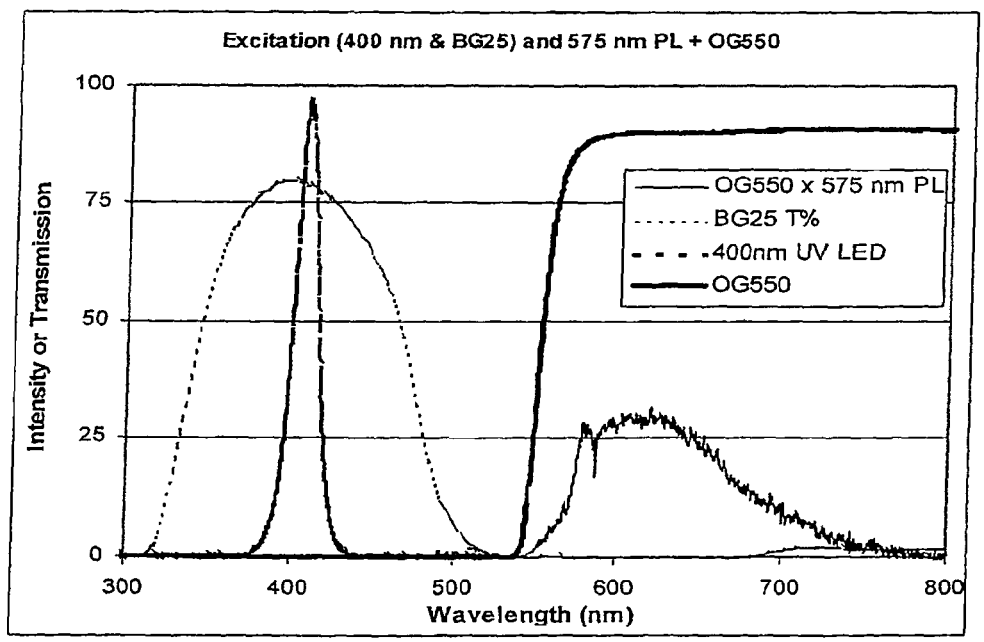

Provided the viewing filter (for example OG550 or OG570) can block the excitation wavelengths any LED in the range 300 nm to approximately 500 nm is suitable. Experiments have shown that an effective means of ensuring minimal overlap of the excitation wavelengths with the PL emission wavelengths is to use a short wavelength pass filter to block any long wavelength tail of the excitation. By way of example when using the 365 nm UV LED an effective blocking filter is a UG11 or a BG25. When using the 375 nm, 380 nm, 400 nm UV LEDs or 455 nm LED an effective blocking filter is a BG25. By way of example when the BG25 and OG550 are both placed over the UV LED almost total blocking of the LED emission is obtained. Any minor bleed-through from the BG25 can be avoided by any geometric arrangement that avoids the observer looking directly at the excitation source through the OG550 filter when observing the PL from the sample. By way of example FIG. 8 shows the 400 nm LED excitation band with the transmission curve of the BG25 filter effectively extending from 310-520 nm. The BG25 effectively blocks background emission from the LED above 520 nm. The 575 nm PL band transmitted through an OG550 filter is shown extending from 550-800 nm, and for completeness the transmission of the OG550 is shown from 550-800 nm. As the long wavelength tail of the excitation from the 400 nm LED at 700 nm is less than 0.01% of its peak intensity at 400 nm then any minor bleed-through transmission from the BG25 between 700-800 nm is not significant.

Thus the use of, for example, a 400 nm UV LED and BG25 blocking filter to excite 575 nm PL and the use of an OG550 to view the 575 nm PL is a useful method in its self to identify CVD synthesized diamond exhibiting 575 nm PL.

With this configuration the LED is first switched on to excite 575 nm PL in the CVD synthetic diamond material.

Viewing the 575 nm PL through an OG550 filter is an advantage as the filter removes substantially all of the long wavelength tail of the LED excitation. The LED should then be switched off and a 254 nm mercury discharge lamp switched on. (The action of switching on the 254 nm lamp could usefully automatically switch off the LED). After several seconds the 254 nm lamp should be switched off and the presence of blue phosphorescence noted.

This method could be embodied in the apparatus shown in FIGS. 5 and 6, the xenon flash lamp being replaced by the 254 nm mercury discharge lamp and LED. It has been found that mercury discharge lamps and LEDs can be arranged above the sample under test. In this way a bank of 2, 3, 4, 5 or more 254 nm lamps and a bank of 2, 3, 4, 5 or more LEDs may be mounted together to increase the radiation intensity on the sample. In the same way as the mercury discharge lamp may be formed into a circular illuminator, so too could a bank of LEDs be arranged in the form of a ring illuminator which could be concentric with the mercury discharge illuminator. This arrangement would make the apparatus extremely compact. Note that, just as in Apparatus Examples 1 and 2 the loose stone under test in FIGS. 5 and 6 has been oriented roughly with its table facing the excitation source with the observer viewing the stone from the pavilion. In the present example provided the stone is fully illuminated the orientation of the stone is unimportant.

Apparatus Example 4

Optical Effect from Luminescent Layer

The tagging layer should be positioned so that in any mount not normally easily removed, such as a jewellery setting, the volume of the layer can be efficiently excited by an external light source used during identification, the key point being that this light distribution may differ from that in normal viewing conditions, being for example a high intensity parallel beam rather than a more diffuse light source. Another example may be a high intensity ring illuminator placed over the sample. The interaction between the light source and the target cut stone is sensitive to the geometry or cut of the stone, and for precise analysis needs advanced ray tracing calculations. More importantly, the interaction between the luminescence or phosphorescence emitted by a layer or region within the cut stone and the cut of that stone, which forms the pattern of rays seen by the observer is sensitive to the geometry or cut of the stone, and the position of the layer or region within it, and for precise analysis needs advanced ray tracing calculations. Such ray tracing calculations have been carried out.

Considering a nitrogen doped layer (containing 575 nm/637 nm centres) extending about 13% of the height of the stone from the culet/point of the stone, the efficient excitation of the layer may require careful control of the excitation beam angle but this positioning of the layer may then be more effective in providing emission of internal luminescence directly out through the table.

Figure 9A:
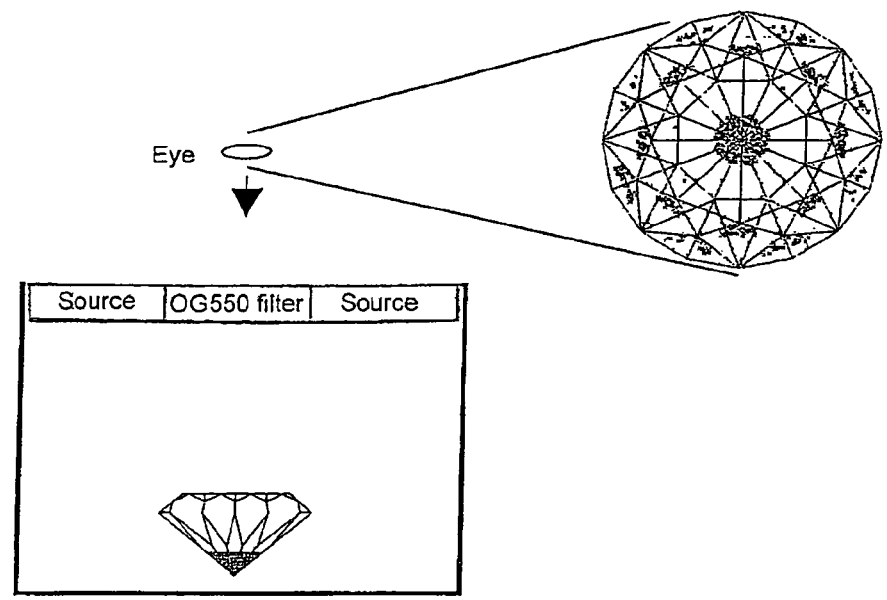

FIG. 9a (lower left) shows an apparatus consisting of a ring illuminator with excitation near the normal of the table of the stone. The illumination is being used to solely excite 575 nm PL. The illumination could be a 365 nm mercury discharge lamp, a filtered xenon flash lamp, a 365 nm, 375 nm, 380 nm, 400 nm or 455 nm LED or any suitably filtered intense source that excites 575 nm PL. The ray tracing diagram in FIG. 9a has been produced from a CVD synthetic 6 mm high with a 575 nm containing region/layer extending 0.8 mm (13% the height of the stone) from the culet. The eye (3 mm diameter pupil) of the observer is about 100 mm from the culet. The ray tracing diagram was produced by generating 4 million rays from within the 575 nm containing layer and calculating their trajectory within the CVD synthetic and their exit points. Only those rays (around 800) that entered the 3 mm aperture have been plotted on the plan view of the stone. An orange spot is seen in high contrast clearly evident in the centre of the table. The rays responsible for this spot exited the stone within the 22.4 degrees critical angle and therefore without internal reflection. Rays from the layer incident on the table facet outside the critical angle undergo internal reflection and exit at the crown facets with a distribution shown in FIG. 9a. This production of a coloured (in this case orange) spot is likely to be unique to a CVD synthetic with a well defined volume or layer producing luminescence or phosphorescence (in this case a nitrogen doped layer producing 575 nm PL) placed near the culet.

Figure 10:
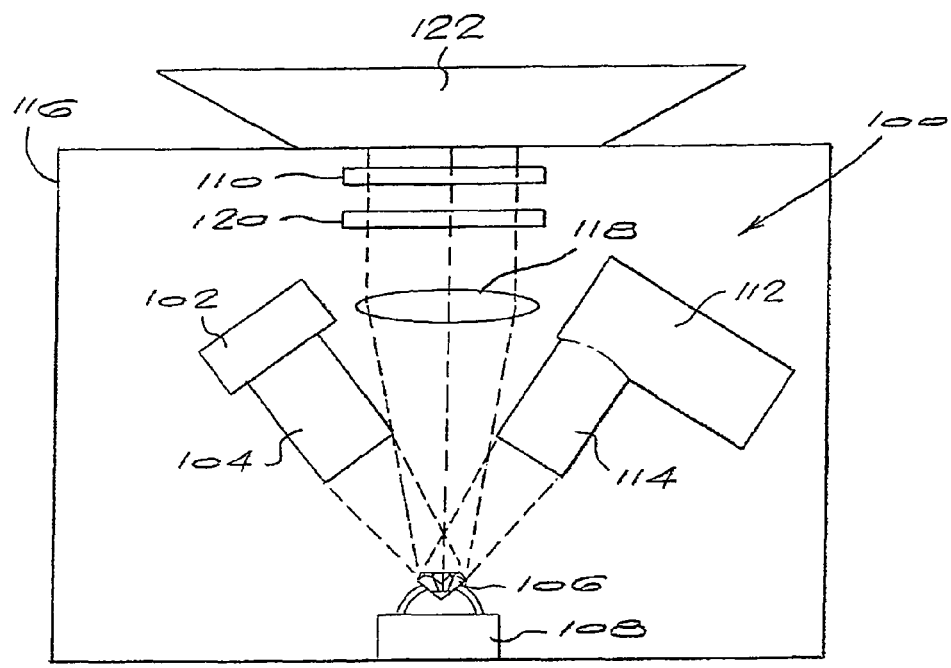

FIG. 10 shows a preferred apparatus 100 to enable an observer to see the orange/blue flash and the optical effect from an orange or blue luminescent layer in a tagged CVD synthetic. As previously mentioned, bulk 575 nm luminescence may be excited in the absence of blue PL/phosphorescence by wavelengths in the range about 300 nm to 575 nm (see FIG. 3). In accordance with the preferred apparatus 100, the long wave source 102 that only excites the orange 575 nm PL could be a Luxeon Lumiled Star/C royal blue light emitting diode (LED) emitting about 150 mW of optical radiation at 455 nm. When using the 455 nm LED an effective blocking filter 104 to prevent the observer seeing the excitation radiation is BG25. The BG25 filter effectively blocks light above 520 nm.

The 575 nm orange PL band excited in the CVD stone 106, mounted in a ring/stone mount 108, by the 455 nm LED is observed with high purity through an OG550 filter 110.

As previously mentioned, bulk blue phosphorescence may be excited by wavelengths in the range 227 nm to 300 nm, but wavelengths in the range 227 nm to 254 nm are more efficient. In accordance with the preferred apparatus, the short wave source 112 that excites the blue PL/phosphorescence is a 5 Watt xenon flash lamp from Hamamatsu Photonics, type L9456-01, operating at a peak power flash repetition rate of 126 Hertz. A suitable off-the-shelf filter 114 for transmitting only the deep UV excitation from the lamp (and exciting the blue luminescence/phosphorescence) is the type 232 FS 25-25 narrow bandpass filter supplied by LOT Oriel, UK and manufactured by Andover Corporation, USA, with a peak wavelength centred at 232 nm and full bandwidth at half maximum of about 25 nm.

The complete apparatus is contained within a darkened box 116 to allow the luminescence to be observed without interference from stray light. A viewing lens 118 within the apparatus allows the observer to see a magnified image (×2.5 for example) of the stone. The viewer was designed for use in a retail environment so great care was taken to protect the observer from harmful UV using a glass or Perspex viewing window 120 located below a viewing visor 122. The tagging viewer was also designed to sit on a microscope stage (not shown), and the fine spatial distribution of the luminescence/phosphorescence emitted by the diamond material or body under test was easily discernable and recorded with a digital camera.

With this configuration the LED is first switched on by continually depressing the LED 102 button to excite 575 nm/orange PL in the CVD synthetic 106. The orange PL is observed through the OG550 filter 110. If there is a nitrogen doped layer producing 575 nm PL below the girdle of the stone then the observer will see a distinctive orange ring or spot in the centre of the table facet as illustrated by the ray trace diagram in FIG. 9a.

This production of an orange spot is likely to be unique to a CVD synthetic. When the LED 102 button is released the orange PL ceases. The OG550 filter 110 is then manually removed. The xenon flash lamp 112 is then switched on by continually depressing the UV lamp button. The observer will then see a blue PL image of the CVD synthetic 106 with possibly some orange PL. When the UV button is released the observer will see blue phosphorescence. If there is a boron doped layer below the girdle of the stone then the observer will see a distinctive blue ring or spot in the centre of the table facet in both PL and phosphorescence as illustrated by the ray trace diagram in FIG. 9a. This production of a blue spot is likely to be unique to a CVD synthetic.

Figure 17A:
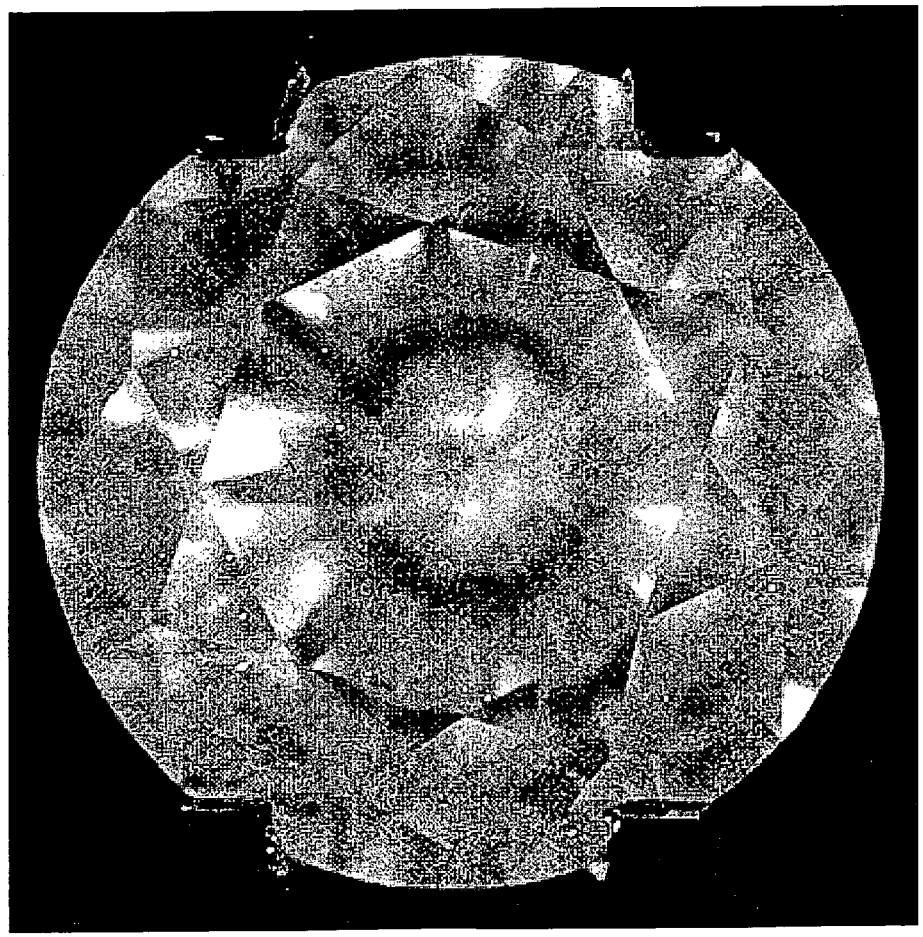
Figure 17B:
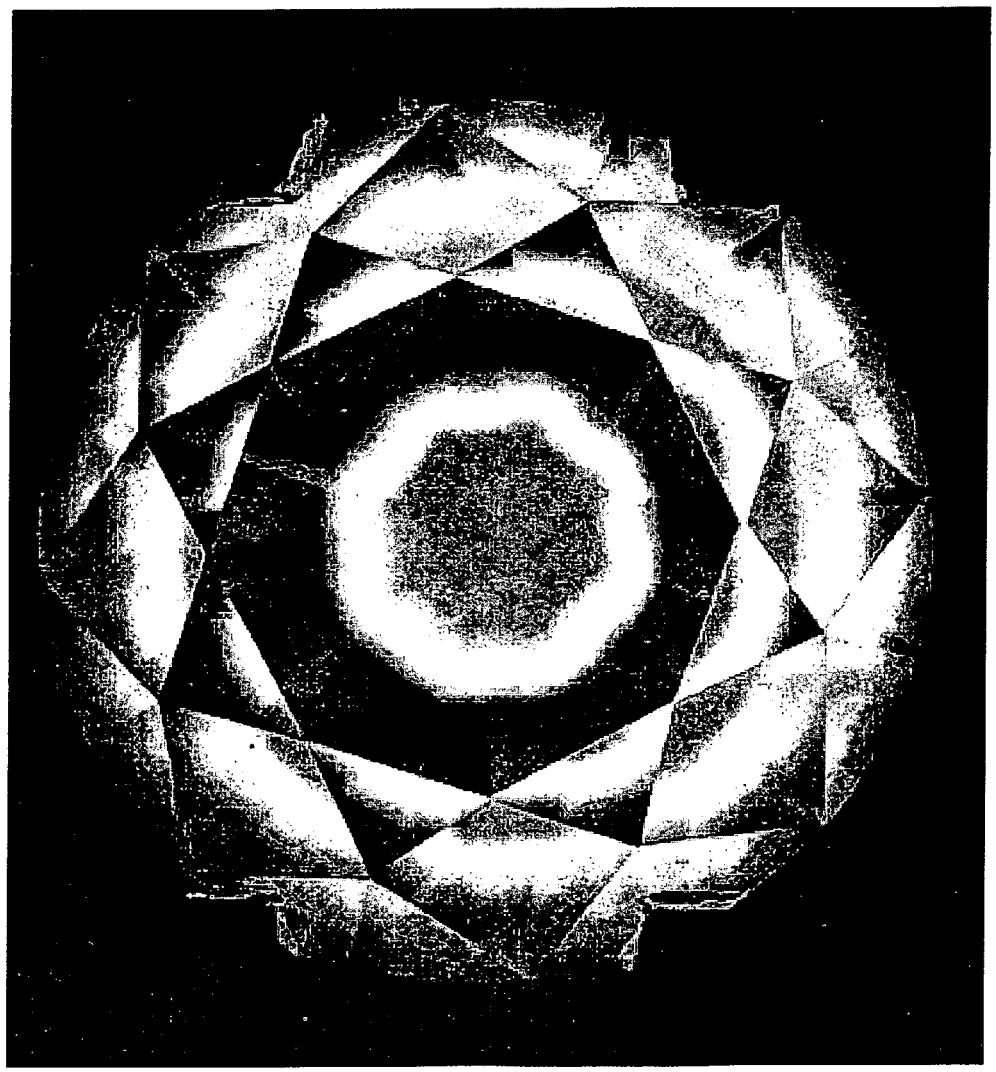

An alternative to a layer forming a portion of the cut stone up from the culet to a single boundary, is a discrete layer. Using the apparatus just described, shown in FIG. 17 are two images of a single tagged CVD synthetic polished into a 0.80 carat round brilliant. The bulk of the stone was grown with nitrogen. Under 455 nm LED excitation the bulk of the stone produces orange 575 nm PL as shown in the image on the left of FIG. 17. In order to produce an image of a discrete layer clearly visible in the table of the cut stone, a preferred layer was positioned well below the girdle, (typically) about ¼-⅓ up the height of the cut stone. Thus the stone in FIG. 17 has a boron doped layer phosphorescent, around 200-300 μm thick, at this position. This discrete layer only produces very weak 575 nm PL and therefore provides a reasonably well defined dark ring which is visible when viewing the 575 nm PL produced through the table. However, when the LED is switched off and the xenon flash lamp switched on, the dark ring corresponding to the boron doped layer, is rendered highly visible as a well defined intense blue PL/phosphorescence ring viewed through the table as seen in the right hand image in FIG. 17.

Additional images of segments of this ring may be visible in the crown facets, dependent on the exact orientation of the facets, with the position of the segment of the ring being similar in each facet of the same type and angle, but varying between the facets of different type and angle, to provide a complex series of features reflecting the symmetry of the stone. The production of a well defined coloured ring (in this case a blue ring) viewed within the table is likely to be unique to a CVD synthetic with a well defined volume or layer producing luminescence or phosphorescence (in this case a boron doped layer) placed in the lower half of the cut stone, below and away from the girdle. Indeed, this case is clearly represented by the right hand image of the example stone in FIG. 17.

Figure 9B:
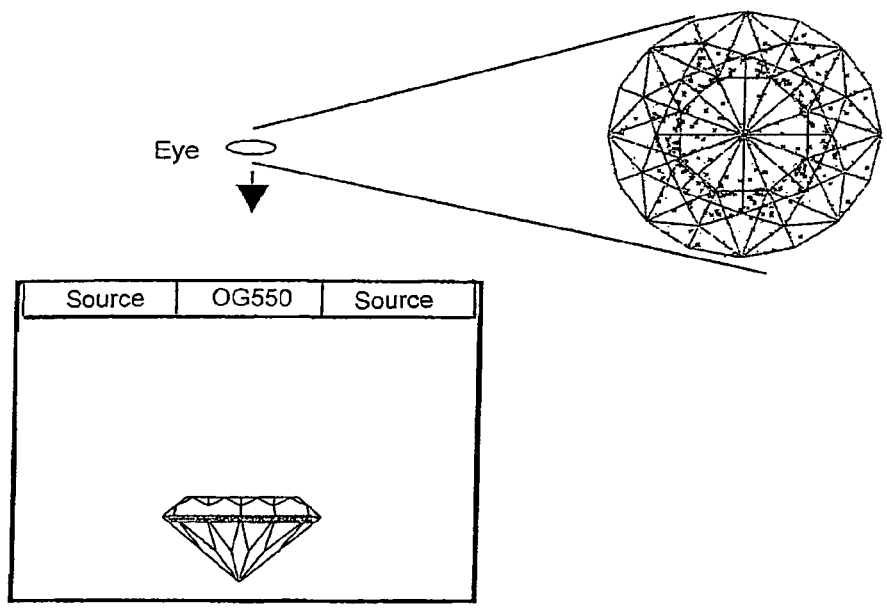

FIG. 9b shows a ray tracing diagram for a stone with, for example, a 575 nm PL layer just below the girdle. The effect this time is to produce a well defined orange ring just outside the table facet of the CVD synthetic. Similarly, the production of a well defined coloured ring (in this case an orange ring) is likely to be unique to a CVD synthetic with a well defined volume or layer producing luminescence or phosphorescence (in this case a nitrogen doped layer producing 575 nm PL) placed just under the girdle. Those skilled in the art will understand that a range of other positions of the layer are possible, with the perceived pattern encompassing a variety of rings and other identifying patterns, but that the key feature is that the non-natural distribution of optical centres in the cut diamond is detectable as a non-natural pattern of colour in the viewed stone, preferably viewed from the table, under suitable conditions.

By way of further example FIG. 11 shows a PL image of a 0.2 carat round brilliant CVD synthetic 10 (crown angle approximately 35 degrees to the plane of the girdle and pavilion angle 41.5 degrees to the plane of the girdle) recorded by the DiamondView™ instrument. The CVD synthetic 10 has a blue PL layer extending from the culet point to approximately 30% of the height of the stone. The image was recorded with the table facet 12 facing the viewer. The DiamondView™ excitation is sufficiently penetrating in a type II CVD synthetic to excite substantial sub-surface PL. The image of the blue PL layer in the DiamondView™ is very similar to that observed simply by eye with bulk excitation of the stone with short wave UV light with wavelengths in the range 227 nm to approximately 254 nm. The image is dominated by a distinct blue 'fish-eye' spot 14 in the centre of the table facet 12. The remainder of the table facet 12 is devoid of blue PL. The crown facets 16 show a distribution of intensity from the internally scattered blue PL.

Figure 12:
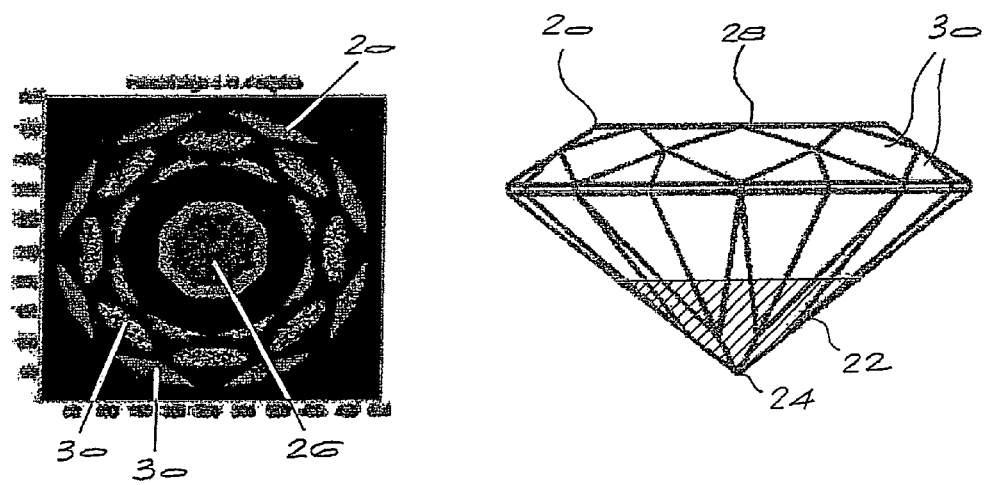

FIG. 11 compares very well with an image from a stone 20, with similar geometry, generated using the ray tracing programme for a PL layer 22 extending approximately 30% the height of the stone 20 from the culet point 24, shown in FIG. 12. Like FIG. 11, FIG. 12 is also characterized by a 'fish-eye' spot 26 in the centre of the table facet 28, the remainder of the table facet 28 being devoid of PL. As in the case of the DiamondView™ image and Tagging viewer image, the crown facets 30 show a distribution of intensity from the internally scattered PL.

It should be noted that the stone 10 used in FIG. 11 and the stone used in FIG. 17 also have an orange 575 nm layer above the blue PL layer. Thus these stones will also perfectly demonstrate the orange/blue flash effect in the DiamondView™ and the Tagging viewer and using the methods described above.

Figure 13:
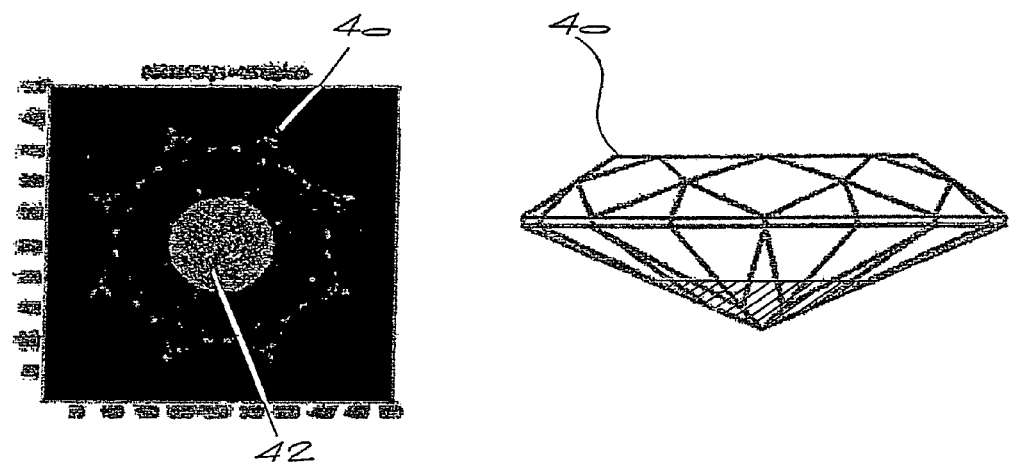

There is an effect on the observed image from a variation in the pavilion angle. However, the resulting images are sufficiently well defined to provide great confidence in the use of the optical effect from luminescent layers for stones of varying pavilion and crown angles and stone shapes such as square cut or emerald cut. The effect on the PL image of changing the pavilion angle in a round brilliant stone from 41.5 degrees (FIG. 12) to 25 degrees in a stone 40 is shown in FIG. 13. The characteristic 'fish-eye' 42 is clearly visible and therefore identifies the stone as a tagged CVD synthetic.

Particularly in the case where the layers are intended to form a unique signature representing the manufacturer or other information, rather than just provide evidence of the synthetic nature of the material, then consideration needs to be given to the structural sequence of the layers. The characteristic pattern of lines forming a tag within a cut CVD synthetic stone needs to be as widely applicable as possible, and potentially could be used in CVD diamond layers which are themselves boron doped to provide a visible blue colour, but also providing a source of blue-band phosphorescence, or in CVD diamond layers or objects which otherwise contain nitrogen and thus show orange luminescence through part or the whole of their volume. By combining the two layers together into a pattern, the same pattern can then be observed and identified in both these types of CVD diamond layer or object, with the risk that final layers at the edge of the mark may blend into the background. This risk is minimised by using an asymmetric mark, where one edge of the mark is defined by blue phosphorescence and the other is defined by orange luminescence. Alternatively some neutral background could be used around the mark, or the mark could be deliberately varied at the pattern edges to provide clarity in any particular type of stone In CVD diamond layers with a sufficiently high level of boron more generally present through the volume, for example where a strongly coloured stone is required, then the addition of nitrogen in marker layers may not be sufficient to generate orange luminescence but may merely modulate the blue phosphorescence from donor-acceptor pair recombination. One solution is to specifically reduce the B concentration in the N doped layers to enable the orange luminescence to be observed. Alternatively, under such circumstances the modulation of the blue phosphorescence may be sufficient, and can be controlled by both the added N and added B concentrations.

Likewise, in a process where nitrogen is added for other reasons and 575 nm PL is present throughout the layer, an alternative to producing 575 nm luminescing layers is to produce layers free of 575 nm luminescence, or to modulate the intensity of the 575 nm luminescence by varying the nitrogen concentration or by other process variations such as the methane concentration or the temperature.

There are further advantages to the choice of marker layers, in that the blue phosphorescence of the boron is stable with respect to post treatments such as annealing, so that these marks would remain even if the CVD diamond layer, object or synthetic gemstone was treated by such means. Conversely the orange luminescence is modified by annealing, particularly at very high temperatures. These lines would therefore indicate that the object had been post treated after the point of sale. In particular, annealing of the orange luminescence can convert the orange luminescence to a characteristic green luminescence or phosphorescence (the extent to which this light continues to be emitted after the removal of the excitation source varying over several orders of magnitude depending on the relative concentration of the defects involved). The stability of the layers showing blue phosphorescence thus enables the location of the previously orange luminescing bands to be determined and the treatment conditions to be determined from the modified, increased or reduced colour then present in these bands.

As will be described in the example sections, a distinctive orange/blue flash is observed from tagged CVD synthetics under suitable illumination conditions. In annealed tagged CVD synthetics (particularly those annealed at very high temperatures) the orange/blue flash may be replaced with a green/blue flash. This effect would be noticeable, by a suitably trained individual, from a tagged CVD synthetic cut into any shaped brilliant e.g. round or square.

As described earlier and further described by the examples, a distinctive orange/blue 'fish-eye' ring or spot is observed from suitably tagged CVD synthetics under suitable illumination conditions. As the blue phosphorescence of the boron doped CVD diamond is stable with respect to post treatments, such as annealing, the blue 'fish-eye' ring (picture-frame in square cut stones) or spot remains unaltered and is still an effective means of identifying a tagged CVD synthetic stone even after annealing in both round cut and square cut stones.

A particular variant of the invention is the deliberate use of the green luminescence obtained after annealing orange luminescing material, either in isolation or in combination with other tagging centres and structures.

Figure 14:
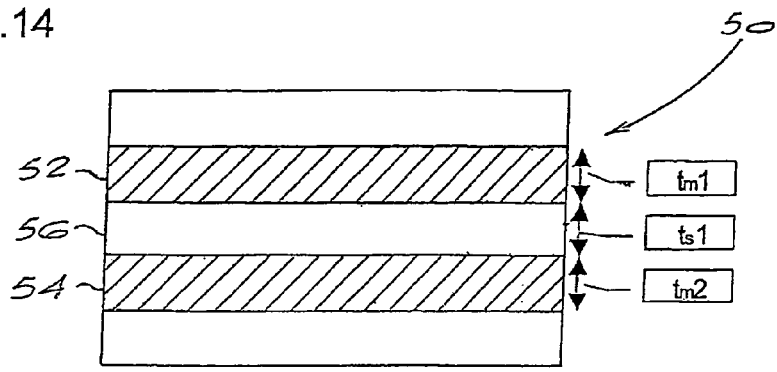

The simplest pattern of multiple lines envisaged using one type of marker layer (e.g. blue phosphorescence) is shown in FIG. 14. The diamond material 50 includes a pair of marker layers 52,54 separated by a spacer layer 56.

Here, $t_m$ is the thickness of the respective marker layers 52,54 and $t_s$ is the thickness of the spacer layer 56.

Figure 15:
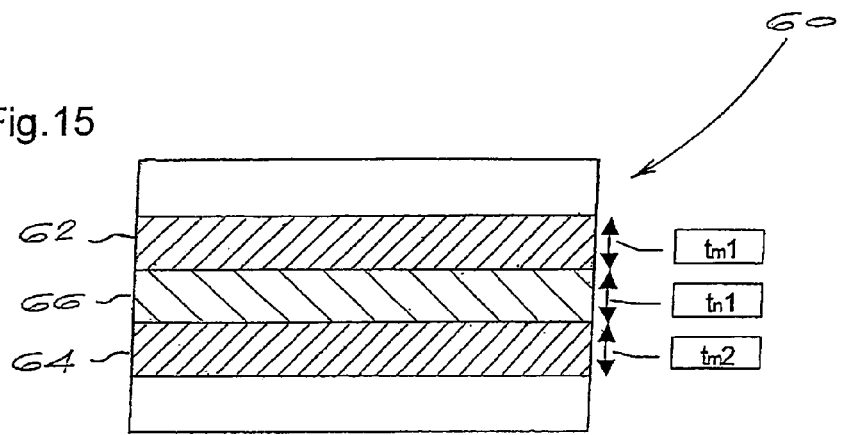

Adding in a second type of layer (e.g. orange luminescence) gives a structure as shown in FIG. 15. In this embodiment, the synthetic diamond material 60 has a pair of first marker layers 62,64 separated by a second marker layer 66. A simpler structure which may be more appropriate in some circumstances is one layer of each of the two types of marker layer placed adjacent to one another, with a further variant being where these two layers are spaced apart by a spacer layer of undoped or untagged material.

Figure 16:
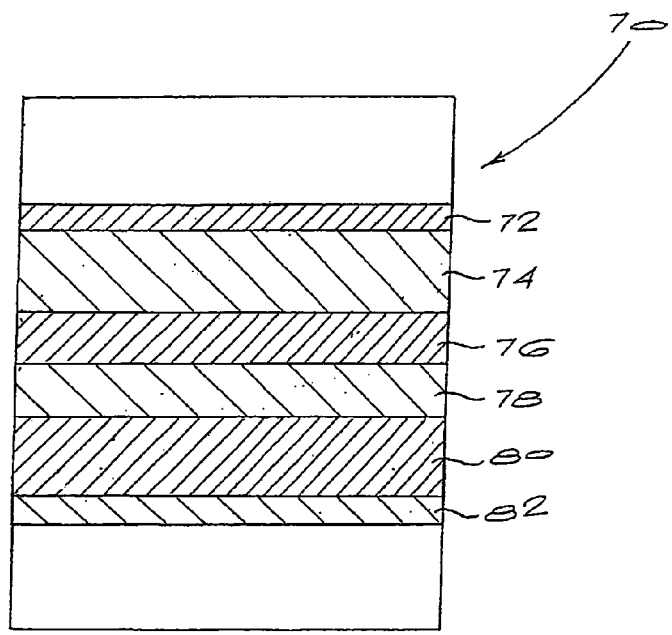

In particularly preferred embodiments, it is envisaged that the structures would probably be more complex, using more layers and with clearly varying thicknesses. In the synthetic diamond material 70 shown in FIG. 16, the thicknesses of the layers 72, 74, 76, 78, 80 and 82 are varied. They may be, for example, 50 μm (74,80), 25 μm (76,78), and 12 μm (72,82), giving a total thickness of the mark of 175 μm, which would be clearly visible under the correct viewing illumination provided that the dopant levels were suitably controlled.

It has been demonstrated that the marker layers of given thicknesses can be grown to an accuracy of 10% or better, with typical values being in the 3%-5% region. For thicker layers or in a routine production process it may be possible to achieve an accuracy of 2% or better. However, when viewing the layers with above band-gap illumination, the marker layers will be seen on any surface which intersects those layers, but that surface may not be normal (i.e. at right angles) to the marker layers, and in many commercial diamond objects including synthetic gemstones this will often be the case. Thus, the absolute dimensions of the layers will typically not be consistent from one facet of a CVD diamond object to another, or necessarily between similar objects (although this may be the case if both the marker layers and the orientation of the object cut out of the diamond are crystallographically oriented), easily varying by up to about +/−50% depending on the angle of the facet on which they are viewed. What will be consistent across any single facet, however, is the relative ratios of the thicknesses of the layers and the sequence of colours, which will allow for proper identification of the mark of origin or fingerprint. It is of course possible from the geometry of the CVD diamond object and the specific orientations of the layer(s) and the facet intersected, to calculate the precise thicknesses of the layers, but this is a level of complexity which the preferred embodiment avoids. It may also be possible to measure these thicknesses directly using techniques such as confocal depth profiling, but again this generally needs more complex equipment than is desirable.

Thus, taking relative ratios of the thicknesses of layers as the only measurable characteristic, a single marker layer gives no information, since there is no reference point. However, a mark of origin with 2 marker layers and a spacer layer gives two unique parameters, for example taking the spacer layer as the scale bar against which to compare the thickness of each of the marker layers. A mark of origin with 3 marker layers and 2 spacer layers gives 4 unique parameters (provided there is no mirror symmetry), etc. Hence, in practice, it is believed that the reasonable number of layers to provide a distinguishable mark of origin but permitting several deliberate variants would be three marker layers, giving 4 unique thickness ratio parameters. In the case where 2 distinct type of marker layers are used alternately, the number of unique parameters can be considered in a similar fashion.

By way of example the invention is described above giving detail of specific detail of optical centres and layered structures which are advantageous. However, those skilled in the art will understand that this does not limit the generality of the invention, which in its most general form provides a means of detecting the synthetic nature of a diamond layer without affecting its visual properties under normal viewing conditions. A preferred form is the use of optical centres such as the 575 nm PL centre to provide the synthetic indicators. However, it may be possible to use other features or properties of the material. A further preferred form is the use of layered structures to emphasise the deliberate synthetic nature of the material. A particularly preferred form is the combination of the use of optical centres and layered structures to provide clear evidence of the synthetic nature of the material even where access or other considerations may add difficulties.

The invention will now be described with reference to the following non-limiting Examples.

Example 1

Substrates suitable for synthesising single crystal CVD diamond were prepared according to the method described in WO 01/96634, with {100} major faces.

These substrates were brazed onto a tungsten substrate using a high temperature diamond braze. This was introduced into a microwave plasma CVD reactor and an etch and growth cycle commenced in the general form described in WO 01/96634, and then synthesis proceeded as follows:

The first stage of growth comprised 200/250/4500 sccm (standard cubic centimeter per second) of $CH_4/Ar/H_2$ at $200 \times 10^2$ Pa and a substrate temperature of 850° C. with no added dopants.

The second stage of growth was the same as the first stage above with the addition of 0.8 sccm of 20 ppm $B_2H_6$ diluted in hydrogen (0.003 ppm), and the addition of 25 sccm of 100 ppm $N_2$ diluted in hydrogen (0.5 ppm).

The third stage of growth was the same as the first stage above with the addition of 10 sccm of 100 ppm $N_2$ diluted in hydrogen (0.2 ppm).

The fourth stage was a repeat of the first stage.

On completion of the growth period, the substrate was removed from the reactor and the CVD diamond layer removed from the substrate. This layer was then polished to produce a 6.7×6.6×2.3 mm diamond block of {100} growth sector material and analysed for its optical properties and the structure of the layers.

Using above bandgap radiation in a 'DiamondView™' the structure of the layers was determined by viewing a side face of the block to be: layer 1: 450 μm thick, layer 2: 250 μm thick, layer 3: 285 μm thick and layer 4: 1.31 mm. Layer 2 showed strong phosphorescence and layer 3 showed strong 575 nm luminescence. This layer structure is unique to synthetic diamond of this invention Under a standard jewelers UV hand lamp it was possible to discern luminescence and phosphorescence from the stone in a darkened room, although the blue phosphorescence tended to dominate the orange luminescence during exposure.

A low cost viewer suitable for volume production was constructed to evaluate the phosphorescence and luminescence properties of the diamond described in detail in Apparatus Example 4 and illustrated in FIG. 10. The viewer comprised a 5 W OEM pulsed Xenon unit (Hamamatsu Photonics, type L9456) and a Luxeon Lumiled Star/C LED emitting at 455 nm.

A 0.2 ct round brilliant cut synthetic was produced from a similar block of CVD diamond produced in the same synthesis run and was graded to be H colour. The first layer, below the boron phosphorescent layers, was removed during processing. The appearance of the 575 nm luminescence and blue phosphorescence observed in this stone when viewed through the table in DiamondView™ and Tagging viewer was described earlier (FIG. 11 and FIG. 12), with a distinct blue 'fish-eye' spot visible in the centre of the table surrounded by orange luminescence, and a distinct pattern of blue phosphorescence and orange luminescence visible in the crown facets.

Example 2

The growth procedure described in Example 1 was repeated to produce a layer 5×5×3 mm thick.

Vertical plates were cut out of this block and fabricated into diamond scalpel blades. The presence of the tagging layers was not discernable under normal illumination in these blades and did not affect their normal function.

Upon inspection using DiamondView™, the presence and structure of the tagging layers was clearly discernible, identifying the origin of the material from which the blades were fabricated.

Inspection under the low cost viewer described in Apparatus Example 4, and Example 1 and illustrated in FIG. 10 clearly showed orange luminescence and blue phosphorescence, making clear the unique synthetic nature of the material.

Example 3

The growth procedure described in Example 1 was repeated to produce a layer 3.7 mm thick. This layer was polished into a round brilliant cut.

Upon inspection using DiamondView™, the presence and structure of the tagging layers was clearly discernible, cutting across the facets just below the girdle, identifying the origin of the material from which the stone was produced.

Inspection under the low cost Tagging viewer described in Example 1, Apparatus Example 4 and illustrated in FIG. 10 clearly showed orange luminescence and blue phosphorescence, making clear the unique synthetic nature of the material.

Example 4

Figure 18A:
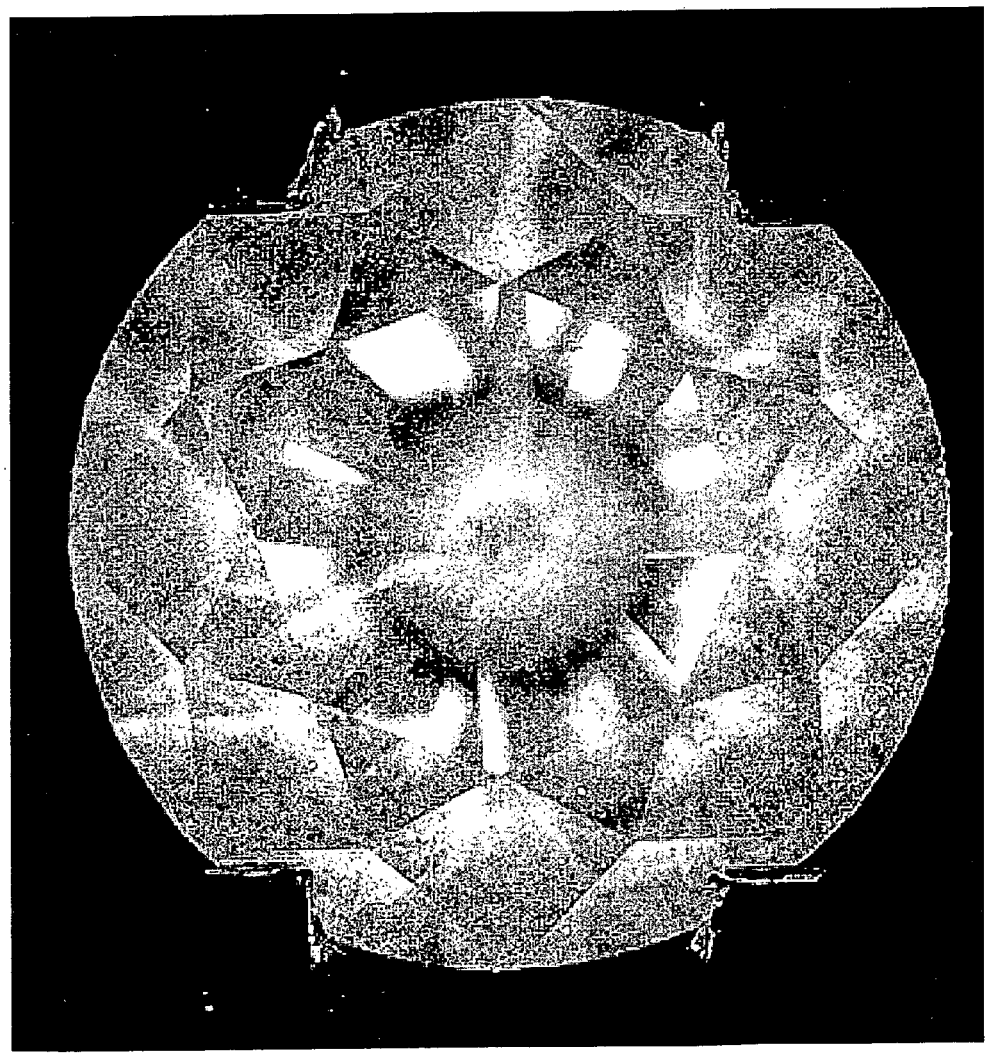
Figure 18B:
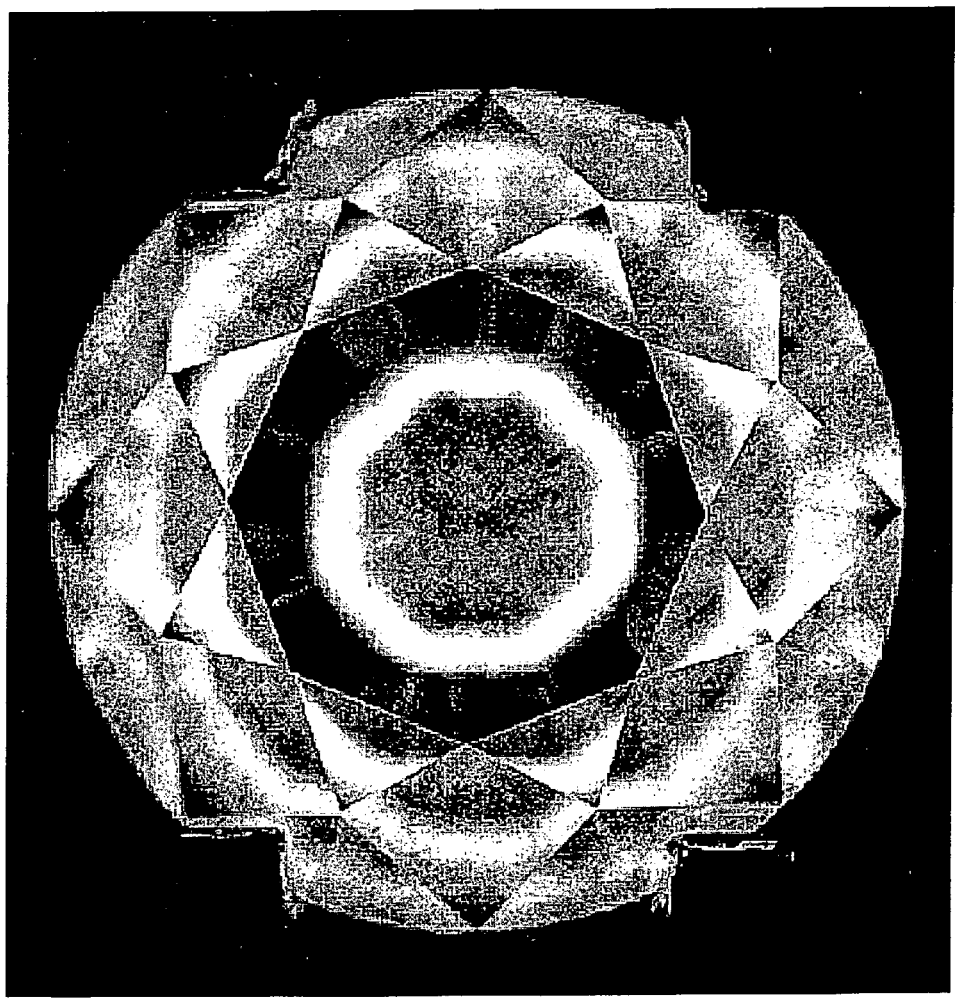
Figure 19A:
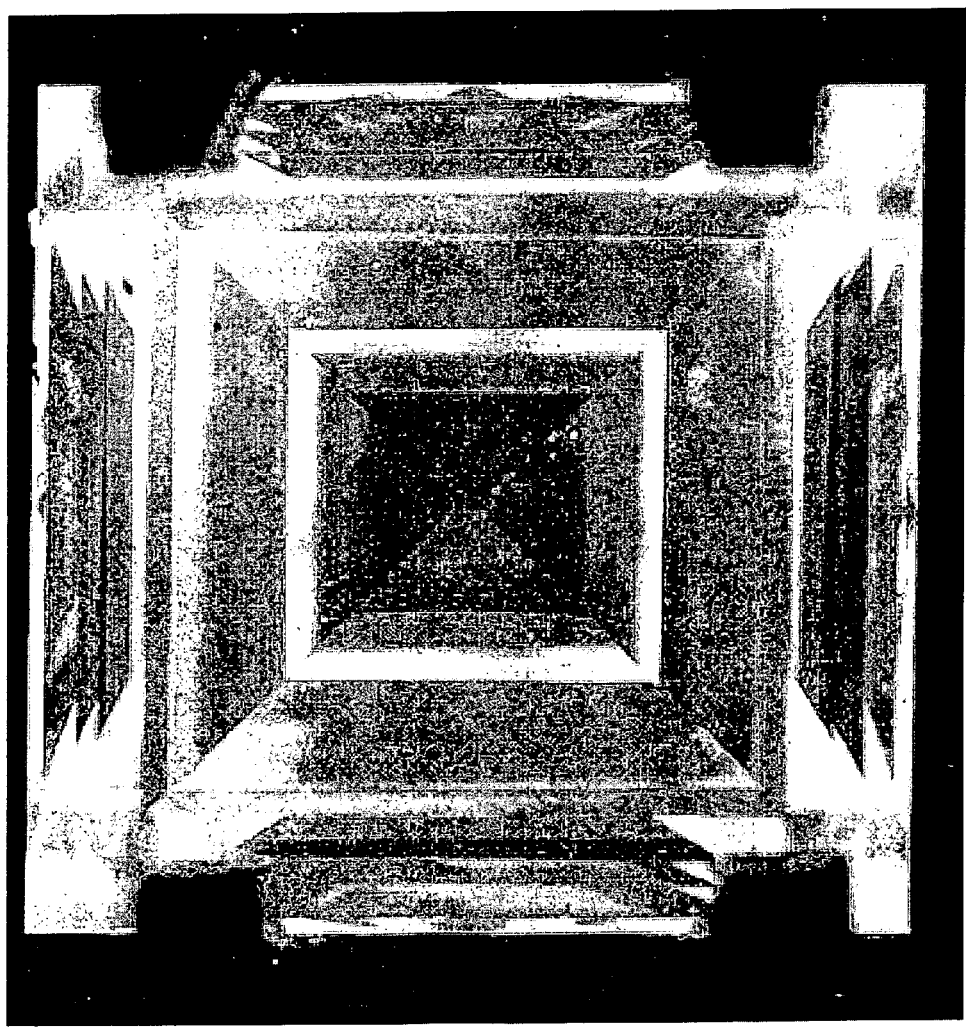
Figure 19B:
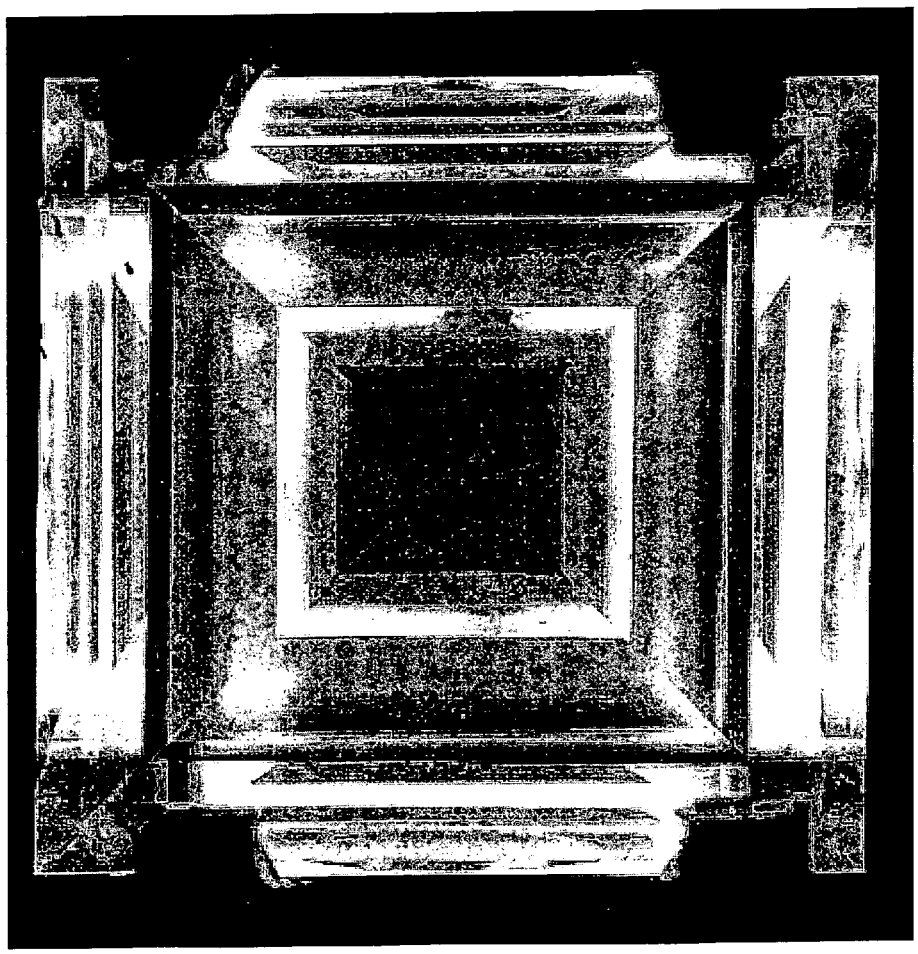

Using growth conditions similar to Example 1, but varying the duration of the different layers, a series of demonstrator stones in the form of round brilliants and square cut stones have been produced. The demonstrator stone images are shown in FIGS. 17 to 19. The left hand image in each figure is the image of the stone under 455 nm LED excitation and showing 575 nm/orange PL. The right hand image in each figure is the image of the stone under 232 nm deep UV excitation from the filtered xenon flash lamp and shows the blue PL/phosphorescence. FIGS. 17 and 18 show round brilliant demonstrator stones and FIG. 19 shows a square cut demonstrator stone.

Example 5

Ib HPHT substrates suitable for synthesising single crystal CVD diamond were prepared according to the method described in WO 01/96634, with {100} major faces.

These substrates were brazed onto a tungsten substrate using a high temperature diamond braze material. This was introduced into a microwave plasma CVD reactor and an etch and growth cycle commenced in the general form described in WO 01/96634, but using the specific synthesis conditions described below.

Nitrogen was added into the process using a mixture of 100 ppm $N_2$ in hydrogen. Boron impurities were added to the process using either 20 ppm or 100 ppm $B_2H_6$ in hydrogen.

Two sets of samples were prepared.

Sample Set 1-1

The first stage of growth comprised 200/250/4500 sccm (standard cubic centimeter per minute) of $CH_4/Ar/H_2$ at $200 \times 10^2$ Pa and a substrate temperature of 850° C. with no added dopants. This was a control layer of high purity high colour growth to demonstrate process control.

The second stage of growth was the same as the first stage above with the addition of 1 ppm of $N_2$. This stage was to evaluate the effect of 1.0 ppm nitrogen as the sole gaseous impurity.

Sample Set 1-2

The first stage of growth repeated the conditions for the first stage of growth for set 1-1.

The second stage of growth was the same as the first stage above with the addition of 0.003 ppm $B_2H_6$, and the addition of 1 ppm $N_2$.

On completion of the growth period, the samples where removed from the reactor and processed to produce a range of test pieces, in particular cross-sectional slices of the growth, and free standing plates of the second stage growth layer which were typically 2-3 mm thick. The cross-sectional slices confirmed that the first stage growth in each case was essentially colourless high purity growth, and that whilst the second stage growth in sample set 1-1 was significantly coloured brown the second stage growth in the second process with added boron was almost colourless.

A number of further samples were produced, using the general growth conditions of: 200/250/4500 sccm (standard cubic centimeter per minute) of $CH_4/Ar/H_2$ at $200 \times 10^2$ Pa and a substrate temperature of 850° C., with the addition of 0.003 ppm $B_2H_6$, and the addition of 1 ppm $N_2$, but making small variations to the different growth parameters and in particular varying the temperature by +/−100° C., the relative ratio of the B and N concentration by a factor of 5 in both directions (e.g. higher and lower boron relative to nitrogen), and the pressure by +/−$100 \times 10^2$ Pa. The conclusion was that too much B relative to nitrogen produced blue material, that too little B relative to nitrogen produced brown material, and that the optimum balance between B and N varied to some degree with other process parameters such as pressure and temperature. However, the deleterious effect of the nitrogen in producing brown coloured or optically absorbing diamond could be ameliorated and largely stopped by adding an optimal level of boron to the process, matched to the particular growth conditions used.

Example 6

Ib HPHT diamond substrates were prepared and mounted onto a tungsten disc as in example 5. This disc was introduced into a microwave plasma CVD reactor and an etch and growth cycle commenced in the general form described in WO 01/96634, but using the specific synthesis conditions described below.

Nitrogen was added into the process using a mixture of 100 ppm $N_2$ in hydrogen. Silicon impurities were added to the process using typically 500 ppm $SiH_4$ in hydrogen.

Two sets of samples were prepared.

Sample Set 2-1

The first stage of growth comprised 36/0/600 sccm (standard cubic centimeter per minute) of $CH_4/Ar/H_2$ at $250 \times 10^2$ Pa and a substrate temperature of 810° C. with no added dopants. This was a control layer of high purity high colour growth to demonstrate process control.

The second stage of growth was the same as the first stage above with the addition of 2.0 ppm of nitrogen. This stage was to evaluate the effect of 2.0 ppm nitrogen as the sole gaseous impurity.

Sample Set 2-2

The first stage of growth repeated the conditions for the first stage of growth for set 2-1.

The second stage of growth was the same as the first stage above with the addition of 0.3 ppm of silane, and the addition of 2.0 ppm of nitrogen.

On completion of the growth period, the samples where removed from the reactor and processed to produce a range of test pieces, in particular cross-sectional slices of the growth, and free standing plates of the second stage growth layer which were typically 2-3 mm thick. The cross-sectional slices confirmed that the first stage growth in each case was essentially colourless high purity growth, and that whilst the second stage growth in sample set 2-1 was significantly coloured brown the second stage growth in the second process with added silicon (set 2-2) was almost colourless.

A number of further samples were produced, using the general growth conditions of: 36/0/600 sccm (standard cubic centimeter per minute) of $CH_4/Ar/H_2$ at $250 \times 10^2$ Pa and a substrate temperature of 810° C., with the addition of silane in the range 0-5 ppm, and the addition of nitrogen in the range of 0-10 ppm, and also making small variations to the different growth parameters and in particular varying the temperature by +/−100° C., and the pressure by +/−$100 \times 10^2$ Pa. In particular the following combinations were tested, recording silane/nitrogen concentrations in ppm of: 0.2:1, 1:1, 5:10. In each case the effect of the silane was to suppress any brown colouration in the diamond which would otherwise have arisen. In addition, excess silicon over that needed to suppress the brown colouration did not generate any deleterious colour or other changes in the diamond growth. This provides an additional advantage of the use of Si as a gaseous impurity over that of B in terms of reducing the deleterious effect on nitrogen, since the concentration of the silane is not critical, and the level of nitrogen concentration in the gas phase or the precise value of other process parameters becomes much less important.

Example 7

Ib HPHT diamond substrates were prepared and mounted onto a tungsten disc as in example 5. This disc was introduced into a microwave plasma CVD reactor and an etch and growth cycle commenced in the general form described in WO 01/96634, but using the following specific synthesis conditions:

The growth conditions were 36/0/600 sccm (standard cubic centimeter per minute) of $CH_4/Ar/H_2$ at $250 \times 10^2$ Pa and a substrate temperature of 810° C., with a silane concentration of 0.25 ppm and nitrogen concentration of 2 ppm. Growth was continued until the thickness of the CVD layers was 2 mm. After termination of the growth process the samples were removed and one was processed to produce a free-standing parallel-sided plate of single-crystal CVD diamond. Another was processed to produce a {100} cross-sectional slice. Characterisation of the free-standing CVD plate gave the following results:

a) SIMS measurements carried out in four places on each side of the plate indicated a uniform Si concentration of approximately $6 \times 10^{15}$ cm$^{-3}$ (34 ppb).

b) UV/visible/NIR absorption spectroscopy measurements carried out at room temperature indicated that the absorption coefficient was less than 0.15 cm$^{-1}$ for all wavelengths between 300 nm and 1000 nm. The absorption coefficient at 270 nm was 0.19 cm$^{-1}$ and, after baseline subtraction, the peak absorption coefficient of the 270 nm feature was 0.036 cm$^{-1}$, indicating a concentration of uncompensated nitrogen of approximately 24 ppb. The absorption coefficients at 350 nm and 520 nm were 0.10 and 0.07 cm$^{-1}$; respectively.

c) The CIELAB chromaticity coordinates for a 0.5 ct round brilliant produced from material of this kind were estimated from the absorption spectroscopy data using the method described earlier and were found to be:

$L^*=87.9, a^*=-0.13, b^*=1.07, C^*=1.08$

Using the method described earlier, it can be deduced that a stone with these chromaticity coordinates would have an F GIA colour grade.

d) Absorption spectroscopy carried out at 77 K indicated a strong 737 nm feature with an integrated absorption coefficient of 6.02 meV·cm$^{-1}$.

e) Photoluminescence spectroscopy carried out with 633 nm excitation at 77 K indicated that the Raman normalised intensity of the Si-related feature at 737 nm was 4.

f) Photoluminescence spectroscopy carried out with 514 nm excitation at 77 K indicated photoluminescence features at 575, 637 and 737 nm with the following Raman normalised intensities:

| Feature | Raman normalised intensity |
|---------|----------------------------|
| 575 nm  | 0.05                       |
| 637 nm  | 0.03                       |
| 737 nm  | 6                          | g) Photoluminescence spectroscopy carried out with 325 nm excitation at 77 K indicated photoluminescence features at 533 nm and 575 nm.

Characterisation of the cross-sectional slice gave the following results:

a) SIMS measurements again indicated a Si concentration of approximately 6×10$^{15}$ cm$^{-3}$ (34 ppb) for the dominant <100> sector. Significantly higher Si concentrations were measured for minor <100> sectors that had been formed by growth originating at the {100} edge faces of the substrate. In some regions, which optical microscopy indicated were near-colourless, the Si concentration was found to be higher than 10$^{18}$ cm$^{-3}$ (5.7 ppm).

b) Photoluminescence spectra collected at 77 K with 633 nm excitation showed a strong Si-related feature at 737 nm with a Raman normalised intensity of approximately 4 for the dominant <100> sector and rising to almost 40 in the minor <100> sectors.

c) Luminescence images of the CVD material, created with above band gap excitation, were dominated by orange red luminescence.

Example 8

Ib HPHT diamond substrates were prepared and mounted onto a tungsten disc as in example 5. This disc was introduced into a microwave plasma CVD reactor and an etch and growth cycle commenced in the general form described in WO 01/96634, but using the following specific synthesis conditions.

The growth conditions were 36/0/600 sccm (standard cubic centimeter per minute) of CH$_4$/Ar/H$_2$ at 250×10$^2$ Pa and a substrate temperature of 810° C., with a silane concentration of 0.25 ppm and nitrogen concentration of 1 ppm. Growth was continued until the thickness of the CVD layers was 0.7 mm. After termination of the growth process the samples were removed and one was processed to produce a free-standing parallel-sided plate of single-crystal CVD diamond. Another was processed to produce a {100} cross-sectional slice. Characterisation of the free-standing CVD plate gave the following results:

a) SIMS measurements carried out in four places on each side of the plate indicated a uniform Si concentration of approximately 5×10$^{15}$ cm$^{-3}$ (28 ppb).

b) UV/visible/NIR absorption spectroscopy measurements carried out at room temperature indicated that the absorption coefficient was less than 0.5 cm$^{-1}$ for all wavelengths between 300 nm and 1000 nm. The absorption coefficient at 270 nm was 0.5 cm$^{-1}$ and, after baseline subtraction, the peak absorption coefficient of the 270 nm feature was 0.074 cm$^{-1}$, indicating a concentration of uncompensated nitrogen of approximately 50 ppb. The absorption coefficients at 350 nm and 520 nm were 0.32 and 0.28 cm$^{-1}$ respectively.

c) The CIELAB chromaticity coordinates for a 0.5 ct round brilliant produced from material of this kind were estimated from the absorption spectroscopy data using the method described earlier and were found to be:

$L^*=84.0, a^*=-0.19, b^*=-0.43, C^*=0.47$

Using the method described earlier, it can be deduced that a stone with these chromaticity coordinates would have an E GIA colour grade.

d) Absorption spectroscopy carried out at 77 K indicated a strong 737 nm feature with an integrated absorption coefficient of 5.41 meV·cm$^{-1}$.

e) Photoluminescence spectroscopy carried out with 633 nm excitation at 77 K indicated that the Raman normalised intensity of the Si-related feature at 737 nm was approximately 0.90.

f) Photoluminescence spectroscopy carried out with 514 nm excitation at 77 K indicated photoluminescence features at 575, 637 and 737 nm with the following Raman normalised intensities:

| Feature | Raman normalised intensity |
|---------|----------------------------|
| 575 nm  | 0.022                      |
| 637 nm  | 0.016                      |
| 737 nm  | 2                          | g) Photoluminescence spectroscopy carried out with 325 nm excitation at 77 K indicated photoluminescence features at 533 nm and 575 nm.

Characterisation of the cross-sectional slice gave the following results:

a) SIMS measurements again indicated a Si concentration of approximately 5×10$^{15}$ cm$^{-3}$ (28 ppb) for the dominant <100> sector. Significantly higher Si concentrations were measured for minor <100> sectors that had been formed by growth originating at the {100} edge faces of the substrate. In some regions, which optical microscopy indicated were near-colourless, the Si concentration was found to be higher than 10$^{18}$ cm$^{-3}$ (5.7 ppm).

b) Photoluminescence spectra collected at 77 K with 633 nm excitation showed a strong Si-related feature at 737 nm with a Raman normalised intensity of approximately 1 for the dominant <100> sector and rising to approximately 4 in the minor <100> sectors.

c) Luminescence images of the CVD material created with above band gap excitation were dominated by orange red luminescence.

Example 9

A layered single crystal CVD diamond sample was grown on a {100} HPHT synthetic substrate in six different stages. The gas flow rates were 36/600 sccm (standard cubic centimeters per minute) of $CH_4/H_2$ and the substrate temperature was 810° C. Nitrogen and silane were supplied to give the concentrations in the process gases listed in Table 3 below for the different stages in the growth process. Growth was terminated when the total thickness of CVD growth was 1.4 mm.

A {100} polished cross-sectional slice was processed from the sample to enable the properties of the layers to be studied. When the slice was viewed under an optical transmission microscope the CVD growth was uniformly colourless. Distinct layers corresponding to the different stages of growth could however be clearly distinguished in luminescence images of the slice recorded using above band gap excitation. They were also easily identifiable in cathodoluminescence images recorded using a scanning electron microscope equipped with an Oxford Instruments low magnification cathodoluminescence imaging system. A MonoCL spectrometer was used to measure the intensity of 235 nm free exciton luminescence emitted by each of the layers under electron beam excitation. Table 3 lists the gas phase silicon and nitrogen concentrations, the resulting silicon concentrations measured using SIMS and the free exciton luminescence intensities measured relative to a standard sample of high purity CVD diamond.

TABLE 3

| Layer | Silane (ppm) | Nitrogen (ppm) | Si conc. SIMS (ppm) | N conc SIMS (ppm) | Free exciton CL intensity relative to high purity standard |
|---|---|---|---|---|---|
| 1 | 4.0 | 0 | 0.21 | <0.5 | 1.00 |
| 2 | 3.9 | 2.0 | 0.24 | <0.5 | 1.00 |
| 3 | 3.8 | 3.8 | 0.4 | <0.5 | 0.94 |
| 4 | 3.8 | 5.7 | 0.61 | <0.5 | 0.78 |
| 5 | 3.7 | 7.4 | 0.86 | <0.5 | 0.72 |
| 6 | 4.0 | 10 | 3.75 | <0.5 | 0.34 |

This example demonstrates that the diamond grown can show surprisingly strong free exciton luminescence (measured relative to that shown by a high purity diamond standard) even though it contains significant concentrations of silicon and is grown in the presence of a concentration of nitrogen that would normally cause the material to show very weak free exciton emission. At the highest silicon concentrations, achieved with higher gas phase nitrogen concentrations, the free exciton emission is significantly weaker but the material still has a very low absorption coefficient across the visible region of the spectrum and is therefore colourless. The absorption coefficient spectrum was derived from absorbance measurements (after subtraction of the calculated reflection loss spectrum) and for all positions across the sample the absorption coefficient in the range 350-800 nm was found to be less than 0.9 $cm^{-1}$ and only at 737 nm did it rise above 0.7 $cm^{-1}$.

Example 10

A layered single crystal CVD diamond sample was grown on a {100} HPHT synthetic substrate in five different stages. The gas flow rates were 36/600 sccm (standard cubic centimeters per minute) of $CH_4/H_2$ and the substrate temperature was 883° C. Nitrogen and silane were supplied to give the concentrations in the process gases listed in Table 4 below for the different stages in the growth process. Growth was terminated when the total thickness of CVD growth was 1.2 mm.

A {100} polished cross-sectional slice was processed from the sample to enable the properties of the layers to be studied. Distinct layers corresponding to the different stages of growth could be clearly distinguished in luminescence images of the slice recorded using above band gap excitation. They were also easily identifiable in cathodoluminescence images recorded using an SEM equipped with an Oxford Instruments low magnification cathodoluminescence imaging system. A MonoCL spectrometer was used to measure the intensity of 235 nm free exciton luminescence emitted by each of the layers under electron beam excitation. Table 4 lists the gas phase silicon and nitrogen concentrations, the resulting silicon concentrations measured using SIMS and the free exciton luminescence intensities measured relative to a standard sample of high purity CVD diamond.

TABLE 4

| Layer | Silane (ppm) | Nitrogen (ppm) | Si conc. (SIMS) (ppm) | N conc. (SIMS) (ppm) | Free exciton CL intensity relative to high purity standard |
|---|---|---|---|---|---|
| 1 | 0 | 0 | <0.03 | <0.5 | 1.01 |
| 2 | 4 | 0 | 0.73 | <0.5 | 0.63 |
| 3 | 4 | 6 | 1.21 | <0.5 | 0.40 |
| 4 | 4 | 10 | 2.45 | 0.6 | 0.21 |
| 5 | 4 | 14 | 4.36 | 0.7 | 0.23 |

When the slice was viewed under an optical transmission microscope the CVD growth was uniformly colourless except for the final layer which was found to be slightly grey. Absorption spectroscopy at 77 K indicated that, in addition to the well known Si-related line at 737 nm, this final layer also showed absorption lines at approximately 945.3 nm, 830.1 and 856.8 nm and a broad rise in absorption between these lines and approximately 750 nm. The grey appearance results because this higher level of absorption is observed across the whole of the visible spectrum. Absorption coefficient spectra were derived from absorbance measurements (after subtraction of the calculated reflection loss spectrum). For all positions within the first four layers of the sample the absorption coefficient was found to less than 1 $cm^{-1}$ between 350 and 800 nm, only rising above 0.8 $cm^{-1}$ at 737 nm. For the final layer, the absorption coefficient was found to lie between 0.9 $cm^{-1}$ and 2.1 $cm^{-1}$, only rising above 1.5 $cm^{-1}$ at 737 nm.

Example 11

A layered single crystal CVD diamond sample was grown on a {100} HPHT synthetic substrate in four different stages. The gas flow rates used were 250/60/4000 sccm of $CH_4/Ar/H_2$ and the substrate temperature was 825° C. Table 5 lists the $N_2$ and $B_2H_6$ process gas concentrations supplied for each stage of growth, along with the corresponding concentrations (as measured by SIMS) of atomic nitrogen and boron in each layer of the sample. The total thickness of the CVD material deposited was 1.0 mm.

TABLE 5

| Layer | gas phase $N_2$ (ppm) | gas phase $B_2H_6$ (ppm) | mean solid phase nitrogen (ppm) | mean solid phase boron (ppm) |
|---|---|---|---|---|
| 1 | 0 | 0 | Undetectable | <0.1 |
| 2 | 10.4 | 0.029 | 0.3 | 1.3 |

TABLE 5-continued

| Layer | gas phase N$_2$ (ppm) | gas phase B$_2$H$_6$ (ppm) | mean solid phase nitrogen (ppm) | mean solid phase boron (ppm) |
|---|---|---|---|---|
| 3 | 10.4 | 0.019 | 0.3 | 1.0 |
| 4 | 10.4 | 0.008 | 5.0 | 1.5 |

A {100} polished cross-sectional slice was processed from the sample in order for the layers to be studied. FIG. 22 shows a low magnification optical microscopy image of this sample, in which the CVD growth stages are indicated.

The layer corresponding to the first stage of growth was performed under process conditions for high purity CVD diamond growth, and as such this thin initial layer is of high colour. For the subsequent stages of growth the nitrogen level in the gas phase is set at a level which mimics an uncontrolled air leak into the gas system, in which the size of such a leak would introduce sufficient nitrogen to lead to very poor crystalline quality CVD material. FIG. 22 shows that reasonable colour and good crystallinity is maintained in the layers corresponding to the 2$^{nd}$ and 3$^{rd}$ stages of growth, despite the presence of a high concentration of nitrogen in the process gas mixture. This is due to the controlled amounts of diborane added to the process, which ameliorate the negative effects of the nitrogen. In particular, the boron incorporated into the material inhibits excessive surface roughening and subsequent material degradation and in addition provides compensation of the nitrogen donors. In the 4$^{th}$ stage of growth the diborane in the process gas mixture is now below the level at which surface roughening is inhibited and in which the boron incorporated into the material fully compensates nitrogen. Thus the material turns black and the crystalline quality is poor. The measured increase of both the boron and nitrogen concentrations in the material can be explained by the increased surface roughness, which leads to a general increase in impurity uptake.

Example 12

A layered single crystal CVD diamond sample was grown on a {100} HPHT synthetic substrate in seven different stages. The gas flow rates used were 250/60/4000 sccm of CH$_4$/Ar/H$_2$ and the substrate temperature was 805° C. Table 6 lists the N$_2$ and B$_2$H$_6$ process gas concentrations supplied for each stage of growth, along with the corresponding concentrations (as measured by SIMS) of atomic nitrogen and boron in each layer of the sample. The total thickness of the CVD material deposited was 1.2 mm.

TABLE 6

| Layer | gas phase N$_2$ (ppm) | gas phase B$_2$H$_6$ (ppm) | mean solid phase nitrogen (ppm) | mean solid phase boron (ppm) | ratio of boron-bound exciton CL intensity to free exciton CL intensity | % free exciton CL intensity relative to high purity standard |
|---|---|---|---|---|---|---|
| 1 | 0 | 0 | 0.11 | 0.13 | 0.06 | 14.96 |
| 2 | 5.2 | 0.037 | 0.18 | 1.19 | 1.03 | 11.00 |
| 3 | 10.4 | 0.037 | 0.61 | 1.51 | 1.28 | 8.42 |
| 4 | 16.6 | 0.037 | 0.98 | 2.28 | 1.6 | 8.96 |
| 5 | 22.8 | 0.037 | 1.25 | 2.7 | 1.91 | 8.08 |
| 6 | 1.0 | 0.037 | 0.2 | 2.87 | 2.26 | 5.82 |
| 7 | 29.1 | 0.037 | 2.6 | 3.89 | 2.24 | 6.54 |

In this example, the boron incorporation in the material increased steadily as a function of growth time, despite a constant concentration of diborane in the process gas mixture, which may be attributable to small changes in reactor conditions, such as temperature. In each layer of growth the boron incorporation in the material is greater than the nitrogen incorporation, such that full compensation of nitrogen donors is achieved. Thus, similarly to Example 10, the material is able to tolerate relatively high amounts of nitrogen without degrading, as long as full compensation of nitrogen donors is maintained.

Excitonic spectra were measured in each layer of the sample, using an SEM system equipped with an Oxford Instruments cathodoluminescence (CL) system. The spectra were recorded at liquid nitrogen temperature, and from each spectrum the ratio of the boron-bound exciton intensity to the free exciton intensity was calculated. In addition, the free exciton intensity was compared to the free exciton intensity in a standard sample of high purity CVD diamond. The boron-bound exciton intensity correlates to the increasing boron concentration in the material, as expected. In addition, the free-exciton intensity relative to the high purity standard sample decreases as a function of increasing boron incorporation, which is consistent with an increase in the boron bound exciton intensity. It is remarkable that the free-exciton intensity relative to the standard high purity sample is as high as it is, given the levels of nitrogen in the material. For example, for a CVD sample without boron, but with only 0.08 ppm of nitrogen, a free exciton intensity <10% relative to the standard high purity sample has been measured. This is further evidence of the ameliorating effect of boron in the presence of high levels of nitrogen: the effect of boron is to prevent the surface roughening associated with high nitrogen uptake, which inhibits the uptake of other point defects which would ordinarily extinguish the free exciton intensity.

This above-mentioned compensation effect also leads to high colour material, relative to the case in which nitrogen had not been present. In layer 6, of Table 6, in which the gas-phase nitrogen is reduced to 1 ppm, the layer is distinctly visible due to its blue colouration compared to the relatively high colour of layers 5 and 7.

Example 13

A 50 mm diameter molybdenum substrate was prepared for the growth of a polycrystalline CVD diamond layer. Prior to commencement of growth, the growth environment was determined to have an uncontrolled nitrogen concentration of 2.5 ppm as measured using gas chromatography. Such a concentration of nitrogen would normally result in a polycrystalline diamond layer of poor quality. An addition of silane, made as 100 ppm silane-in-hydrogen, was made such that the concentration of silicon in the gas phase was approximately 1.5 ppm. Growth was commenced using a plasma-assisted CVD process with a gas composition of H$_2$/Ar/CH$_4$ of 600/10/23 sccm, an addition of 9.5 sccm of 100 ppm SiH$_4$ in H$_2$ (equivalent to ~1.5 ppm silicon in the gas phase), at a temperature of 880° C. and a pressure of 200×10$^2$ Pa.

Growth was continued for over 75 hours and a polycrystalline layer was removed with a thickness of approximately 500 μm when measured using a micrometer with pointed anvils. The appearance of the layer was light grey and the crystal quality was judged to be good with no evidence of porosity.

Several 10×10 mm squares were laser cut from the layer and processed so that the optical properties could be measured. The material was transparent at visible wavelengths and had a slight grey colour.

We claim:

1. A CVD single crystal diamond layer comprising from $1\times10^{14}$ to $5\times10^{17}$ atoms/cm$^3$ of nitrogen and either from $10^{13}$ to $2\times10^{18}$ atoms/cm$^3$ of silicon atoms or from $10^{14}$ to $10^{18}$ atoms/cm$^3$ of boron atoms in the majority volume of the diamond layer, wherein the diamond layer is colourless or near colourless.

2. The CVD single crystal diamond layer according to claim 1, wherein the layer has a thickness of greater than 0.1 mm.

3. The CVD single crystal diamond layer according claim 1, wherein the layer has a birefringence of less than $1\times10^{-3}$ over a volume greater than 0.1 mm$^3$.

4. The CVD single crystal diamond layer according to claim 1, and having a clarity of at least SI1 on the GIA gem grading scale.

5. The CVD single crystal diamond layer according to claim 2, wherein the layer has a thickness of greater than 1 mm.

6. The CVD single crystal diamond layer according to claim 1, wherein the majority volume of the diamond layer has at least one of the following characteristics:
   i) an absorption coefficient measured at room temperature at all wavelengths between 300 and 1000 nm which is less than 2 cm$^{-1}$;
   ii) an absorption coefficient measured at room temperature at 270 nm which is less than 2 cm$^{-1}$;
   iii) an absorption coefficient measured at room temperature at 350 nm which is less than 1.5 cm$^{-1}$;
   iv) an absorption coefficient measured at room temperature at 520 nm which is less than 1 cm$^{-1}$.

7. The CVD single crystal diamond layer according to claim 1, wherein silicon is present and a ratio of nitrogen to silicon concentration in the majority volume is in the range 1:20 to 20:1.

8. The CVD single crystal diamond layer according to claim 7, wherein the ratio is in the range 1:10 to 10:1.

9. The CVD single crystal diamond layer according to claim 1, wherein the nitrogen concentration is in the range from $5\times10^{15}$ to $2\times10^{17}$ atoms/cm$^3$.

10. The CVD single crystal diamond layer according to claim 1, wherein boron is present and a ratio of nitrogen to boron concentration in the majority volume is in the range 1:2 to 2:1.

11. The CVD single crystal diamond layer according to claim 1, comprising from $10^{13}$ to $2\times10^{18}$ atoms/cm$^3$ of silicon atoms in the majority volume of the diamond layer.

12. The CVD single crystal diamond layer according to claim 11, wherein the diamond layer is colourless.

13. The CVD single crystal diamond layer according to claim 1, comprising from $10^{14}$ to $10^{18}$ atoms/cm$^3$ of boron atoms in the majority volume of the diamond layer.

14. The CVD single crystal diamond layer according to claim 13, wherein the diamond layer is colourless.

15. The CVD single crystal diamond layer according to claim 1, comprising from $1\times10^{14}$ to $5\times10^{17}$ atoms/cm$^3$ of nitrogen and from $10^{13}$ to $2\times10^{18}$ atoms/cm$^3$ of silicon atoms.

16. The CVD single crystal diamond layer according to claim 1, comprising from $1\times10^{14}$ to $5\times10^{17}$ atoms/cm$^3$ of nitrogen and from $10^{14}$ to $10^{18}$ atoms/cm$^3$ of boron atoms in the majority volume of the diamond layer 17. An optical element comprising the CVD single crystal diamond layer according to claim 1.

18. An electrical element comprising the CVD single crystal diamond layer according to claim 1.

19. An electronic element comprising the CVD single crystal diamond layer according to claim 1.

20. A gemstone comprising the CVD single crystal diamond layer according to claim 1.

21. A gemstone comprising the CVD single crystal diamond layer of claim 1, the gemstone having three orthogonal dimensions greater than 2 mm, wherein at least one axis lies either along the <100> crystal direction or along the principle symmetry axis of the gemstone.

* * * * *